United States Patent
Lindley et al.

(10) Patent No.: US 8,048,328 B2
(45) Date of Patent: *Nov. 1, 2011

(54) METHOD FOR SHAPING A MAGNETIC FIELD IN A MAGNETIC FIELD-ENHANCED PLASMA REACTOR

(75) Inventors: Roger A. Lindley, Santa Clara, CA (US); Scott A. Hogenson, Pflugerville, TX (US); Daniel J. Hoffman, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1130 days.

This patent is subject to a terminal disclaimer.

(21) Appl. No.: 11/612,102

(22) Filed: Dec. 18, 2006

(65) Prior Publication Data

US 2007/0108042 A1    May 17, 2007

Related U.S. Application Data

(63) Continuation-in-part of application No. 10/778,933, filed on Feb. 13, 2004, now Pat. No. 7,422,654.

(60) Provisional application No. 60/447,431, filed on Feb. 14, 2003.

(51) Int. Cl.
*B44C 1/22* (2006.01)
*C03C 15/00* (2006.01)
*C03C 25/68* (2006.01)
*C23F 1/00* (2006.01)
*H01L 21/306* (2006.01)

(52) U.S. Cl. .......... 216/70; 216/67; 156/345.46

(58) Field of Classification Search .......... None
See application file for complete search history.

(56) References Cited

U.S. PATENT DOCUMENTS

| | | | |
|---|---|---|---|
| 5,824,607 A * | 10/1998 | Trow et al. | 438/732 |
| 6,113,731 A | 9/2000 | Shan et al. | |
| 7,458,335 B1 * | 12/2008 | Bjorkman | 118/723 R |
| 2002/0084255 A1 * | 7/2002 | Kanetsuki et al. | 216/67 |
| 2003/0006008 A1 | 1/2003 | Horioka et al. | |
| 2003/0085000 A1 | 5/2003 | Horioka et al. | |
| 2003/0218427 A1 | 11/2003 | Hoffman et al. | |
| 2003/0230385 A1 | 12/2003 | Bach et al. | |
| 2004/0182516 A1 | 9/2004 | Lindley et al. | |
| 2005/0167051 A1 | 8/2005 | Hoffman et al. | |
| 2007/0066064 A1 | 3/2007 | Kutney et al. | |
| 2007/0113980 A1 | 5/2007 | Lindley et al. | |

OTHER PUBLICATIONS

European Search Report dated Apr. 3, 2009 for European Application No. 07122840.7.
European Search Report dated Apr. 3, 2009 for European Application No. 07122847.2.

* cited by examiner

*Primary Examiner* — Shamim Ahmed
*Assistant Examiner* — Stephanie Duclair
(74) *Attorney, Agent, or Firm* — Alan Taboada; Moser Taboada

(57) ABSTRACT

Methods for rotating a magnetic field in a process chamber is provided herein. In one embodiment, a method for rotating a magnetic field in a process chamber includes forming a magnetic field having a primary shape; changing the primary shape to at least two sequential transitional shapes; and changing the transitional shape to a rotated primary shape. Optionally, the magnetic field may be maintained at an approximately constant magnitude throughout each step. Optionally, a maximum of one current applied to one or more magnetic field producing coils is equal to zero or has its polarity reversed between any two adjacent steps.

25 Claims, 35 Drawing Sheets

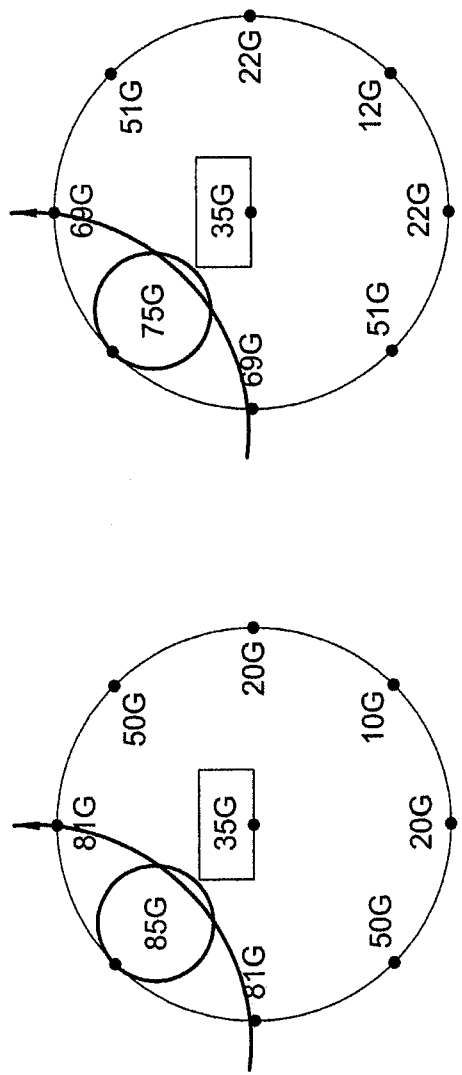
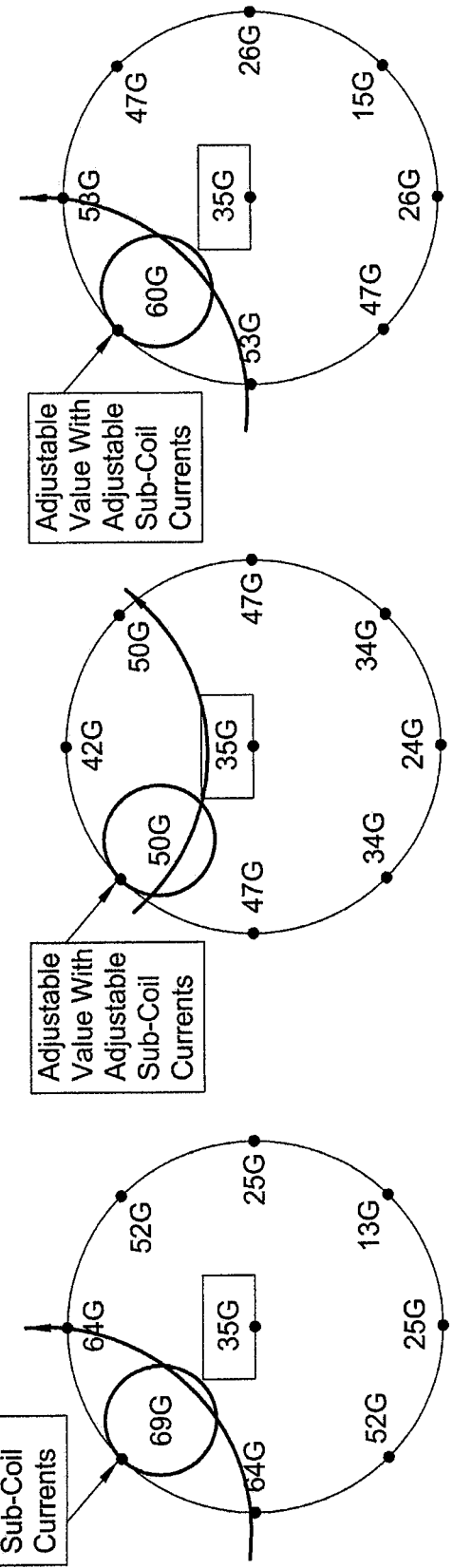

| | TIME | COIL #1 | COIL #2 | COIL #3 | COIL #4 |
|---|---|---|---|---|---|
| SHAPE 0 DEGREES | 0.00 - 0.95 sec | +1 | -1 | -R | +R |
| TRANSITION 0 DEGREES | 0.95 - 1.00 sec | +1 | 0 | -1 | 0 |
| SHAPE 90 DEGREES | 1.00 - 1.95 sec | +R | +1 | 0 | -R |
| TRANSITION 90 DEGREES | 1.95 - 2.00 sec | 0 | +1 | 0 | -1 |
| SHAPE 180 DEGREES | 2.00 - 2.95 sec | -R | +R | +1 | -1 |
| TRANSITION 180 DEGREES | 2.95 - 3.00 sec | -1 | 0 | +1 | 0 |
| SHAPE 270 DEGREES | 3.00 - 3.95 sec | -1 | -R | +R | +1 |
| TRANSITION 270 DEGREES | 3.95 - 4.00 sec | 0 | -1 | 0 | +1 |

FIG. 23
(PRIOR ART)

| | TIME | COIL #1 | COIL #2 | COIL #3 | COIL #4 |
|---|---|---|---|---|---|
| 1 | SHAPE 0 DEGREES | 0.00 - 0.90 sec | +1 | -1 | -R | +R |
| 2 | TRANSITION A, 0 DEGREES | 0.90 - 0.95 sec | +(1+R) | -(0.5*R) | -1 | -(0.5*R) |
| 3 | TRANSITION B, 0 DEGREES | 0.95 - 1.00 sec | +1 | +R | -1 | -(0.5*R) |
| 4 | SHAPE 90 DEGREES | 1.00 - 1.90 sec | +R | +1 | -(0.5*R) | -R |
| 5 | TRANSITION A, 90 DEGREES | 1.90 - 1.95 sec | -(0.5*R) | +(1+R) | -(0.5*R) | -1 |
| 6 | TRANSITION B, 90 DEGREES | 1.95 - 2.00 sec | -(0.5*R) | +1 | +R | -(1+0.5*R) |
| 7 | SHAPE 180 DEGREES | 2.00 - 2.90 sec | -R | +R | +1 | -1 |
| 8 | TRANSITION A, 180 DEGREES | 2.90 - 2.95 sec | -1 | -(0.5*R) | +(1+R) | -(0.5*R) |
| 9 | TRANSITION B, 180 DEGREES | 2.95 - 3.00 sec | -1 | -(0.5*R) | +1 | +R |
| 10 | SHAPE 270 DEGREES | 3.00 - 3.90 sec | -(0.5*R) | -R | +R | +1 |
| 11 | TRANSITION A, 270 DEGREES | 3.90 - 3.95 sec | -(0.5*R) | -1 | -(0.5*R) | +(1+R) |
| 12 | TRANSITION B, 270 DEGREES | 3.95 - 4.00 sec | +R | -(1+0.5*R) | -(0.5*R) | +1 |

| | TIME | COIL #1 | COIL #2 | COIL #3 | COIL #4 |
|---|---|---|---|---|---|
| 1 | SHAPE 0 DEGREES | +1 | -1 | -R | +R |
| 2 | TRANSITION A, 0 DEGREES | 0.75 - 0.80 sec | +(1+0.5*R) | -0.5*(1+0.5*R) | -0.5*(1+R) | +(0.25*R) |
| 3 | TRANSITION B, 0 DEGREES | 0.80 - 0.85 sec | +(1+R) | -(0.5*R) | -1 | -(0.5*R) |
| 4 | TRANSITION C, 0 DEGREES | 0.85 - 0.90 sec | +(1+0.5*R) | +(0.25*R) | -(1+0.25*R) | -(0.5*R) |
| 5 | TRANSITION D, 0 DEGREES | 0.90 - 0.95 sec | +1 | +R | -(1+0.5*R) | -(0.5*R) |
| 6 | TRANSITION E, 0 DEGREES | 0.95 - 1.00 sec | +0.5*(1+R) | +0.5*(1+R) | -(1+0.25*R) | -0.75*R |
| 7 | SHAPE 90 DEGREES | 1.00 - 1.75 sec | +R | +1 | -1 | -R |
| 8 | TRANSITION A, 90 DEGREES | 1.75 - 1.80 sec | +(0.25*R) | +(1+0.5*R) | -0.5*(1+0.5*R) | -0.5*(1+R) |
| 9 | TRANSITION B, 90 DEGREES | 1.80 - 1.85 sec | -(0.5*R) | +(1+R) | -(0.5*R) | -1 |
| 10 | TRANSITION C, 90 DEGREES | 1.85 - 1.90 sec | -(0.5*R) | +(1+0.5*R) | +(0.25*R) | -(1+0.25*R) |
| 11 | TRANSITION D, 90 DEGREES | 1.90 - 1.95 sec | -(0.5*R) | +1 | +R | -(1+0.5*R) |
| 12 | TRANSITION E, 90 DEGREES | 1.95 - 2.00 sec | -0.75*R | +0.5*(1+R) | +0.5*(1+R) | -(1+0.25*R) |
| 13 | SHAPE 180 DEGREES | 2.00 - 2.75 sec | -R | +R | +1 | -1 |
| 14 | TRANSITION A, 180 DEGREES | 2.75 - 2.80 sec | -0.5*(1+R) | +(0.25*R) | +(1+0.5*R) | -0.5*(1+0.5*R) |
| 15 | TRANSITION B, 180 DEGREES | 2.80 - 2.85 sec | -1 | -(0.5*R) | +(1+R) | -(0.5*R) |
| 16 | TRANSITION C, 180 DEGREES | 2.85 - 2.90 sec | -(1+0.25*R) | -(0.5*R) | +(1+0.5*R) | +(0.25*R) |
| 17 | TRANSITION D, 180 DEGREES | 2.90 - 2.95 sec | -(1+0.5*R) | -(0.5*R) | +1 | +R |
| 18 | TRANSITION E, 180 DEGREES | 2.95 - 3.00 sec | -(1+0.25*R) | -0.75*R | +0.5*(1+R) | +0.5*(1+R) |
| 19 | SHAPE 270 DEGREES | 3.00 - 3.75 sec | -1 | -R | +R | +1 |
| 20 | TRANSITION A, 270 DEGREES | 3.75 - 3.80 sec | -0.5*(1+0.5*R) | -0.5*(1+R) | +(0.25*R) | +(1+0.5*R) |
| 21 | TRANSITION B, 270 DEGREES | 3.80 - 3.85 sec | -(0.5*R) | -1 | -(0.5*R) | +(1+R) |
| 22 | TRANSITION C, 270 DEGREES | 3.85 - 3.90 sec | +(0.25*R) | -(1+0.25*R) | -(0.5*R) | +(1+0.5*R) |
| 23 | TRANSITION D, 270 DEGREES | 3.90 - 3.95 sec | +R | -(1+0.5*R) | -(0.5*R) | +1 |
| 24 | TRANSITION E, 270 DEGREES | 3.95 - 3.00 sec | -0.5*(1+R) | -(1+0.25*R) | -0.75*R | +0.5*(1+R) |

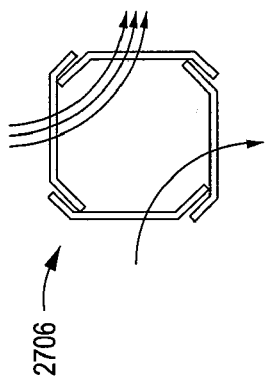
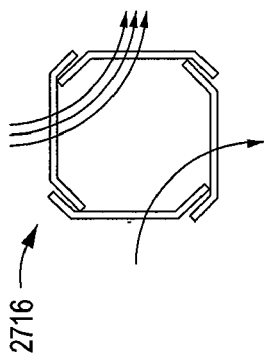
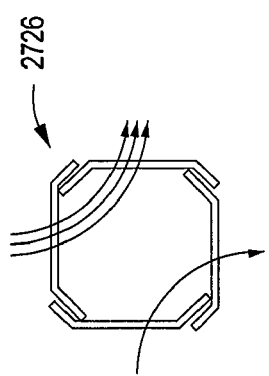
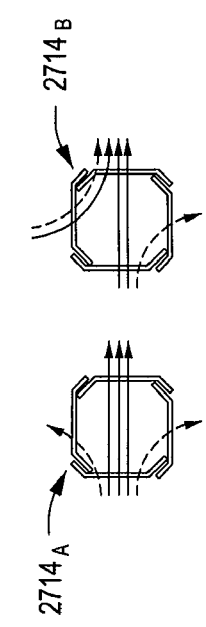
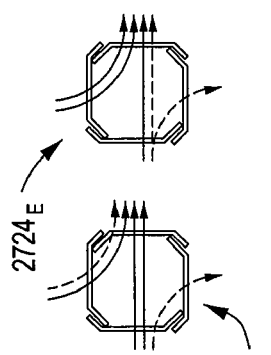
FIG. 27A (PRIOR ART)
FIG. 27B
FIG. 27C
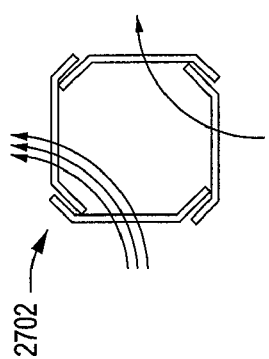
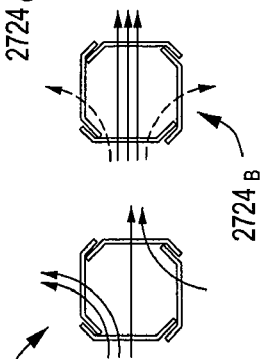
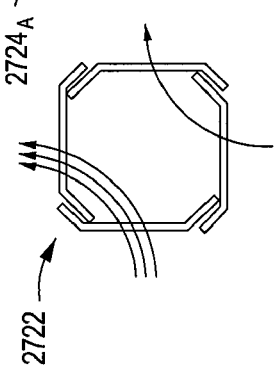

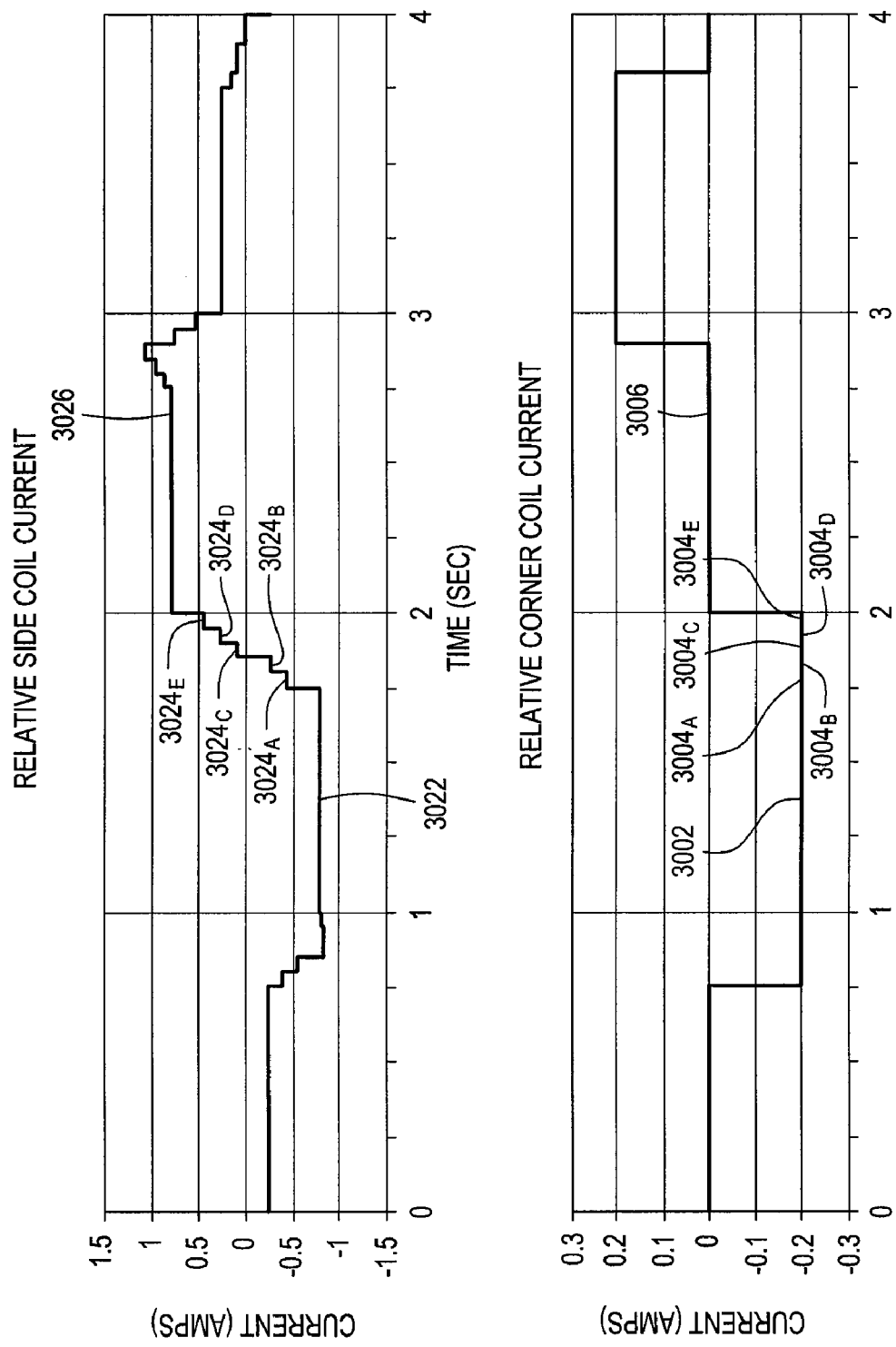

| | | SCHEME V | | SCHEME W | | SCHEME X | |
|---|---|---|---|---|---|---|---|
| | TIME (SEC) | SIDE COIL #1 | CORNER COIL #1 | SIDE COIL #1 | CORNER COIL #1 | SIDE COIL #1 | CORNER COIL #1 |
| 1 | SHAPE 0 DEGREES | 0.00 - 0.75 sec | -B | 0 | -B | 0 | -B | 0 |
| 2 | TRANSITION $A_0$ | 0.75 - 0.80 sec | -B -C | +C | -B -AD | 0 | -B+E(C-A) | -C |
| 3 | TRANSITION $B_0$ | 0.80 - 0.85 sec | -(A-C) -D(A-C) | +C | -B -A(1-D-E) | 0 | -B+2E(C-A) | -C |
| 4 | TRANSITION $C_0$ | 0.85 - 0.90 sec | -A(1+D) | +C | -A -B | 0 | -B+(C-A) | -C |
| 5 | TRANSITION $D_0$ | 0.90 - 0.95 sec | -A(1+D) | +C | -A -B(D+E) | 0 | -B+(C-A)+E(B-C) | -C |
| 6 | TRANSITION $E_0$ | 0.95 - 1.00 sec | -A | -C | -A -BD | 0 | -B+(C-A)+2E(B-C) | -C |
| 7 | SHAPE 90 DEGREES | 1.00 - 1.75 sec | -A | -C | -A | 0 | -A | -C |
| 8 | TRANSITION $A_{90}$ | 1.75 - 1.80 sec | -(A-C) | -C | -A(1-D) | -C | (C-A) - E(C-A) | -C |
| 9 | TRANSITION $B_{90}$ | 1.80 - 1.85 sec | -C(1+D) | -C | -A(1-D-E) | -C | (C-A) - 2E(C-A) | -C |
| 10 | TRANSITION $C_{90}$ | 1.85 - 1.90 sec | 0 | 0 | 0 | 0 | +AD | -C |
| 11 | TRANSITION $D_{90}$ | 1.90 - 1.95 sec | +C(1+D) | +C | +A(1-D-E) | +C | +AD +E(1-D) | -C |
| 12 | TRANSITION $E_{90}$ | 1.95 - 2.00 sec | +(A-C) | +C | +A(1-D) | +C | +AD +2E(1-D) | -C |
| 13 | SHAPE 180 DEGREES | 2.00 - 2.75 sec | +A | +C | +A | +C | +A | 0 |
| 14 | TRANSITION $A_{180}$ | 2.75 - 2.80 sec | +A | +C | +A +B(D) | +C | +A +E(B+C-2AD) | +C |
| 15 | TRANSITION $B_{180}$ | 2.80 - 2.85 sec | +A(1+D) | +C | +A +B(D+E) | +C | +A +2E(B+C-2AD) | +C |
| 16 | TRANSITION $C_{180}$ | 2.85 - 2.90 sec | +A(1+D) | +C | +A +B | +C | +A +(B+C-2AD) | +C |
| 17 | TRANSITION $D_{180}$ | 2.90 - 2.95 sec | +(A-C) + D(A-C) | +C | +B +A(D+E) | +C | (+B+A(1-D)) -AE(1-D) | +C |
| 18 | TRANSITION $E_{180}$ | 2.95 - 3.00 sec | +B +C | +C | +B +A(D) | +C | (+B+A(1-D)) -2AE(1-D) | +C |
| 19 | SHAPE 270 DEGREES | 3.00 - 3.75 sec | +B | 0 | +B | 0 | +B | 0 |
| 20 | TRANSITION $A_{270}$ | 3.75 - 3.80 sec | +B | 0 | +B(1-D) | 0 | +B -E(B+C-2AD) | +C |
| 21 | TRANSITION $B_{270}$ | 3.80 - 3.85 sec | 0 | -C | +B(1-D-E) | 0 | +B -2E(B+C-2AD) | +C |
| 22 | TRANSITION $C_{270}$ | 3.85 - 3.90 sec | 0 | -C | 0 | 0 | +AD | +C |
| 23 | TRANSITION $D_{270}$ | 3.90 - 3.95 sec | 0 | -C | -B(1-D-E) | 0 | +E(C-B) | 0 |
| 24 | TRANSITION $E_{270}$ | 3.95 - 3.00 sec | -B | 0 | -B(1-D) | 0 | +2E(C-B) | 0 |

FIG. 32

| | | TIME (SEC) | SIDE COIL #1 | | | | TIME (SEC) | SIDE COIL #1 |
|---|---|---|---|---|---|---|---|---|
| 1 | SHAPE 0 DEGREES | 0.00 - 0.30 | 0.0 | | 21 | SHAPE 180 DEGREES | 2.00 - 2.30 | 0.0 |
| 2 | TRANSITION $A_0$ | 0.30 - 0.35 | -0.2*B | | 22 | TRANSITION $A_{180}$ | 2.30 - 2.35 | +0.2*A |
| 3 | TRANSITION $B_0$ | 0.35 - 0.40 | -0.4*B | | 23 | TRANSITION $B_{180}$ | 3.35 - 3.40 | +0.4*A |
| 4 | TRANSITION $C_0$ | 0.40 - 0.45 | -0.6*B | | 24 | TRANSITION $C_{180}$ | 3.40 - 3.45 | +0.6*A |
| 5 | TRANSITION $D_0$ | 0.45 - 0.50 | -0.8*B | | 25 | TRANSITION $D_{180}$ | 3.45 - 3.50 | +0.8*A |
| 6 | SHAPE 45 DEGREES | 0.50 - 0.80 | -B | | 26 | SHAPE 225 DEGREES | 2.50 - 2.80 | +A |
| 7 | TRANSITION $A_{45}$ | 0.80 - 0.85 | -B - 0.2*(C-B) | | 27 | TRANSITION $A_{225}$ | 2.80 - 2.85 | +A - 0.2*(A-C) |
| 8 | TRANSITION $B_{45}$ | 0.85 - 0.90 | -B - 0.4*(C-B) | | 28 | TRANSITION $B_{225}$ | 2.85 - 2.90 | +A - 0.4*(A-C) |
| 9 | TRANSITION $C_{45}$ | 0.90 - 0.95 | -B - 0.6*(C-B) | | 29 | TRANSITION $C_{225}$ | 2.90 - 2.95 | +A - 0.6*(A-C) |
| 10 | TRANSITION $D_{45}$ | 0.95 - 1.00 | -B - 0.8*(C-B) | | 30 | TRANSITION $D_{225}$ | 2.95 - 3.00 | +A - 0.8*(A-C) |
| 11 | SHAPE 90 DEGREES | 1.00 - 1.30 | -C | | 31 | SHAPE 270 DEGREES | 3.00 - 3.30 | +C |
| 12 | TRANSITION $A_{90}$ | 1.30 - 1.35 | -C - 0.2*(A-C) | | 32 | TRANSITION $A_{270}$ | 3.30 - 3.35 | +C - 0.2*(C-B) |
| 13 | TRANSITION $B_{90}$ | 1.35 - 1.40 | -C - 0.4*(A-C) | | 33 | TRANSITION $B_{270}$ | 3.35 - 3.40 | +C - 0.4*(C-B) |
| 14 | TRANSITION $C_{90}$ | 1.40 - 1.45 | -C - 0.6*(A-C) | | 34 | TRANSITION $C_{270}$ | 3.40 - 3.45 | +C - 0.6*(C-B) |
| 15 | TRANSITION $D_{90}$ | 1.45 - 1.50 | -C - 0.8*(A-C) | | 35 | TRANSITION $D_{270}$ | 3.45 - 3.50 | +C - 0.8*(C-B) |
| 16 | SHAPE 135 DEGREES | 1.50 - 1.80 | -A | | 36 | SHAPE 315 DEGREES | 3.50 - 3.80 | +B |
| 17 | TRANSITION $A_{135}$ | 1.80 - 1.85 | -0.8*A | | 37 | TRANSITION $A_{315}$ | 3.80 - 3.85 | +0.8*B |
| 18 | TRANSITION $B_{135}$ | 1.85 - 1.90 | -0.6*A | | 38 | TRANSITION $B_{315}$ | 3.85 - 3.90 | +0.6*B |
| 19 | TRANSITION $C_{135}$ | 1.90 - 1.95 | -0.4*A | | 39 | TRANSITION $C_{315}$ | 3.90 - 3.95 | +0.4*B |
| 20 | TRANSITION $D_{135}$ | 1.95 - 2.00 | -0.2*A | | 40 | TRANSITION $D_{315}$ | 3.95 - 4.00 | +0.2*B |

FIG. 35

METHOD FOR SHAPING A MAGNETIC FIELD IN A MAGNETIC FIELD-ENHANCED PLASMA REACTOR

CROSS-REFERENCE TO RELATED APPLICATIONS

This application is a continuation in part of U.S. patent application Ser. No. 10/778,933, filed Feb. 13, 2004, by Lindley, et al., and entitled "Method and Apparatus for Shaping a Magnetic Field in a Magnetic Field-Enhanced Plasma Reactor," which application claims the benefit of the filing date of U.S. Provisional Patent Application Ser. No. 60/447,431, filed Feb. 14, 2003, entitled "Method and Apparatus for Producing Plasma Uniformity in a Magnetic Field-Enhanced Plasma Reactor," each of which are incorporated by reference herein.

BACKGROUND OF THE INVENTION

1. Field of the Invention

This invention relates to plasma enhanced, semiconductor substrate processing systems and, more specifically, to a method and apparatus for shaping a magnetic field in a magnetically enhanced plasma reactor.

2. Description of the Related Art

Semiconductor wafer processing chambers commonly employ plasmas to enhance the performance of various processes for fabricating semiconductor devices on silicon substrates or other workpieces. Such processes include sputter etching, plasma enhanced chemical etching, plasma enhanced chemical vapor deposition, and ionized sputter deposition. The high energy level of reagents in the plasma generally increases the rate of the fabrication process, and also reduces the temperature at which the semiconductor workpiece must be maintained to perform the process.

Magnetically enhanced plasma chambers (also referred to as reactors) employ magnetic fields to increase the density of charged particles in the plasma to further increase the rate of the plasma enhanced fabrication process. Increasing the process rate is highly advantageous because the cost of fabricating semiconductor devices is proportional to the time required for fabrication.

Despite this advantage, many plasma chambers in commercial use do not employ magnetic enhancement because the magnetic enhancement has been found to increase the likelihood of damaging the semiconductor devices on the wafer. Such damage is caused by non-uniform electron density across a wafer due to the spatial contour of the magnetic field being poorly optimized.

FIG. 1 depicts a schematic cross section view of a magnetically enhanced plasma chamber 5 suitable for either etching or chemical vapor deposition in accordance with the prior art. FIG. 2 depicts a top cross sectional view of the chamber 5. The chamber 5 is enclosed by an octagonal sidewall 12, circular bottom wall 14 and circular top wall or lid 16. The lid 16 and bottom wall 14 may be either dielectric or metal. An electrically grounded anode electrode 18 is mounted at the bottom of the lid 16. The anode electrode may be perforated to function as a gas inlet through which process gas enters the chamber. The side wall 12 may be either dielectric or metal. If it is metal, the metal must be nonmagnetic material such as anodized aluminum so as to not interfere with the magnetic field created by an array of electromagnetic coils 6, 7, 8, and 9 located outside the chamber 5. If the side wall is metal, it will function as part of the anode.

The semiconductor wafer or workpiece 20 is mounted on a cathode electrode 22, which, in turn, is mounted in the lower end of the chamber 5. A vacuum pump, not shown, exhausts gases from the chamber 5 through an exhaust manifold 23 and maintains the total gas pressure in the chamber 5 at a level low enough to facilitate creation of a plasma, typically in the range of 10 millitorr to 20 torr, with pressure at the lower and higher end of the range being typical for etching or CVD processes, respectively.

An RF power supply 24 is connected to the cathode pedestal 22 through a series coupling capacitor 26 or matching circuit (not shown). The RF power supply 24 provides an RF voltage between the cathode pedestal 22 and the grounded anode electrode 18 that excites the gases within the chamber into a plasma state. The plasma body has a time average positive DC potential or voltage relative to the cathode or anode electrodes that accelerates ionized process gas constituents to bombard the cathode and anode electrodes.

Magnetic enhancement of the plasma most commonly is implemented by a DC magnetic field in the region between the cathode and anode electrodes. The direction of the magnetic field is usually transverse to the longitudinal axis of the chamber 5, i.e., transverse to the axis extending between the cathode and anode electrodes. Various arrangements of permanent magnets or electromagnets are conventionally used to provide such a transverse magnetic field. One such arrangement is the pair of coils 6, 7 shown in FIG. 1 disposed on opposite sides of the cylindrical chamber side wall 12. FIG. 2 depicts a top, cross-sectional view of the chamber of FIG. 1 that shows the orientation of opposing coil pairs 6, 7, 8 and 9. Generally, the diameter of each coil approximately equals the spacing between the two coils. Each pair of opposing coils 6, 7, 8 and 9 are connected in series and in phase to a DC power supply, not shown, so that they produce transverse magnetic fields which are additive in the region between the coil pairs. This transverse magnetic field is represented in FIGS. 1 and 2 by the vector B oriented along the negative X axis. An example of such a magnetically enhanced plasma chamber is described in commonly assigned U.S. Pat. No. 5,215,619, issued Jun. 1, 1993, which is hereby incorporated by reference in its entirety.

Because the plasma has a positive time average potential or voltage relative to the cathode electrode 22, the time average electric field E in the plasma pre-sheath adjacent the cathode is directed downward from the plasma toward the cathode, thereby giving the free electrons in the pre-sheath a drift velocity vector whose time average values oriented upward towards the plasma body, as represented by vector Ve in FIG. 1. In response to the DC magnetic field vector B, these free electrons will primarily experience a qvxB force, causing the electrons and ions to move in a helical shaped path that generally follows the magnetic field vector. In additional, the electrons and ions will experience another time-averaged force due to the combination of the helical motion and the electric field. This is commonly called the ExB drift, where the direction of the drift is approximately coplanar with the semiconductor wafer 20 and orthogonal to the magnetic field vector B as illustrated in FIG. 2 by the ExB vector oriented along the Y axis.

In this discussion, the term "time average" means averaged over one period of the RF frequency or frequencies at which the plasma is excited, this period typically being less than $10^{-7}$ seconds. This time average over one RF period is unrelated to the time averaging due to the optional rotation of the magnetic field relative to the workpiece that typically has a rotation period on the order of 0.2 to 4 seconds. The frequency of the electron moving helically about the magnetic field vector is f=(qB)/2 πm, where q is the electron charge, B is the magnetic field strength (Gauss), and f is the frequency (Hertz). For example, a magnetic field of 35 G will result in one turn around the helix lasting about $10e^{-4}$ seconds. This is longer than the RF frequency, but is much shorter than the magnetic field rotation of 0.2 to 4 seconds.

It is believed that the ExB drift of free electrons is a major source of semiconductor device damage in conventional magnetically enhanced plasma chambers. Specifically, it is believed that ExB drift can unevenly distribute the free electrons in the plasma pre-sheath and cause non-uniformity in the ion flux. It is believed that this spatial non-uniformity of the ion flux that bombards the wafer produces electrical currents in the wafer which often damages the semiconductor devices on the wafer.

Conventional magnetically enhanced plasma chambers attempt to ameliorate this non-uniformity by slowly rotating the magnetic field relative to the wafer, typically at a rotation frequency in the range of one quarter to five rotations per second. In some designs, the wafer 20 or the magnets 6, 7, 8 and 9 are physically rotated. In other designs, as illustrated in FIG. 2, the rotation is performed electronically by providing two pairs of coils 6, 7 and 8, 9 that are arranged orthogonally to one another. The magnetic field can be rotated in 90° increments by successively and periodically connecting the DC power supply to the first coil pair 6, 7 with positive polarity (2) to the second coil pair 8, 9 with positive polarity; (3) to the first coil pair 6, 7 with negative polarity; and (4) to the second coil pair 8, 9 with negative polarity. Alternatively, the magnetic field can be rotated continuously by replacing the DC power supply with a very low frequency (in the range of 0.1-10 Hz) power supply having quadrature outputs connected to provide current to the first coil pair 6, 7 offset in phase by 90° from the current provided in the second coil pair 8, 9.

Rotating the magnetic field relative to the wafer greatly reduces the time average spatial non-uniformity in the ion flux bombarding the wafer, and therefore can provide acceptable spatial uniformity of etch rate (in an etching chamber) or deposition rate (in a CVD chamber) on the wafer surface. However, rotating the magnetic field does not in any way improve the instantaneous spatial uniformity of ion flux on the wafer surface, and therefore does not completely solve the problem of semiconductor device damage in magnetically enhanced plasma chambers.

U.S. Pat. No. 6,113,731, issued Sep. 5, 2000, discloses a method and apparatus that further combats the ExB drift problem by driving current through the adjacent coil pairs 6, 9 and 7, 8 such that a magnetic field gradient is generated laterally across the surface of the wafer.

In FIG. 2, the magnetic field produced by driving a first current through coils 7, 8 is represented by arrow 10 and the magnetic field produced by driving a second current through coils 6, 9 is represented by the arrows 11. The first current is less than the second current such that the magnetic field 10 is smaller than magnetic field 11 such that a magnetic field gradient is produced, i.e., the magnetic field is shaped. The ratio of the currents produces the specific shape of the gradient. This ratio is optimized for each process regime to create a nearly uniform plasma. For most process regimens, the current ratio is in the range 0.1 to 0.7. This non-uniform magnetic field produces a more uniform ion flux within the chamber by increasing the magnetic field magnitude in the region of the wafer formerly with low etch rate, and by decreasing the magnetic field magnitude in the region of the wafer formerly with high etch rate. This magnetic field gradient is then adjusted to the shape that optimizes ion flux uniformity for each process condition. The optimum magnetic field gradient is dependent upon the hardware configuration used to produce the magnetic fields. As smaller and smaller feature sizes are used on wafers, the requirements for producing a nearly uniform ion flux continue to become more stringent, especially in certain process regimes, in order to prevent damage to the electrical circuitry formed on the wafer. The optimal gradient may be produced in a static position; however when the current is switched to the next coil pair to cause rotation of the plasma, the plasma "jumps" by 90°. Such a "jump" forms a discontinuity in the plasma process that can damage the substrate or cause non-uniform processing.

Therefore, there is a need in the art for a method and apparatus for controlling the magnetic field gradient within a magnetically enhanced plasma chamber.

SUMMARY OF THE INVENTION

The disadvantages associated with the prior art are overcome by a method and apparatus of providing improved shaping of the magnetic field gradient within a magnetically enhanced plasma reactor to produce a uniform plasma. In one exemplary embodiment of the present invention a plurality of overlapping main magnetic coil sections are provided and a magnetic field generally parallel to a top surface of a substrate supporting member is formed. The overlapping magnetic coils produce a magnetic field having a shape that is improved over the prior art. In other embodiments of the invention, sub-magnetic coils are used in conjunction with the main magnetic coils (whether overlapping or not) to provide greater control over the shape of the magnetic field. In several embodiments, the field control is used to provide an optimal shape to the instantaneous magnetic field as well as a nearly continuous field shape during the transitions as the magnetic field is rotated.

In one embodiment, a method for rotating a magnetic field in a process chamber includes forming a magnetic field having a primary shape; changing the primary shape to at least two sequential transitional shapes; and changing the transitional shape to a rotated primary shape. Optionally, the magnetic field may be maintained at an approximately constant magnitude throughout each step. Optionally, a maximum of one current applied to one or more magnetic field producing coils is equal to zero or has its polarity reversed between any two adjacent steps.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments. In addition, the drawings may be simplified for clarity and not necessarily drawn to scale. Where possible, identical reference numerals have been used to designate elements that are common to the figures.

FIGS. 22A-22K depict magnetic field simulation results for various embodiments of the invention;

FIG. 23 depicts a conventional rotational method for a 4-coil chamber;

FIG. 25 depicts a table showing a magnetic field rotation sequence in accordance with one embodiment of the present invention and suitable for use in a process chamber having four coils;

FIG. 26 depicts a table showing another magnetic field rotation sequence in accordance with one embodiment of the present invention and suitable for use in a process chamber having four coils;

FIGS. 27A-27C depict schematic diagrams of magnetic fields in a four coil chamber throughout various rotational methods;

FIGS. 31A-C depict graphs of relative coil currents over time throughout various rotational methods;

FIG. 32 depicts a table showing magnetic field rotation sequences in accordance with one embodiment of the present invention and suitable for use in a process chamber having eight coils;

FIG. 35 depicts a table showing a magnetic field rotation sequence in accordance with one embodiment of the present invention and suitable for use in a process chamber having eight equal sized coils.

DETAILED DESCRIPTION

Figure 3:
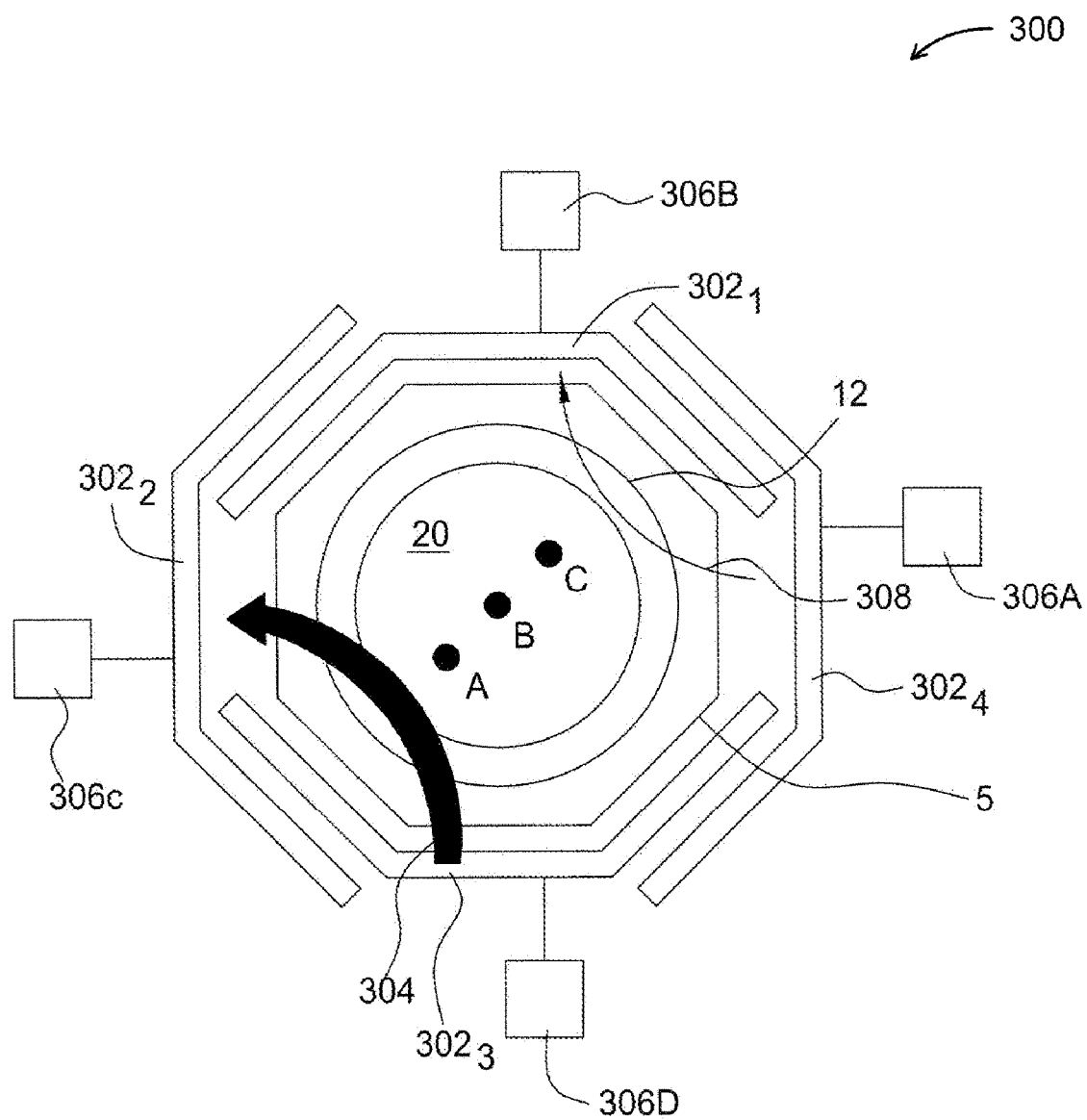
FIG. 3 is a top schematic view of a process chamber having magnetic coils with extended width in accordance with one embodiment of the invention.

FIG. 3 is a top view of an embodiment of a magnetic coil configuration 300 circumscribing sidewall 12 of a plasma enhanced chamber 5 in accordance with certain embodiments of the present invention. Specifically, FIG. 3 depicts main magnetic coils $302_1$, $302_2$, $302_3$, and $302_4$ (collectively main magnetic coils 302) and main current sources 306A, 306B, 306C and 306D. As such, in this embodiment of the invention, four coils are driven by four individual currents. Illustratively, the embodiment of the coil configuration 300 is depicted as having a substantially octagonal plan form. However, that depiction is not intended to limit the scope of the invention. For example, a coil configuration in accordance with the invention can be any configuration around the periphery of a chamber 5 with each coil overlapping (or being overlapped by) at least a portion of an adjacent coil.

Illustratively, each of the main magnetic coils 302 has an extended width such that a portion of each coil overlaps (or is overlapped by) an adjacent main magnetic coil 302. Although the main magnetic coils 302 are depicted as having the corners overlapping, that depiction is for illustrative purposes only. The main magnetic coils 302 can overlap more or less than the depiction in FIG. 3. Other embodiments of the invention that utilize overlapping coils are described below in with respect to FIGS. 9-13 and 21.

In the chamber, the magnetic field is generally contoured (or shaped) to combat ExB drift such that, at any given moment, there is a high magnetic field corner and a low magnetic field corner. It is relatively easy to control the magnetic field located in a low magnetic field corner (point C). However, difficulty arises when controlling the field in a high magnetic field corner (point A). FIG. 3 depicts an instantaneous view of a magnetic field produced by driving coils $302_2$ and $302_3$ using relatively high current (arrows 304) and driving coils $302_1$ and $302_4$ using relatively low current (arrow 308). Larger magnetic coils (coils having extended width) allow greater control over the magnitude of the high magnetic field (point A) without affecting the magnetic field strength at points B and C. A larger area encompassed by the magnetic coils 302 provides an improved magnetic field gradient. However, the size of the main magnetic coils 302 is limited by the size of the reaction chamber. For example, due to the size of the reaction chamber and placement of its supporting hardware, generally the magnets can't generally be made taller. However, the magnets can be made wider to increase the coil area. As such, making the magnets wider produces larger coil areas to facilitate improved magnetic field shape e.g., the coils 302 of FIG. 3 extend more than 90° about the circumference of the chamber 5. FIGS. 9-21D (described in greater detail below) depict illustrative embodiments that allow greater control over the shape of the magnetic field.

The main current sources 306A-D drives current through each of the main magnetic coils 302. To generate the magnetic field, the main current sources 306A and 306B apply current to adjacent main magnetic coils $302_1$ and $302_2$ in the same direction. To produce an effective magnetic field gradient in the chamber, the current sources 306C and 306D apply current to flow in main magnetic coils $302_3$ and $302_4$. Further, the opposing magnetic field 308 generated by main magnetic coils $302_3$ and $302_4$ is of a lesser magnitude than the magnetic field generated by main magnetic coils $302_1$ and $302_2$. Illustratively, four current sources are depicted as causing current to flow through each of the main magnetic coils 302. As coil pairs are driven to produce a magnetic field in a reactor having a configurable magnetic field ("CMF"), the B-field is high nearest the adjacent coils, i.e., the field strength is highest in the corner at point A, and decreases across the wafer to point C. The currents are then switched from coil pair to coil pair to rotate the magnetic field. Such a reactor that uses a CMF technique is the eMxP+ Dielectric Etch reactor manufactured by Applied Material, Inc. of Santa Clara, Calif. This reactor is the subject of U.S. Pat. No. 6,113,731, issued Sep. 5, 2000, which is incorporated herein by reference.

Figure 4A:
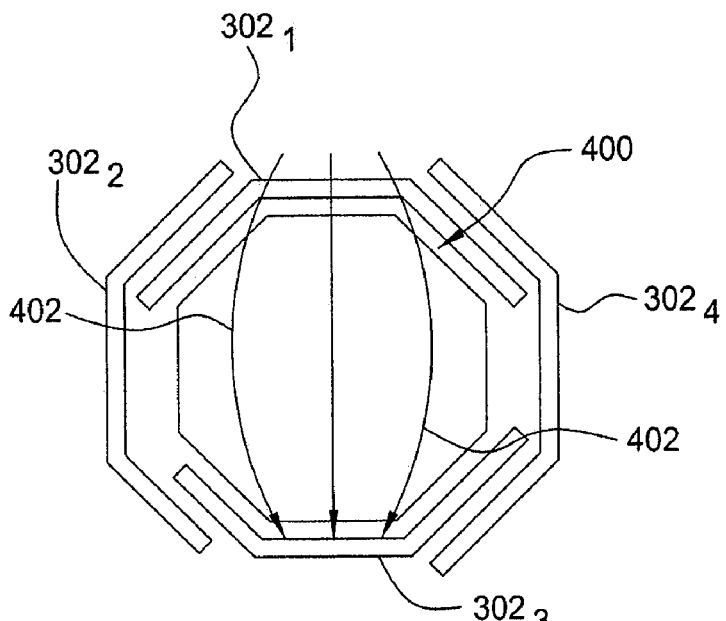
FIG. 4A-C depict a top schematic view of the magnetic fields respectively produced by main coils, sub-magnetic coils and both main and sub-magnetic coils.
Figure 4B:
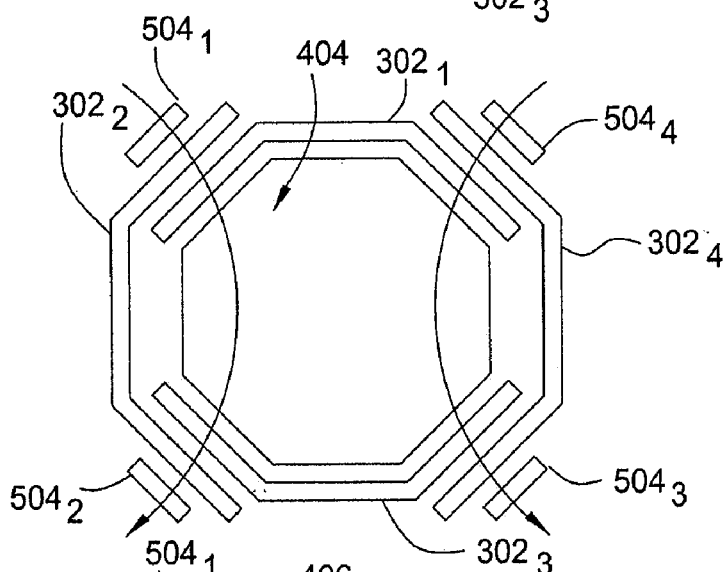
Figure 4C:
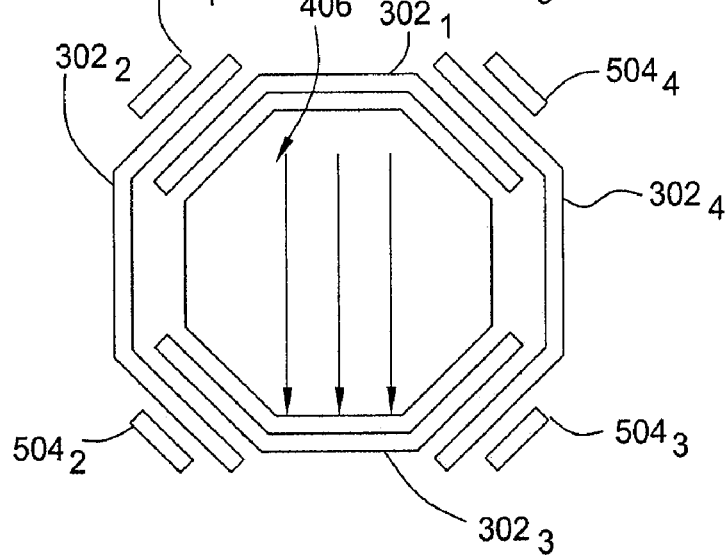

In some processes, opposite coils (e.g., $302_1$ and $302_3$) are driven with current in pairs to produce magnetic fields that extend across the substrate. For best process results, it is desired that the magnetic field uniformly extend across the chamber with parallel lines of force. However, as depicted in FIG. 4A, when coils $302_1$ and $302_3$ are driven, the magnetic field 400 has a convex shape, i.e., the outer lines of force 402 curve outward. To mitigate this convex field shape, a corrective magnetic field can be provided that has a concave shape. FIG. 4B depicts such a concave-shaped corrective field 404 being produced by sub-magnetic coils $504_1$, $504_2$, $504_3$ and $504_4$ that are positioned proximate the main magnetic coils $302_1$, $302_2$, $302_3$ and $302_4$. As is discussed in detail below, the sub-magnetic coils are positioned proximate the ends of the main magnetic coils. As depicted in FIG. 4C, the vector addition of the main and corrective fields forms a uniform field 406 extending across the chamber. As is discussed below, the addition of such sub-magnetic coils $504_1$, $504_2$, $504_3$ and $504_4$ provide a large number of other benefits including additional magnetic field shape control for both instantaneous fields and for controlling the field shape as the fields are switched to facilitate field rotation.

The use of corrective fields can be extended to be produced by a wide variety of coil configurations. These configurations include placing coils that generate corrective fields in a horizontal plane about the chamber, a vertical plane about the chamber, or both. A limited sample of the possible embodiments of the invention that utilize such corrective fields are discussed below. The invention is intended to encompass any combination of coils that provide corrective magnetic fields for shaping the magnetic field produced by the main coils.

Figure 5:
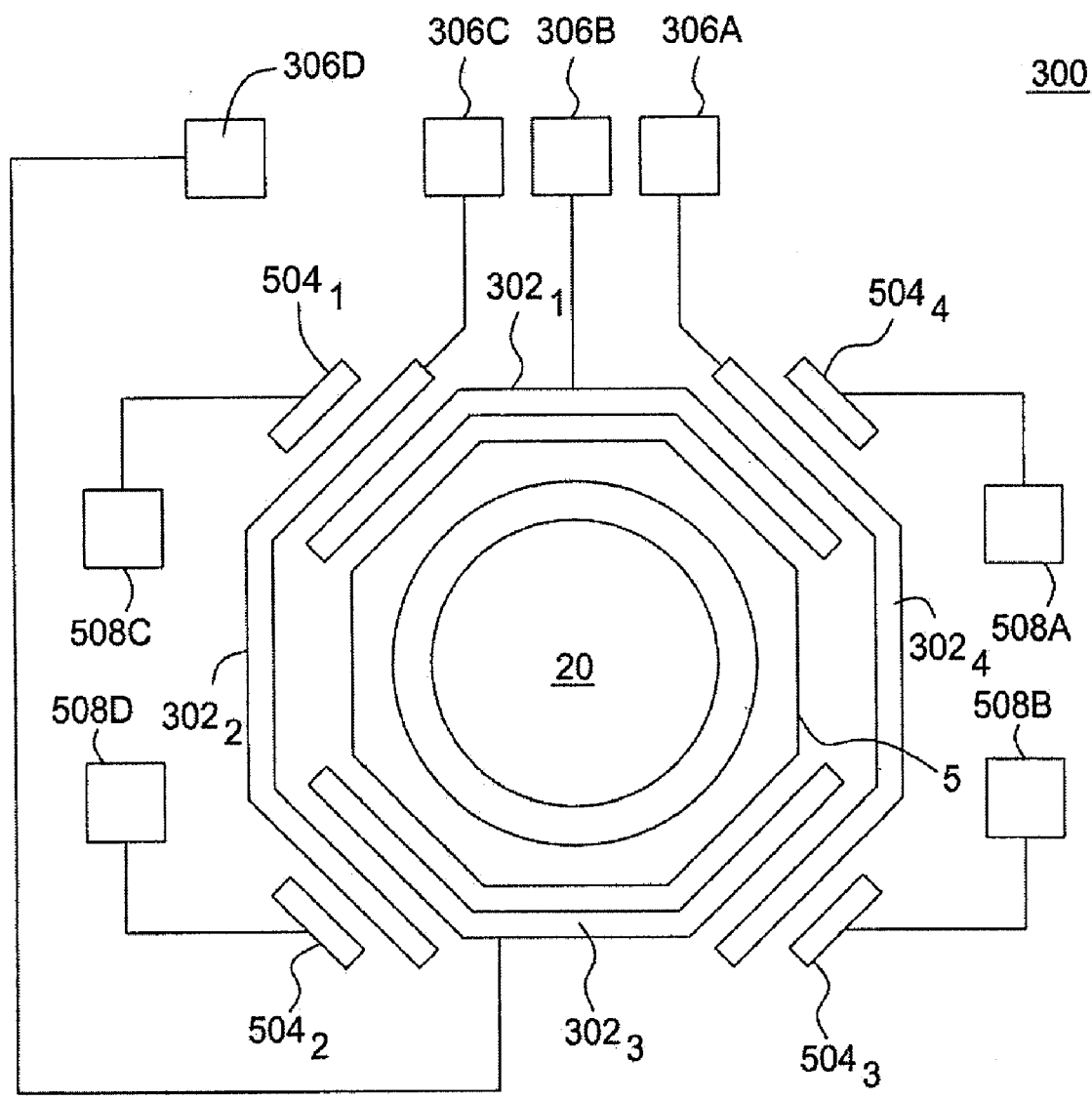
FIG. 5 is a top schematic view of a process chamber having both extended width main magnetic coils and sub-magnetic coils in accordance with one embodiment of the invention.

As depicted in FIG. 5, for greater control over the shape of the magnetic field in the chamber, sub-magnetic coils $504_1$, $504_2$, $504_3$, $504_4$ (collectively referred to as sub-magnetic coils 504) are strategically placed proximate the main magnetic coils 302. Illustratively, the sub-magnetic coils 504 are placed proximate the overlapping portions of the main magnetic coils 302. The sub-magnetic coils 504 generate a magnetic field and allow "tuning" of the fields produced in the corners (e.g., at the overlapping portions). The sub-magnetic coils 504 are used to control the shape of the magnetic field. The overall field contour can be established by varying the turns, angle, width, and separate current drives. The angle and width of the coils allow the placement of more coils (i.e., a stronger magnetic influence) in the reactor. More turns in a coil also provide a stronger magnet. A stronger magnet produces a stronger magnetic field and provides greater control over the magnetic field gradient. Although it is convenient to place the sub-coil in the overlapping portions—it is not mandatory. In other embodiments of the invention, the sub-magnetic coils can be placed adjacent (i.e., end to end) to the main magnetic coils (See FIGS. 16 and 17 below). As shall be discussed in detail below, when sub-magnetic coils are used, the main coils establish an initial shape of the magnetic field and the sub-magnetic coils can then be used to adjust (or correct) the field contour to achieve an optimal magnetic field shape.

To achieve a desired magnetic field contour, current is driven through each of the sub-magnetic coils 504. Specifically, current sources 508A and 508B drives current through sub-magnetic coils $504_1$ and $504_2$, and current sources 508C and 508D drives current through sub-magnetic coils $504_3$ and $504_4$. In one embodiment, each of the sub-magnetic coils 504 can be driven by separate current sources such that up to eight current sources can be used to drive the main and sub-magnetic coils. Such independent current facilitate wide control over the magnetic field shape. In one embodiment of the invention, four current sources can be used to provide current to the main magnetic coils 302 and sub-magnetic coils 504. In the instance when four current sources are used, the sub-magnetic coils are "double wound" with each of the two windings series connected to a different adjacent main magnetic coil. This configuration uses the same number of currents as are used in an existing eMxP+ chamber identified above.

Figure 6:
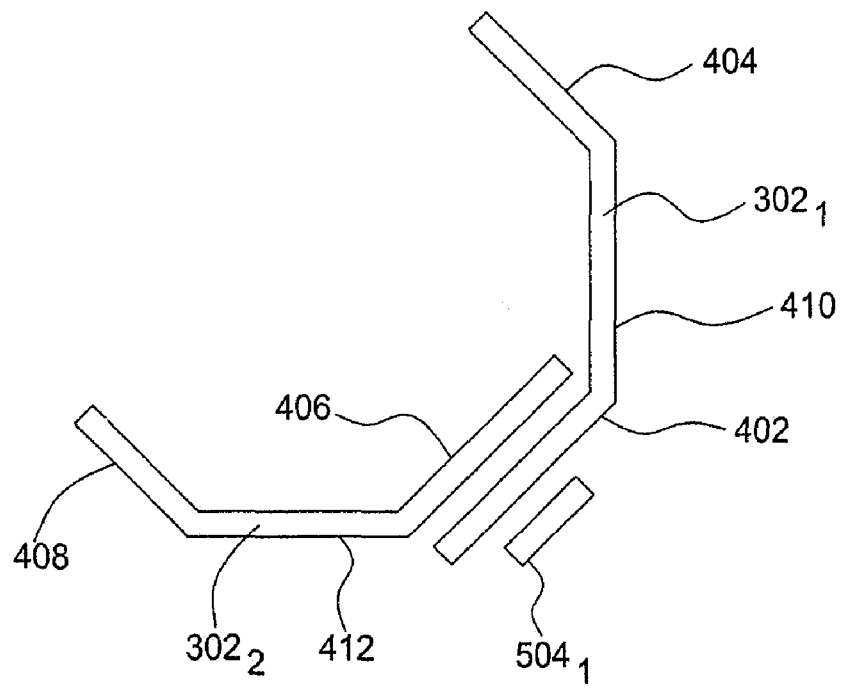
FIG. 6 is a top view of two main magnetic coils and a sub-magnetic coil section shown in FIG. 5.

FIG. 6 is a top view of two main magnetic coils 302 (i.e., main magnetic coils $302_1$ and $302_2$,) and sub-magnetic coil $504_1$. Main magnetic coil $302_1$ has a central portion 410 and overlapping portions 402 and 404. Main magnetic coil $302_2$ has a central portion 412 and overlapping portions 406 and 408. Although the sub-magnetic coil $504_1$ is depicted as being positioned outside the periphery of the main magnetic coils 302 that depiction is for illustrative purposes only. In the embodiment depicted in FIGS. 6 and 7 the sub-magnetic coils 504 are located between the overlapping portions and within the plane of the overlapping portions.

Figure 7:
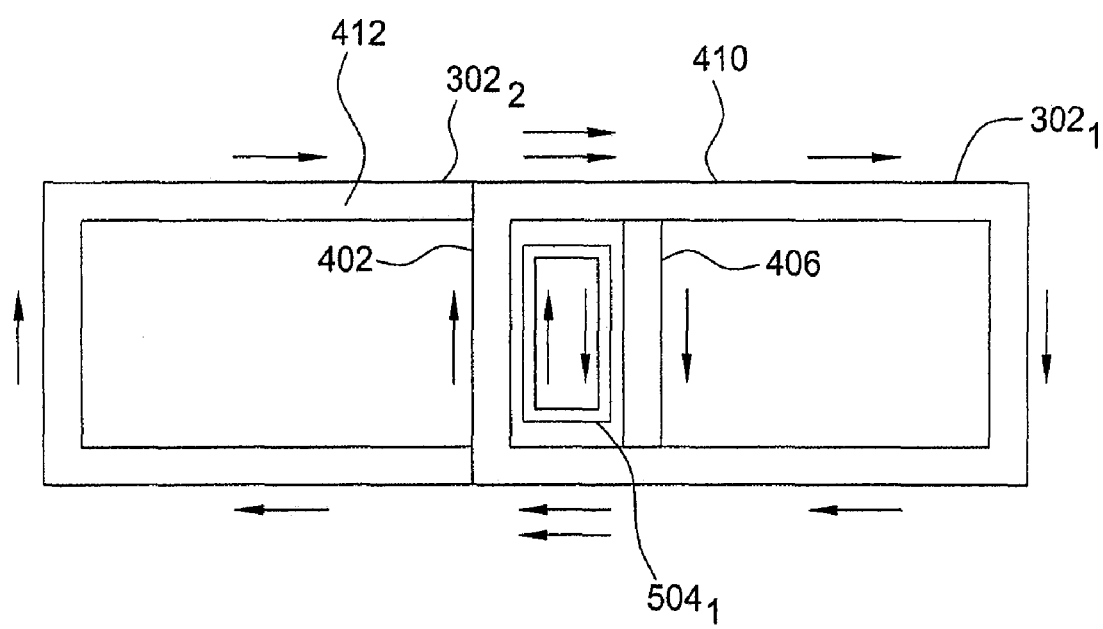
FIG. 7 is a side view of main magnetic coil sections and the sub-magnetic coil shown in FIG. 6.
Figure 7A:
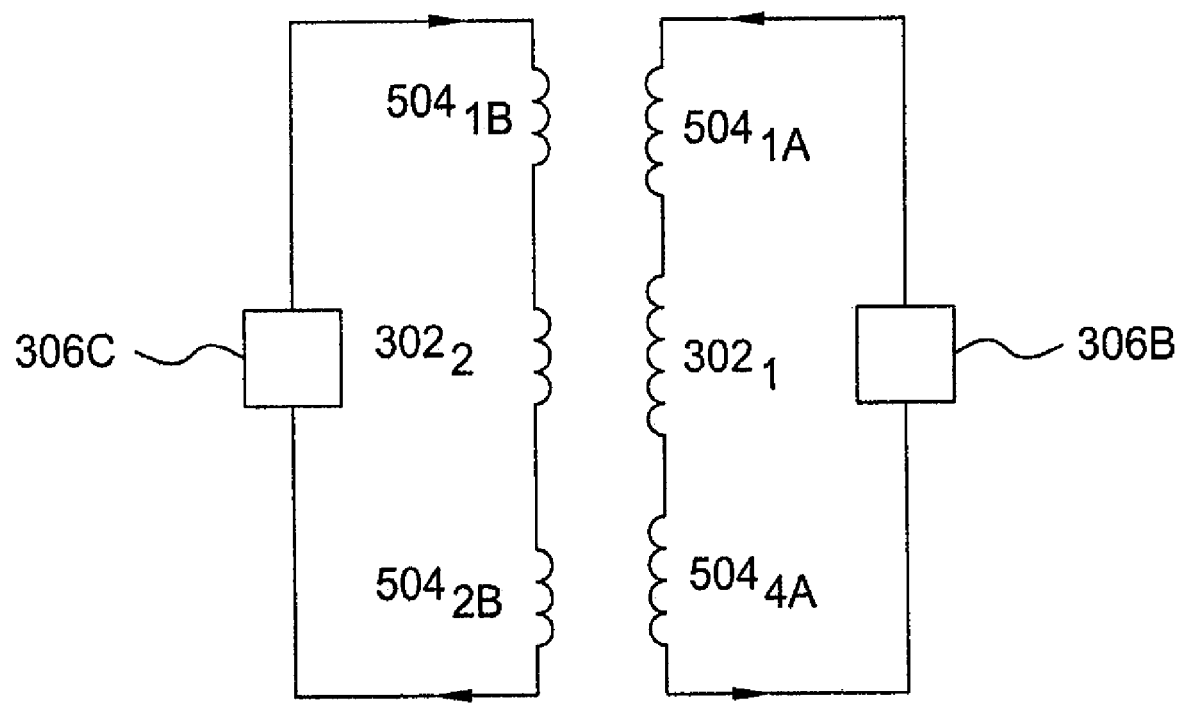
FIG. 7A depicts a schematic circuit of a double wound version of the coil configuration of FIG. 7.

FIG. 7 is a side view of main magnetic coils 302 (i.e., main magnetic coils $302_1$ and $302_2$,) and sub-magnetic coil $504_1$. FIG. 7A depicts a schematic circuit of a double wound version of the coil configuration of FIG. 7. The sub-magnetic coil $504_1$ is wound as two coils $504_{1A}$ and $504_{1B}$ onto a single "bobbin" and each coil $504_{1A}$ and $504_{1B}$ is respectively series connected to a main coil $302_1$ and $302_2$. Additionally, the sub-magnetic coil $504_{4A}$ is wired in series with the main coil $302_1$ and sub-magnetic coil $504_{1A}$. Thus, four current sources 306A, 306B, 306C and 306D drive current through each of the four sets of three coils. As such, each current is driven through three series connected coils, i.e., two sub-magnetic coils and a main coil. Each main and sub-magnetic coil is wound and wired in this manner to enable four current sources to shape and control the magnetic field within the chamber. During the etching process, adjacent magnetic coils generate a relatively strong magnetic field at predetermined intervals. The current through adjacent magnetic coils can flow in the same direction as shown by the arrows. Specifically, FIGS. 7 and 7A depict the direction of the flow of current through main magnetic coils $302_1$, and $302_2$, and sub-magnetic coils $504_1$. Note that the current through main magnetic coils $302_1$, and $302_2$, and sub-magnetic coils $504_1$ flows in a clockwise direction. As such, the current is additive and creates a larger magnetic field than if the currents flow in opposite directions.

Figure 8A:
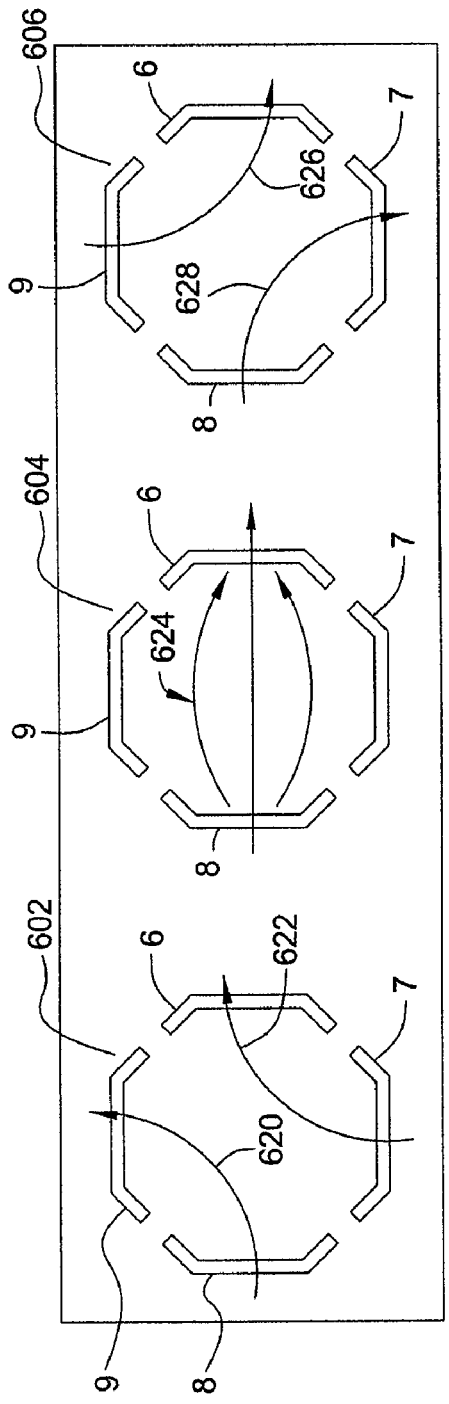
FIGS. 8A-8C are transitional diagrams depicting the generation of the magnetic field in accordance with the prior art and an embodiment of the invention.
Figure 8B:
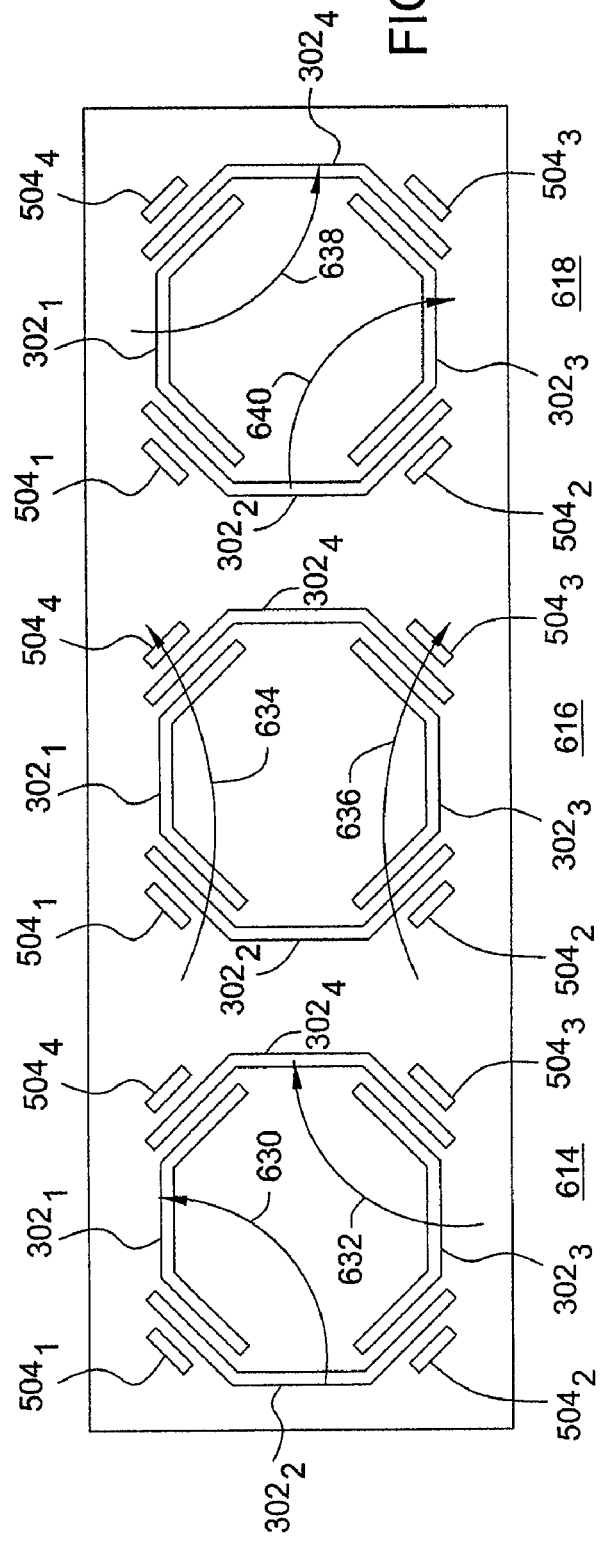
Figure 8C:
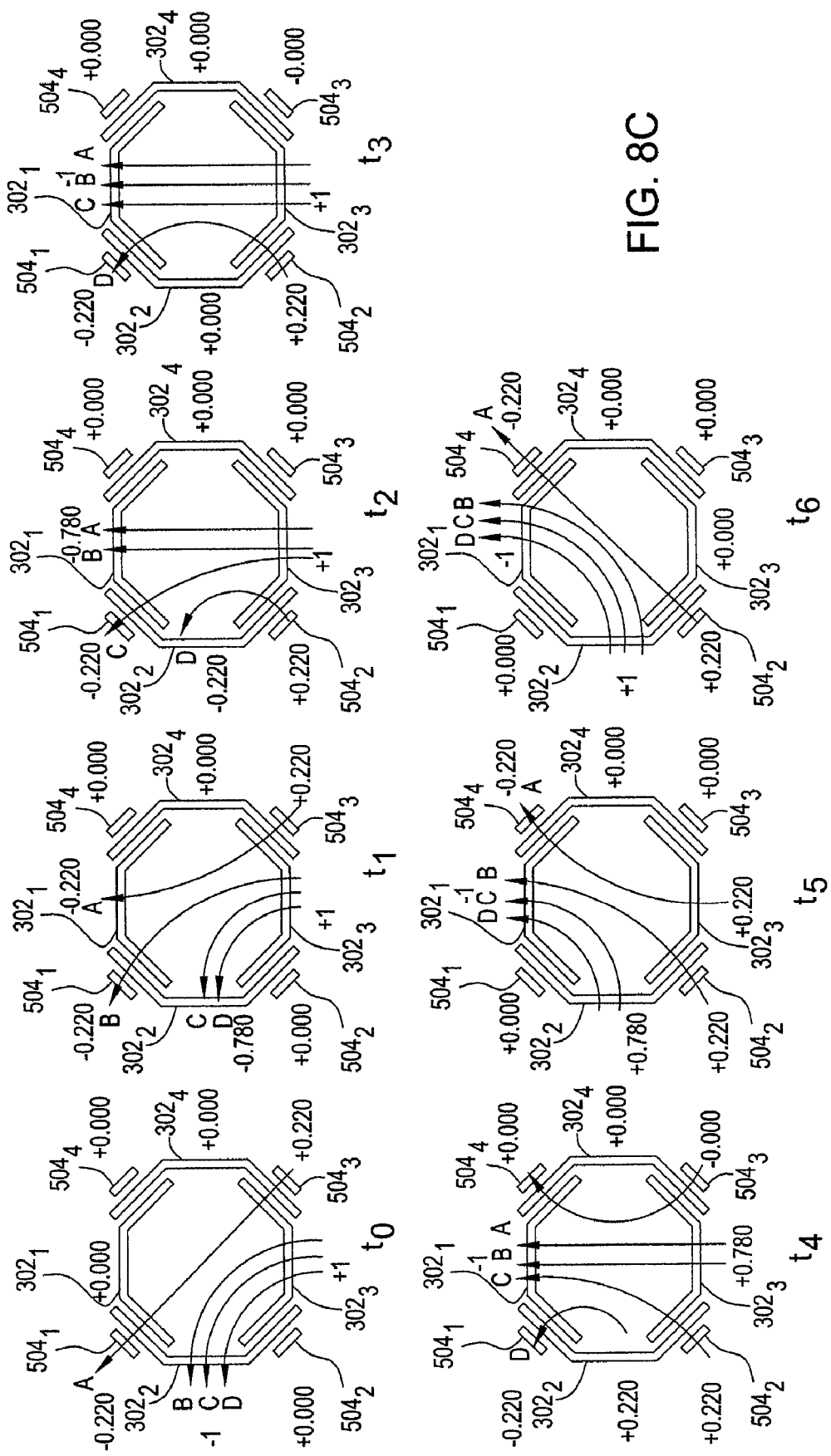

FIGS. 8A-8C together depict transition sequences used to rotate the magnetic field in an etching chamber. FIG. 8A depicts the prior art application of different magnetic field intensities for magnetic coils at intervals (or degrees with respect to an initial starting point) 602, 604, and 606. For example, FIG. 8A comprises magnetic coils 6, 7, 8, and 9 of the prior art; a high magnetic field 620; and a low magnetic field 622. At interval 602 (zero degrees), adjacent magnetic coils 8 and 9 generate a curved high magnetic field 620.

During this same interval, magnetic coils 6 and 7 generate a curved low magnetic field 622. When combined, the two curved magnetic fields 620 and 622 form a concave shaped field above the substrate in the chamber. During transition from one pair of adjacent coils to another pair of adjacent coils that facilitates field rotation, the plasma in the etching chamber momentarily jumps as the field is rotated. To provide a smoother field, at interval 604 (forty-five degrees), a high magnetic field 624 is generated between coils 6 and 8 by applying current to coils 6 and 8 only. This generation of the high convex magnetic field 624 at forty-five degrees helps lessen the jump in the plasma. At interval 606 (ninety degrees), the curved high magnetic field 626 is generated by magnetic coils 6 and 9, while the low magnetic field 628 is generated by magnetic coils 7 and 8. At this point, rotation is complete. However, the magnetic field gradient at interval 604 is substantially different from the gradient in intervals 602 and 606.

FIG. 8B depicts the transition of the high magnetic field at intervals 614, 616, and 618 (zero, forty-five, and ninety degrees respectively) while maintaining the current magnetic field gradient in accordance with the present invention. For example, FIG. 8B comprises main magnetic coils $302_1$, $302_2$, $302_3$ and $302_4$; sub-magnetic coils $504$, $504_2$, $504_3$, and $504_4$; a high magnetic field 630; and a low magnetic field 632. At interval 614, the curved high magnetic field 630 is generated at main magnetic coils $302_1$, and $302_2$ while the curved low magnetic field 632 is generated by main magnetic coils $302_3$ and $302_4$. Interval 616 provides a smoother transition from zero to ninety degrees because the magnetic field gradient is maintained at the 45° position. Specifically, current is applied to sub-magnetic coils $504_4$ and $504_1$ which generates a high magnetic field 634. In addition, a low magnetic field 636 is generated by sub-magnetic coils $504_2$ and $504_3$. Note that at interval 616 (forty five degrees) that the magnetic fields generated are curved such that they have the same shape and gradient as the fields at zero degrees. A consistent, individual curved magnetic field within the etching chamber provides a consistent magnetic field gradient within the chamber. At interval 618 (90°), current is applied to main magnetic coils $302_1$ and $302_4$ which generates a high magnetic field 638. In addition, a low magnetic field 640 is generated by the application of current to main magnetic coils $302_2$ and $302_3$.

FIG. 8C depicts using various combinations of coils to achieve a substantially smooth rotation of the magnetic field during a 90° rotation in accordance with another embodiment of the invention. The currents are indicated as normalized values relative to the high magnetic field coil current and the direction of the current is indicated by a plus or minus. For example, at time $t_0$, a magnetic field "BCD" is generated by adjacent magnetic coils $302_2$ and $302_3$ (i.e., the polarity of magnetic coil $302_3$ is opposite to the polarity of magnetic coil $302_2$). Current also passes through sub-magnetic coils $504_1$ and $504_3$ to provide a magnetic field "A" that helps shape the magnetic field at the ends of the adjacent magnetic coils $302_2$ and $302_3$. Note that the polarity of the current in sub-magnetic coil $504_1$ is opposite to the polarity of the current in sub-magnetic coil $504_3$.

At t1, current is applied to the respective coils 302 and 504 such that a diminished magnetic field "CD" is generated by adjacent magnetic coils $302_2$ and $302_3$. The numbers and respective polarities depicted represent relative (normalized) magnitude and polarity of the applied currents. For example, the current that passes through magnetic coil $302_1$ has a polarity opposite to sub-magnetic coil $504_3$. As such, the portion of the magnetic field represented by "A" is transitioned between $504_3$ and $302_1$. The sub-magnetic coil $504_1$ causes the portion of the magnetic field represented by "B" to be generated at sub-magnetic coil $504_1$ and main magnetic coil $302_3$. The transitioning process is performed by increasing and decreasing the current between main magnetic coils 302 and sub-magnetic coils 504.

At t2, current is applied to the sub-magnetic coils $504_1$ and $504_2$ and the current is increased at main magnetic coil $302_1$. As a result, the magnetic field represented by "B" moves vertically between main magnetic coils $302_1$, and $302_3$. The portion of the magnetic field represented by "C" transitions towards sub-magnetic coil $504_1$.

At t3, no current is applied to main magnetic coil $302_2$, and there is an increase in the current applied to main magnetic coil $302_1$. As a result, the portion of the magnetic field represented by "C" flows vertically between main magnetic coils $302_1$ and $302_3$.

At t4, the current at main magnetic coil $302_2$ is turned on and the current at $302_3$ is decreased. As a result, the portion of the magnetic field represented by "D" flows between main magnetic coil $302_2$ and sub-magnetic coil $504_1$.

At t5, the current at sub-magnetic coil $504_3$ is turned off, the current at main magnetic coil $302_3$ is decreased, and the current at main magnetic coil $302_2$ is increased. As a result, the portions of the magnetic fields represented by "A," "B," "C," and "D" flow between the coils as shown.

Lastly, at t6, the current is increased at main magnetic coil $302_2$ and turned off at main magnetic coil $302_3$. As a result, the magnetic field gradient represented by "A" flows between sub-magnetic coils $504_2$ and $504_4$ and the magnetic field represented by "BCD" flows between main magnetic coils $302_1$ and $302_2$, i.e., the magnetic field has been rotated by 90° while maintaining a gradient during the transition.

FIG. 8C should be considered one example of using embodiments of the present invention to rotate the magnetic field. Other current combinations may produce useful magnetic field rotation. For example, see below for an additional description of methods for rotating a magnetic field in accordance with embodiments of the present invention.

Figure 9:
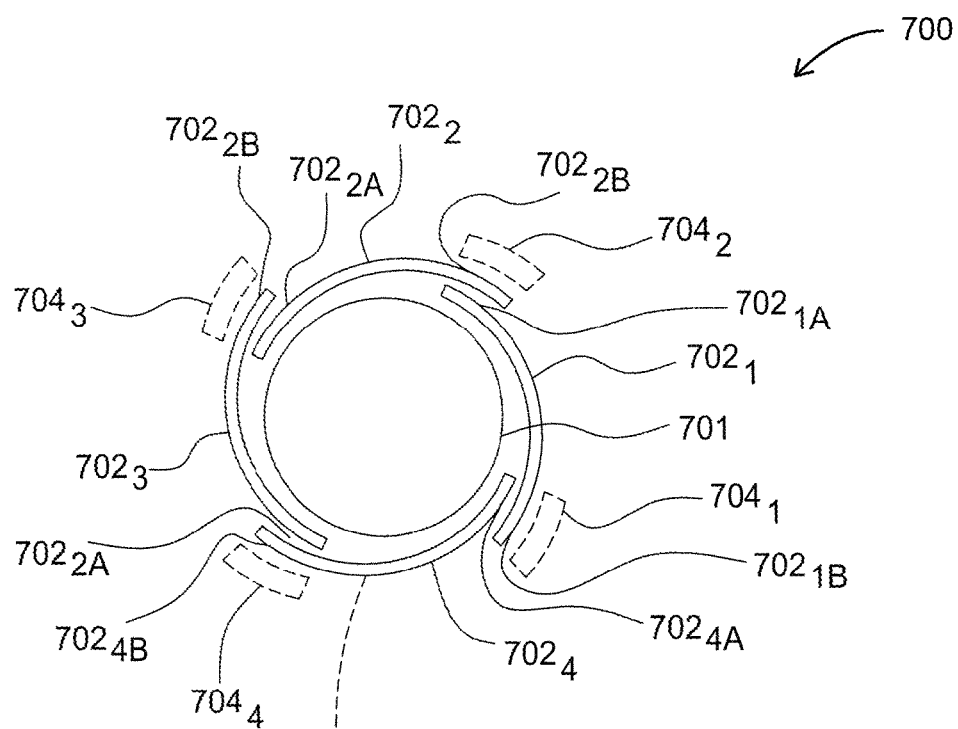
FIGS. 9-17 are top views of various embodiments of magnetic coil configurations in accordance with the invention.

FIG. 9 depicts a top view of an alternative embodiment of a magnetic coil configuration 700 circumscribing a cylindrical process chamber 701. This configuration is similar to that shown in FIGS. 3 and 5 above, except the main coils are interleaved, for example, for each coil, one end is overlapped and one end is overlapping. The magnetic coil configuration 700 comprises overlapping main magnetic coils $702_1$, $702_2$, $702_3$, and $702_4$ (collectively main magnetic coil 702) and optional sub-magnetic coil $704_1$, $704_2$, $704_3$, and $704_4$ (collectively main magnetic coil 704). Each of the main magnetic coils 702 has one end $702_{XB}$ that overlaps an end (where X is the coil number) of an adjacent magnetic coil and the other end $702_{XA}$ of the main magnetic coil $702_X$ is overlapped by an end of another adjacent main magnetic coil 702. For example, the end $702_{1B}$ overlaps the end $702_{4A}$ and the end $702_{1A}$ is overlapped by the end $702_{2B}$. Note that each of the main magnetic coils 702 is positioned such that the ends of any of the main magnetic coils 702 are not equidistant from a center of the process chamber 701. Because the coils are positioned on a slight angle, the magnetic coils can be made larger (wider) than if they were arranged on a common cylinder. In addition, sub-magnetic coil 704 can be placed proximate the overlapping portions of the main magnetic coils 702 to provide greater magnetic field control as described above with respect to FIGS. 8B and 8C. The sub-magnetic coils 704 can be positioned in the plane of the main coils (as discussed with respect to FIG. 7) or outside the main coils. It is appreciated that other embodiments may be used in accordance with the invention that utilizes main magnetic coils having a larger or smaller angle than the angle of the main magnetic coils 702 depicted in coil configuration 700.

Figure 9A:
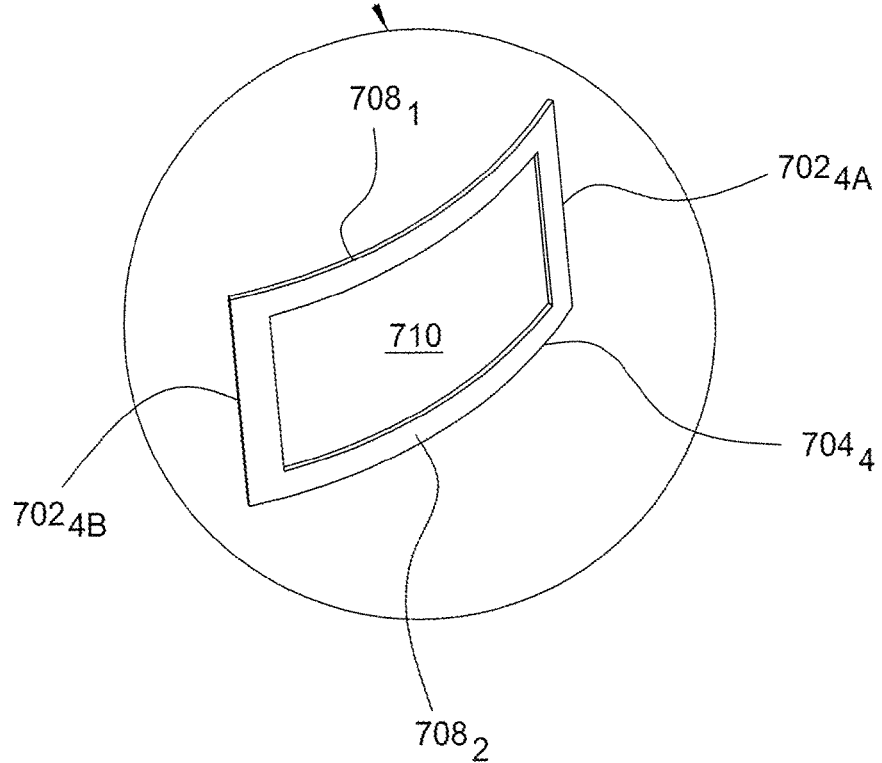

FIG. 9A depicts a perspective view of one main magnetic coil (coil $702_4$) in FIG. 9. The main magnetic coil $702_4$ contains ends $702_{4A}$ and $702_{4B}$, a top portion $708_1$, a bottom portion $708_2$, and an interior area 710. The top portion $708_1$ and bottom portion $708_2$ are curved and substantially parallel to each other. The top portion $708_1$ and bottom portion $708_2$ are connected via ends $702_{4A}$ and $702_{4B}$. The ends $702_{4A}$ and $702_{4B}$ are substantially parallel to each other. The main magnetic coil $702_4$ contains an interior area 710 formed by the interconnection of the ends $702_{4A}$ and $702_{4B}$, the top portion $708_1$, and bottom portion $708_2$.

Figure 10:
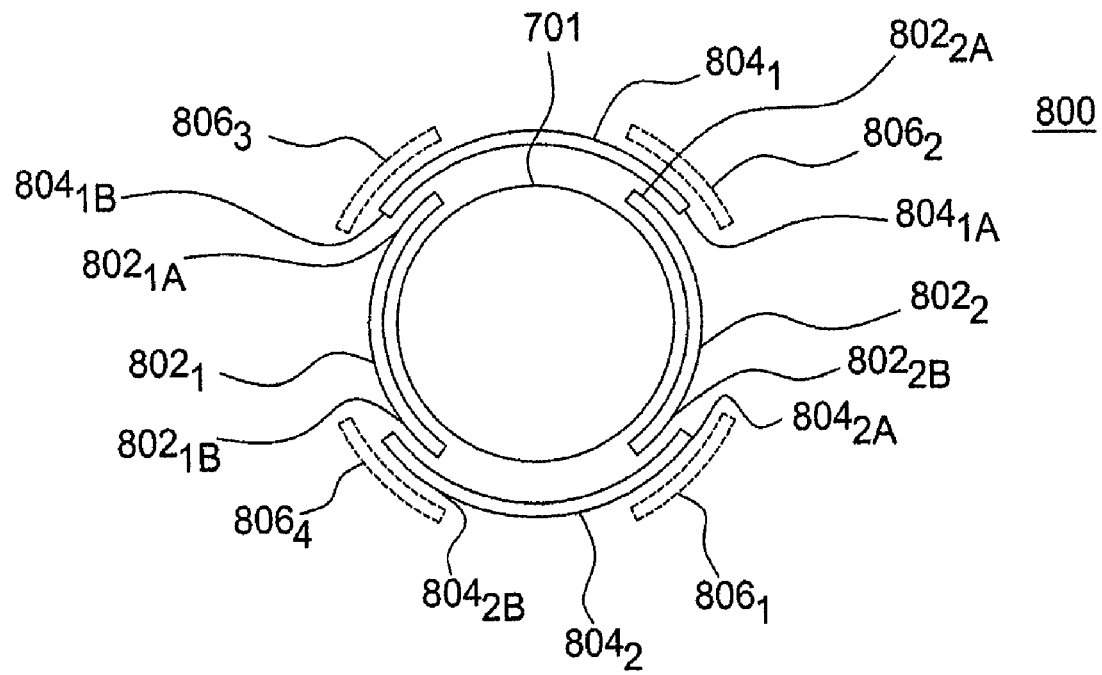

FIG. 10 depicts a top view of another embodiment of a magnetic coil configuration 800 circumscribing a cylindrical process chamber 701. This configuration is similar to those shown in FIGS. 3 and 5 except the chamber 701 is now cylindrical rather than octagonal. The magnetic coil configuration 800 contains main magnetic coils $802_1$, and $802_2$, (collectively main magnetic coil 802), main magnetic coil $804_1$ and $804_2$ (collectively main magnetic coils 804), and optional sub-magnetic coils $806_1$, $806_2$, $806_3$ and $806_4$ (collectively sub-magnetic magnetic coils 806). Main magnetic coils 802 are positioned opposite each other and slightly curved towards one another to partially circumscribe the process chamber 701. Each main magnetic coil 802 covers about 90° of the circumference of the chamber 701. Main Magnetic coils 804 are positioned outside of main magnetic coils 802 and are offset by about 90° from the main magnetic coils 802. Each of the main magnetic coils 802, 804 has two ends. Specifically, main magnetic coils $802_X$ (where X is the coil number) have ends $802_{XA}$ and $802_{XB}$, and main magnetic coils $804_X$ have $804_{XA}$ and $804_{XB}$. The main magnetic coils 804 are positioned opposite of each other and slightly curved towards one another to partially circumscribe the process chamber 701. In addition, main magnetic coil 804 overlap ends of main magnetic coils 802. For example, main magnetic ends $802_{1A}$ and $802_{2B}$ are overlapped by ends $804_{1B}$ and $804_{1A}$ respectively. Further, sub-magnetic coils 806 can be positioned in or near the overlapping portions of the main magnetic coils 802 and 804 or outside the main magnetic coils 802 and 804.

Figure 11:
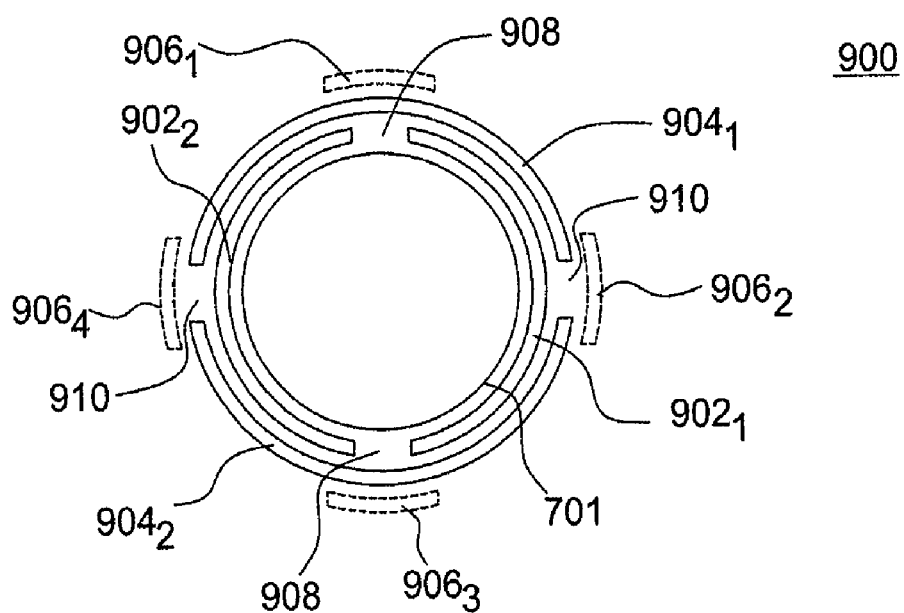

FIG. 11 depicts another embodiment of magnetic coil configuration 900 circumscribing a cylindrical process chamber 701. This configuration is similar to FIG. 10 except each of the main coils cover about 180° of the chamber circumference and the sub-magnetic coils are centrically aligned with the main coils. The magnetic coil configuration 900 contains main magnetic coils $902_1$ and $902_2$, (collectively main magnetic coils 902), main magnetic coils $904_1$ and $904_2$ (collectively main magnetic coils 904), and optional sub-magnetic coils $906_1$, $906_2$, $906_3$, and $906_4$ (collectively sub-magnetic magnetic coils 906). Main magnetic coils $902_1$ and $902_2$, are positioned opposite each other and curved towards each other to circumscribe the process chamber 701. Spaces 908 are formed between adjacent ends of the main magnetic coils 902. Further each main magnetic coil 902 covers about 180° of the circumference of the process chamber 701. Main magnetic coils $904_1$, and $904_2$, are positioned outside of main magnetic coils 902, are curved inwards, and are positioned opposite of each other. Spaces 910 are formed between adjacent ends of the main magnetic coils 904. Further the main magnetic coils 904 are offset from the main magnetic coils 902 by about 90°. Each of the main magnetic coils 904 covers about 180° of the circumference of the process chamber 701. The coil configuration 900 is similar to the coil configuration 800 except that in the coil configuration 900 the main magnetic coils overlap more than in the coil configuration 800.

Further, the optional sub-magnetic coils 906 are juxtaposed to the spaces 908 and 910 of the main magnetic coils 902 and 904, respectively. In this configuration, the centers of the sub-magnetic coils 906 are aligned with the centers of the respective main magnetic coils 902 and 904. Generally, the 180 degree main magnetic coils 902 and 904 are not very effective in producing magnetic field gradients. The addition of the sub-magnetic coils 906 improves the ability of the coil configuration to produce magnetic field gradients. If the coils are driven by eight independent currents, the configuration provides substantial control of the magnetic field shape. Alternatively, the configuration may also be operated using four currents by wiring in series the following coil pairs: $904_1$ and $906_1$; $902_1$ and $906_2$; $904_2$ and $906_3$ and $902_2$ and $906_4$.

Figure 12:
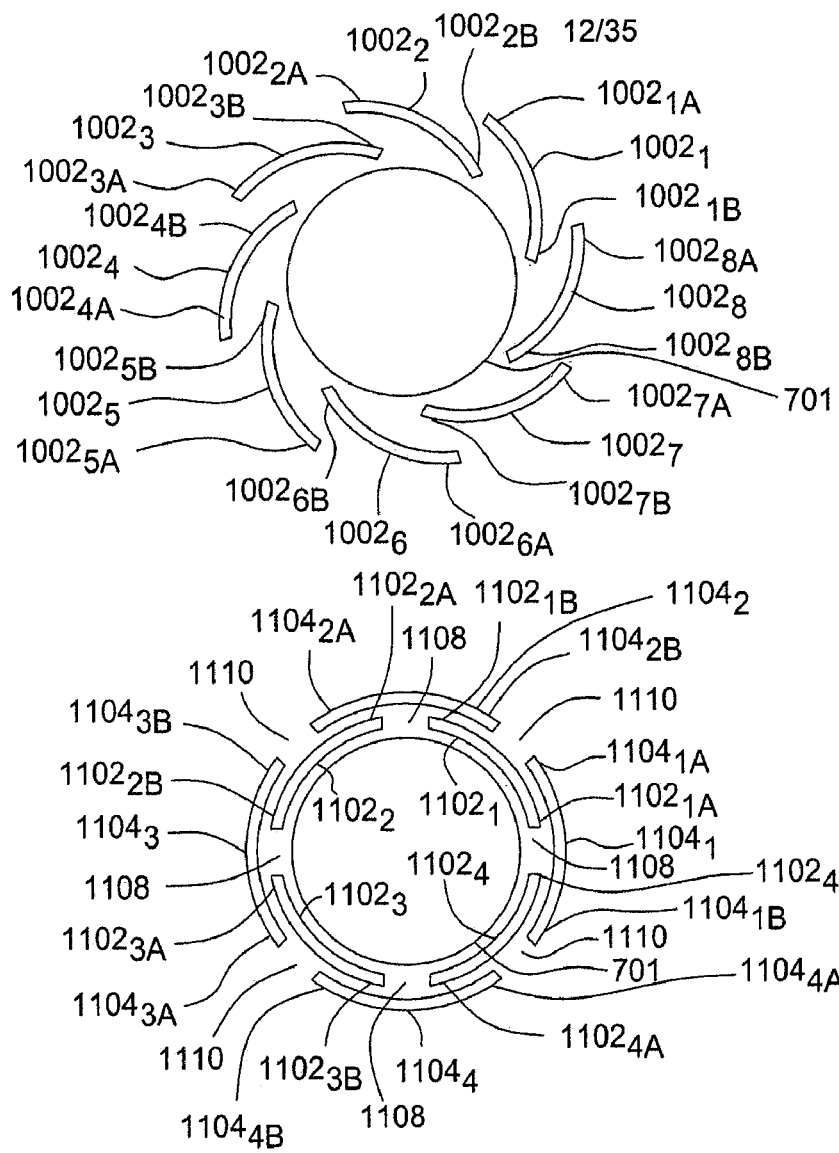

FIG. 12 depicts another embodiment of a top view of a magnetic coil configuration 1000 to circumscribe a process chamber 701. Magnetic coil configuration 1000 contains main magnetic coils $1002_1$-$1002_8$, (collectively main magnetic coils 1002). Each of the main magnetic coils 1002 is curved. Each of the main magnetic coils 1002 has one end $1002_{XA}$ that overlaps an adjacent magnetic coil $1002_X$ (where X is the coil number) and one end $1002_{XB}$ that is overlapped by another adjacent magnetic coil $1002_X$. In addition, each of the main magnetic coils 1002 covers about 45° to circumscribe the process chamber 701. Although FIG. 12 depicts the magnetic coil configuration 1000 as having eight coils other embodiments can be used (e.g., sixteen magnetic coils). In an embodiment that uses sixteen coils, each of the coils covers about 22.5° to circumscribe the process chamber 701. In general, any number of overlapping coils may be used. Note that the use of N coils (where N is an integer greater than 1, where each coil has a width that covers greater than 360/N degrees, then the shape of the magnetic field in the chamber is improved over a coil configuration having N coils that do not overlap, i.e., wider coils improve the magnetic field shape.

Figure 13:
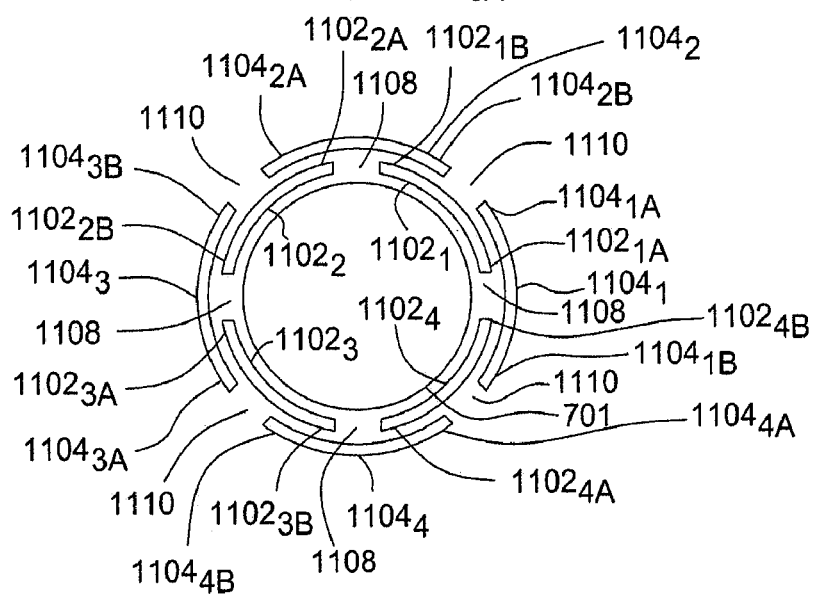

FIG. 13 depicts a top view of another embodiment of a magnetic coil configuration 1100 to circumscribe a process chamber 701. The coil configuration 1100 contains main magnetic coils $1102_1$, $1102_2$, $1102_3$, and $1102_4$ (collectively main magnetic coils 1102), and main magnetic coils $1104_1$, $1104_2$, $1104_3$, and $1104_4$ (collectively main magnetic coils 1104). Each of the main magnetic coils 1102 covers about 90° to circumscribe a process chamber 701 and has an adjacent main magnetic coil 1102. There is a space 1108 formed between each adjacent main magnetic coil 1102. Main magnetic coils $1104_X$ are curved and placed outside of main magnetic coils $1102_X$ such that each end of the main magnetic coil 1104 overlaps an end of two adjacent main magnetic coils 1102 (where X is the coil number). For example, main magnetic coil ends $1104_{2A}$ and $1104_{2B}$ overlap main magnetic coil ends $1102_{2A}$ and $1102_{1B}$, respectively. Each main magnetic coil 1104 covers about 90° to circumscribe a process chamber 701. There is a space 1110 formed between adjacent main magnetic coils 1104. In addition, main magnetic coils 1104 are offset from main magnetic coils 1102 by about 90°.

Figure 14:
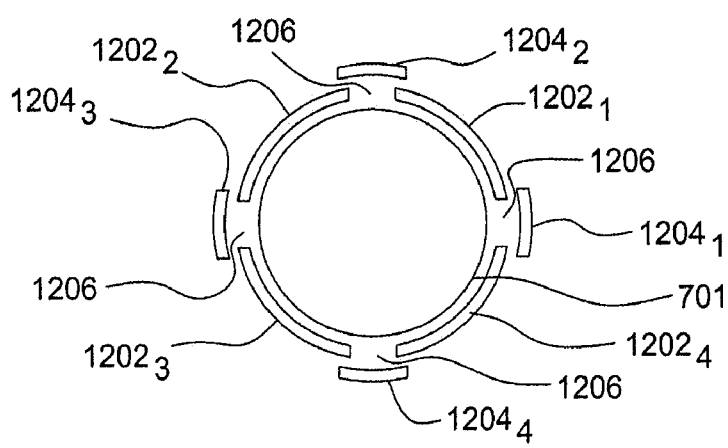

FIG. 14 depicts a top view of another embodiment of a magnetic coil configuration 1200 to circumscribe a process chamber 701. This configuration is similar to the configuration of FIGS. 3 and 5 except the main coils do not overlap. The magnetic coil configuration 1200 contains main magnetic coils $1202_1$, $1202_2$, $1202_3$, and $1202_4$ (collectively main magnetic coils 1202) and sub-magnetic coils $1204_1$, $1204_2$, $1204_3$, and $1204_4$ (collectively sub-magnetic coils 1204). Each main magnetic coil 1202 is curved inwards to circumscribe the process chamber 701 and covers about 90° of the circumference of the process chamber 701. Each main magnetic coil 1202 is adjacent to two other main magnetic coils 1202. The adjacent main magnetic coils 1202 are positioned end to end such that there is a space 1206 between adjacent ends of each of the main magnetic coils 1202.

Sub-magnetic coils 1204 are positioned adjacent to the spaces 1206 formed between adjacent main magnetic coils 1202. The sub-magnetic coils have centers that are positioned 45 degrees offset from the centers of the main magnetic coils. The sub-magnetic coils 1204 improve the shape of the magnetic fields generated within the chamber. If the coils are driven with eight independent currents, the configuration provides substantially improved control over the shape of the magnetic field produced in the chamber. Illustratively, the sub-magnetic coils 1204 are depicted as being located on the outer periphery of the main magnetic coils 1204.

In operation, a magnetic field gradient can be produced in the chamber by energizing three coil pairs, e.g., high current to coils $1202_2$ and $1202_3$, medium current to coils $1204_2$ and $1204_4$, and low current to coils $1202_1$ and $1202_4$. The pairs of main magnetic coils form a concave magnetic field and the pair of sub-magnetic coils forms a convex magnetic field. The vector addition of these fields produces a field with improved parallel lines of force across the substrate.

Figure 15:
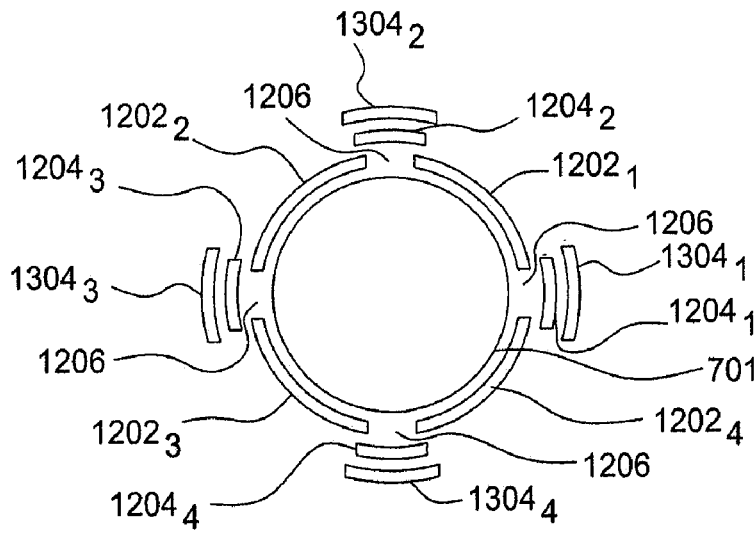

FIG. 15 depicts a top view of another embodiment of a magnetic coil configuration 1300 to circumscribe a process chamber 701. The magnetic coil configuration 1300 contains main magnetic coils $1202_1$, $1202_2$, $1202_3$, and $1202_4$ (collectively main magnetic coils 1202); sub-magnetic coils $1204_1$, $1204_2$, $1204_3$, and $1204_4$ (collectively sub-magnetic coils 1204); and sub-magnetic coils $1304_1$, $1304_2$, $1304_3$, and $1304_4$ (collectively sub-magnetic coils 1304). Each main magnetic coil 1202 is curved inwards to circumscribe the process chamber 701 and covers about 90° of the circumference of the process chamber 701. Each main magnetic coil 1202 is adjacent to two other main magnetic coils 1202. The adjacent main magnetic coils 1202 are positioned end to end such that there is a space 1206 between adjacent ends of each of the main magnetic coils 1202. The sub-magnetic coils 1304 are juxtaposed to the sub-magnetic coils 1204. The sub-magnetic coils 1304 increases the number of coil winding positioned near the spaces 1206 between main magnetic coils 1204. The addition of sub-magnetic coils 1304 provides a magnetic field additive to the magnetic field generated by main magnetic coils 1202 and sub-magnetic coils 1204. In this embodiment, twelve currents can be applied to achieve substantial improvement in the control of the magnetic field shape. Alternatively, the sub-magnetic coils can be wired in series with the adjacent main coils as described with respect to FIG. 7A such that only four current supplies are used to drive the configuration.

Figure 16:
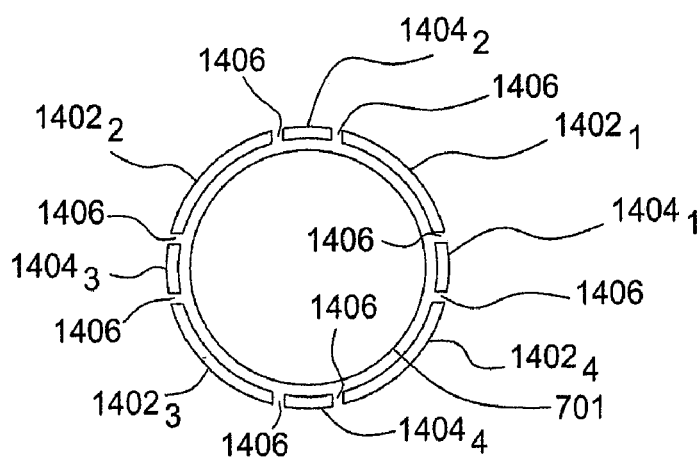

FIG. 16 depicts a top view of another embodiment of a magnetic coil configuration 1400 to circumscribe a process chamber 701. The magnetic coil configuration 1400 contains main magnetic coils $1402_1$, $1402_2$, $1402_3$, and $1402_4$ (collectively main magnetic coils 1402); and sub-magnetic coils $1404_1$, $1404_2$, $1404_3$, and $1404_4$ (collectively sub-magnetic coils 1404). Each of the main magnetic coils 1402 and sub-magnetic coils 1404 is curved, in the same plane, and alternatively positioned end to end. A space 1406 is formed between each alternatively positioned main magnetic coil 1402 and sub-magnetic coil 1404. The area covered by a main magnetic coil 1402 and a sub-magnetic coil 1404 is about 90° of the circumference of the process chamber 701.

Figure 17:
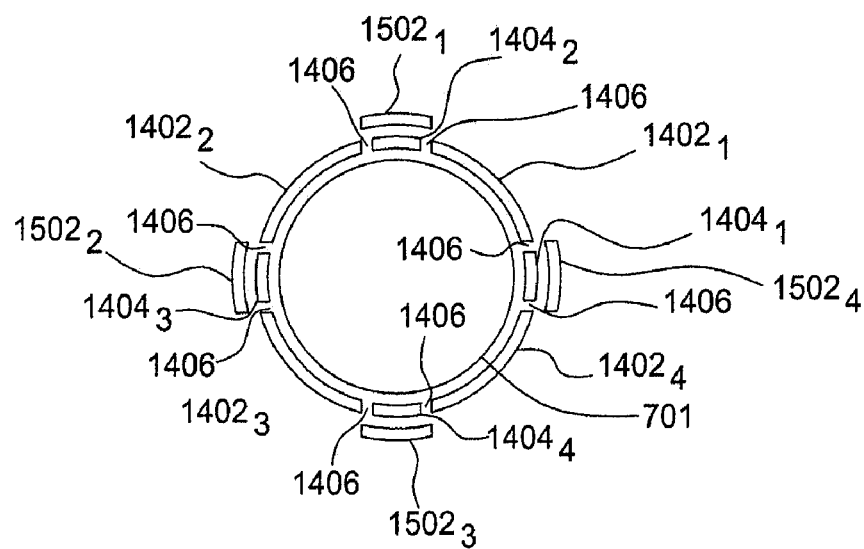

FIG. 17 depicts a top view of an embodiment of a magnetic coil configuration 1500 to circumscribe a process chamber 701. The magnetic coil configuration 1500 contains main magnetic coils $1402_1$, $1402_2$, $1402_3$, and $1402_4$ (collectively main magnetic coils 1402); sub-magnetic coils $1404_1$, $1404_2$, $1404_3$, and $1404_4$ (collectively sub-magnetic coils 1404); and sub-magnetic coils $1502_1$, $1502_2$, $1502_3$, and $1502_4$ (collectively sub-magnetic coils 1502). Each of the main magnetic coils 1402 and sub-magnetic coils 1404 is curved, in the same plane, and alternatively positioned end to end. A space 1406 is formed between each alternatively positioned main magnetic coil 1402 and sub-magnetic coil 1404. The sub-magnetic coils 1502 are juxtaposed (i.e., substantially parallel) to the sub-magnetic coils 1404. The area covered by a main magnetic coil 1402 and a sub-magnetic coil 1404 is about 90° of the circumference of the process chamber 701. The addition of the sub-magnetic coils 1502 increases the magnetic field by providing a magnetic field additive to the magnetic field provided by sub-magnetic coils 1404. In this embodiment, twelve currents can be applied to achieve substantial improvement in the control of the magnetic field shape. Alternatively, the sub-magnetic coils can be wired in series with the adjacent main coils as described with respect to FIG. 7A such that only four current supplies are used to drive the configuration.

Figure 18A:
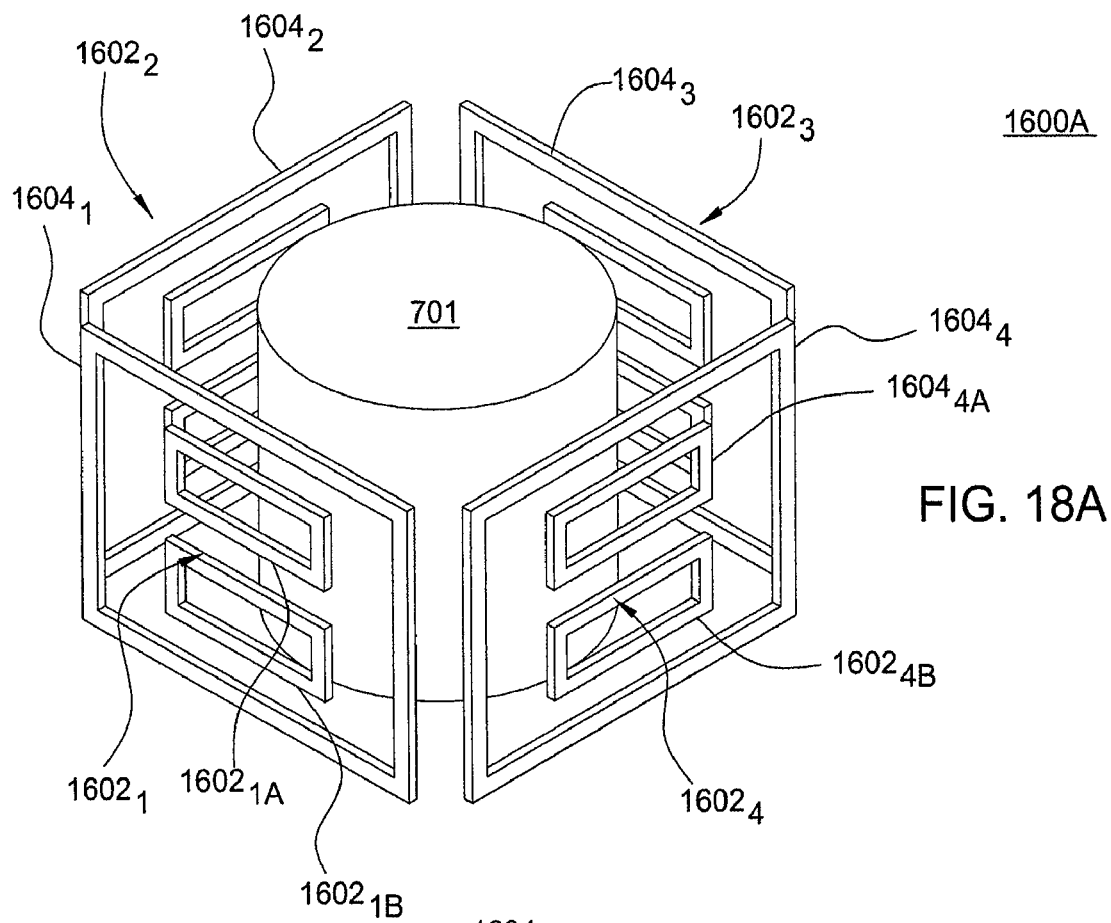
FIGS. 18A-18B depict perspective views of coil configurations having horizontal sub-magnetic coils in accordance with embodiments of the present invention.

FIG. 18A depicts a perspective view of another embodiment of a magnetic coil configuration 1600A to circumscribe a process chamber 701. The magnetic coil configuration 1600 comprises main magnetic coils $1604_1$, $1604_2$, $1604_3$, and $1604_4$ (collectively main magnetic coils 1604) and sub-magnetic coil pairs $1602_1$, $1602_2$, $1602_3$, and $1602_4$ (collectively sub-magnetic coils 1602). In this embodiment, the pairs of sub-magnetic coils 1602 are aligned with an associated center of the main coil 1604. The sub-magnetic coils 1602 are located near the top and bottom of the associated main coil. The sub-magnetic coils $1602_1$, $1602_2$, $1602_3$, and $1602_4$ provide a corrective magnetic field to improve the shape of the magnetic field in the chamber. The main magnetic coils may overlap as shown in previous embodiments discussed herein.

Figure 18B:
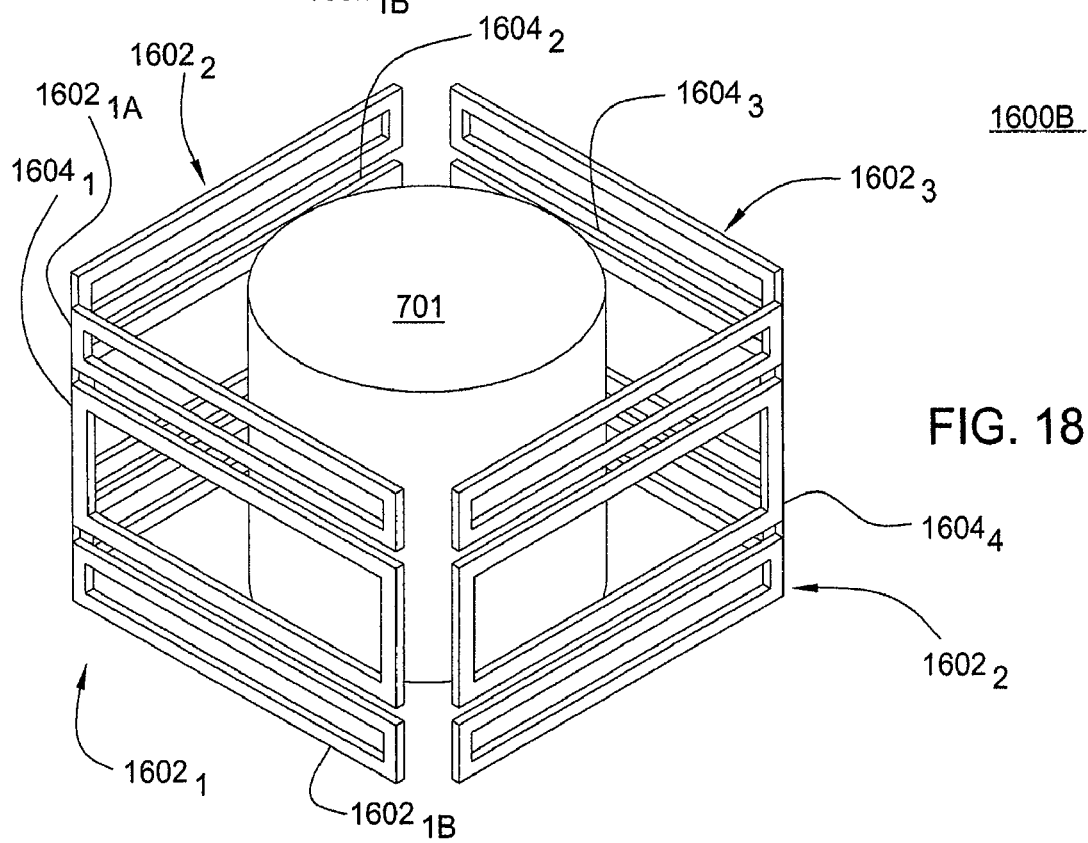

FIG. 18B is a perspective view of an embodiment of the invention having a coil configuration 1600B that is similar to FIG. 18A except the horizontal sub-magnetic coils 1602 are positioned outside the area circumscribed by the main magnetic coil 1604.

Figure 19A:
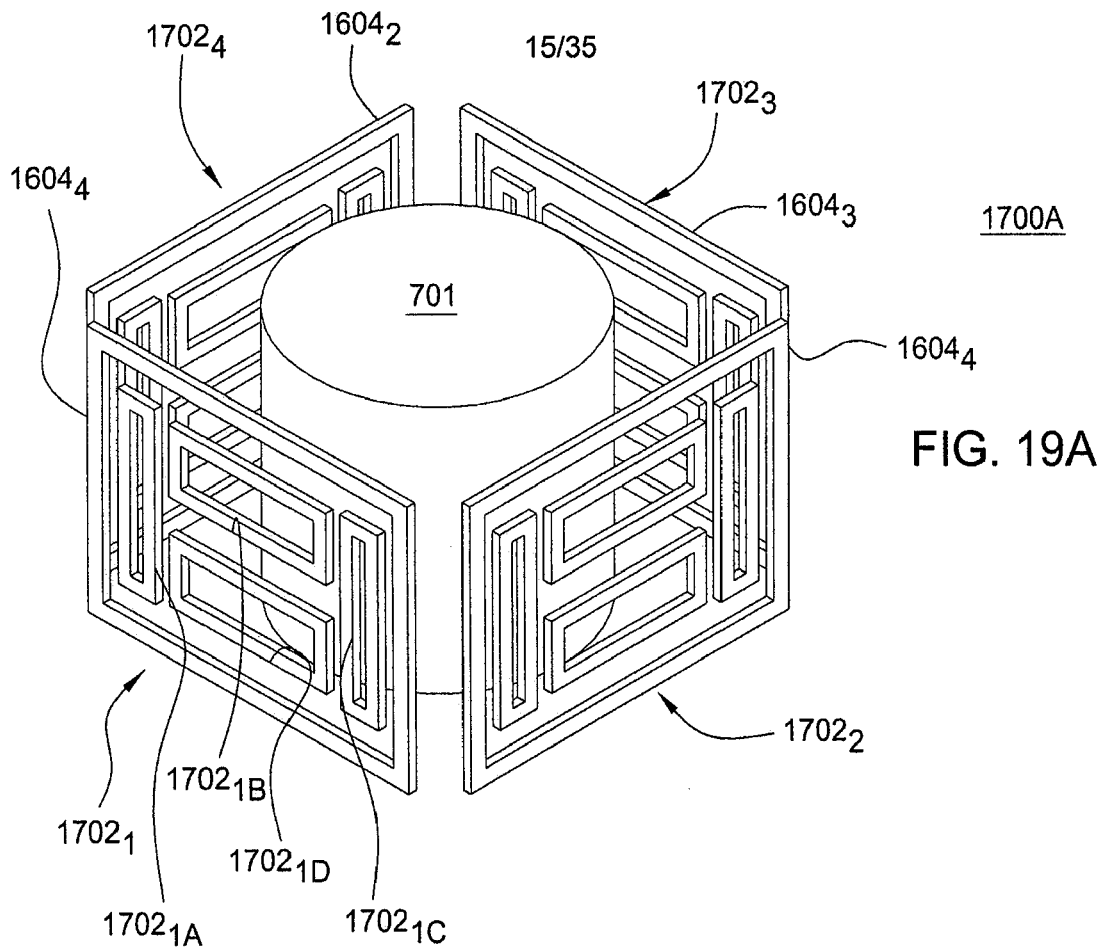
FIGS. 19A-19C depict perspective views of coil configurations having vertical and horizontal sub-magnetic coils in accordance with embodiments of the present invention.

FIG. 19A depicts perspective view of another embodiment of a magnetic coil configuration 1700A to circumscribe a process chamber 701. The magnetic coil configuration 1700 contains main magnetic coils $1604_1$, $1604_2$, $1604_3$, and $1604_4$ (collectively main magnetic coils 1604); and vertical and horizontal sub-magnetic coil sets $1702_1$, $1702_2$, $1702_3$, and $1702_4$ (collectively sub-magnetic coil pairs 1702). Each coil set, for example, contains two horizontal coils (e.g., coils $1702_{1B}$ and $1702_{1D}$) and two vertical coils (e.g., $1702_{1A}$ and $1702_{1C}$). By driving each of these twenty coils with separate currents provides for substantial control over the shape of the magnetic field produced in the chamber. The twenty coils also provides flexibility in producing a magnetic field shape that optimizes processing of the substrate. Alternatively, fewer than twenty currents could be used by connecting various sub-sets of coils in series, such as those shown in FIG. 7A. Also, alternatively, the main coils may overlap as shown in previous embodiments discussed herein.

Figure 19B:
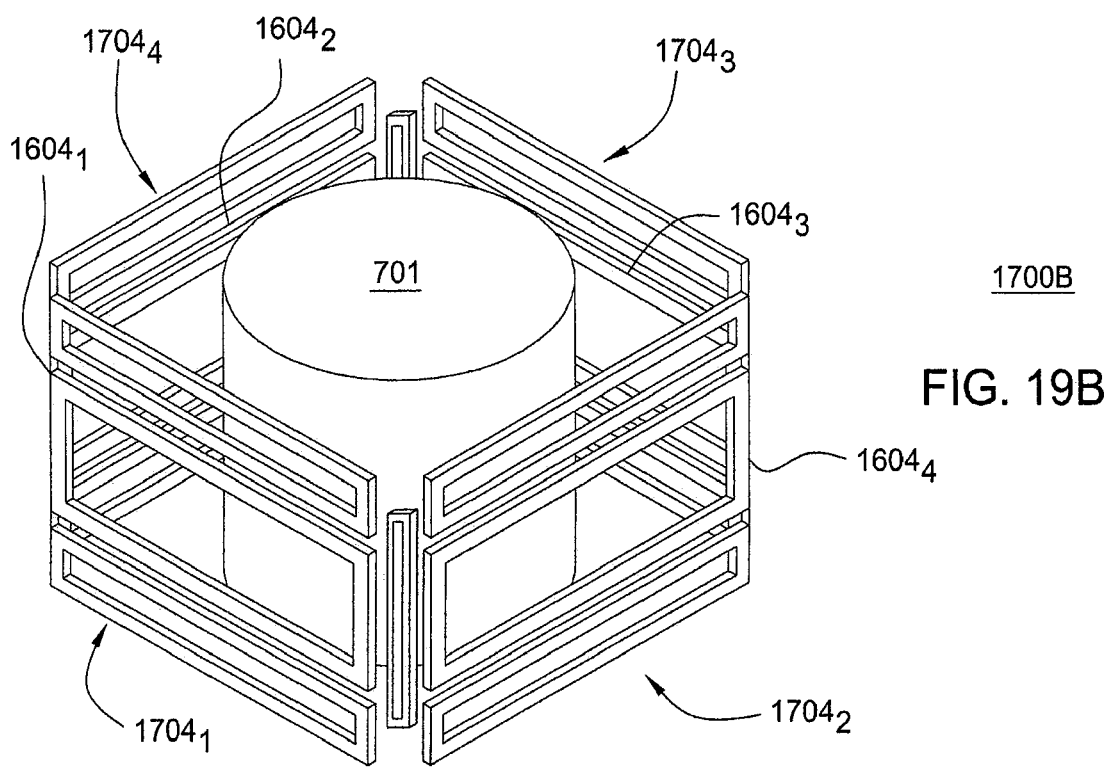

FIG. 19B depicts a perspective view of an embodiment of the invention having a coil configuration 1700B that is similar to FIG. 19A except the vertical and horizontal sub-magnetic coils 1704 are positioned outside the area circumscribed by the main magnetic coil 1604. In a further embodiment, not shown, a combination of coils within the main coils and outside the main coils is also contemplated.

Figure 19C:
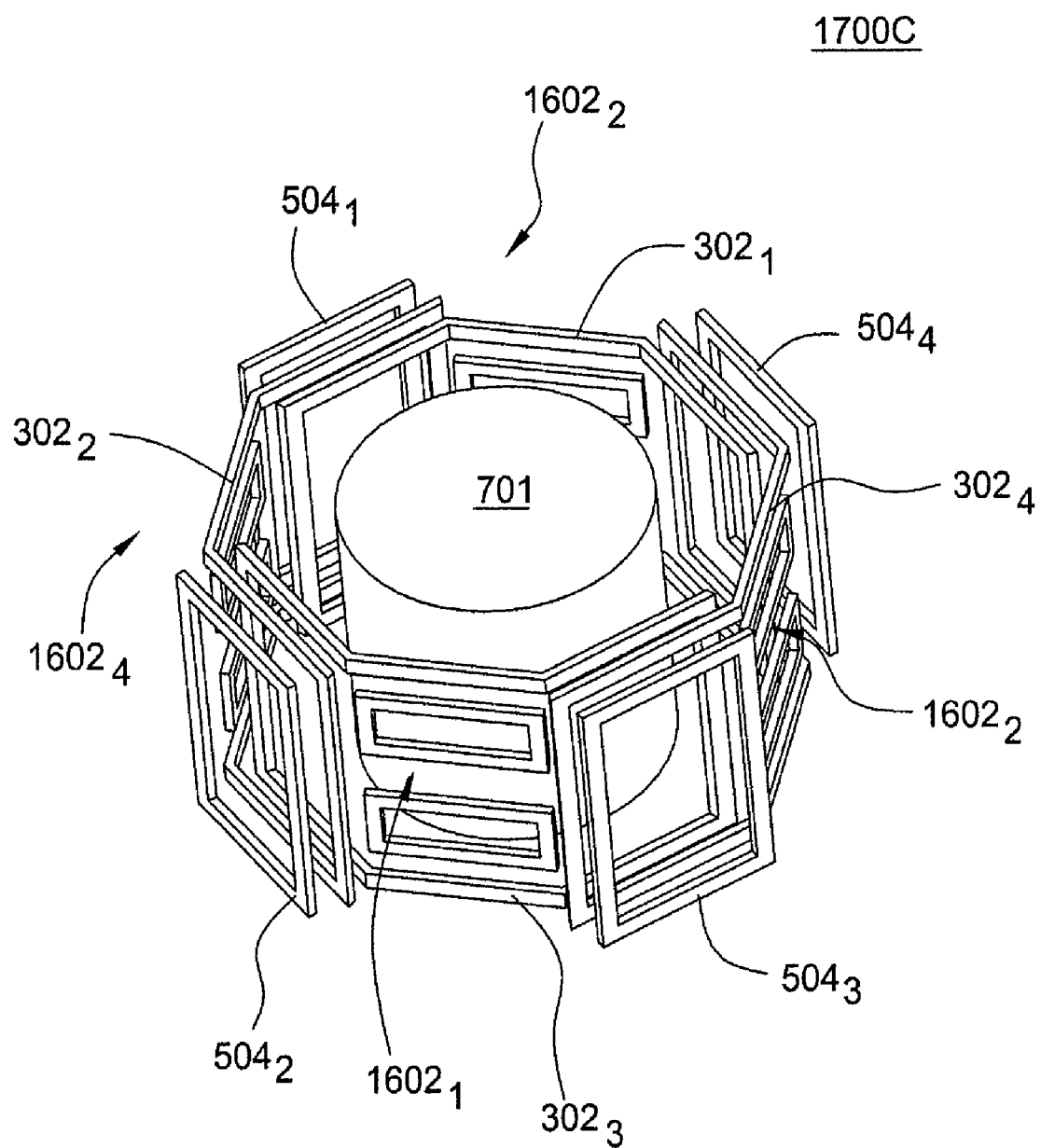

FIG. 19C depicts a perspective view of an embodiment of the invention having a coil configuration 1700C that combines the features of FIG. 5 and FIG. 18A. Specifically, the configuration 1700C comprises a chamber 701 surrounded by four main magnetic coils $302_1$, $302_2$, $302_3$, $302_4$, four vertical sub-magnetic coils $604_1$, $604_2$, $604_3$, and $604_4$ and eight horizontal sub-magnetic coils $1602_1$, $1602_2$, $1602_3$, $1602_4$. Each of the four vertical sub-magnetic coils $504_1$, $504_2$, $504_3$, and $504_4$ are positioned proximate the overlap of the main magnetic coils $302_1$, $302_2$, $302_3$, $302_4$. The horizontal sub-magnetic coils $1602_1$, $1602_2$, $1602_3$, $1602_4$ are positioned as coil pairs, where one coil in the pair is positioned near the top of the main coil and one coil in the pair is positioned near the bottom of the main coil. Sixteen currents may be used to independently drive each coil. Alternatively, the configuration may be driven with as few as four currents. To accomplish a four current system, the vertical sub-magnetic coils $502_1$, $502_2$, $502_3$, $502_4$ are double wound and five coils are wired in series to be driven by a single coil. For example, one-half of the double wound winding of coils $504_2$ and $504_3$ are connected in series with coil pair $1602_1$, and main coil $302_3$. The number of turns in each sub-magnetic coil is predetermined to best shape the magnetic field produced by the main magnetic coils.

Figure 20A:
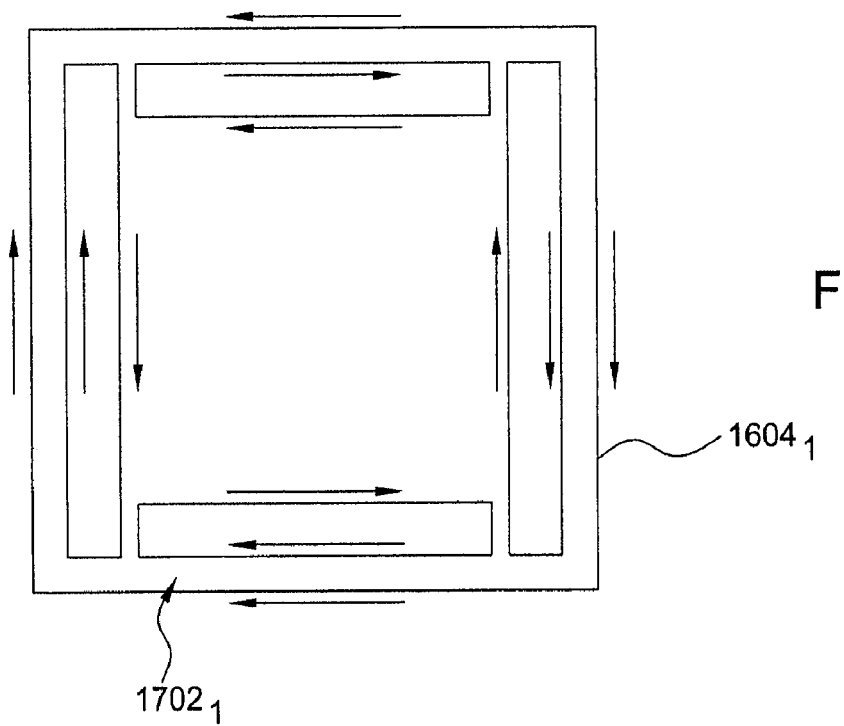
FIGS. 20A and 20B depict current flow through the coil configurations at FIGS. 19A and 19B.
Figure 20B:
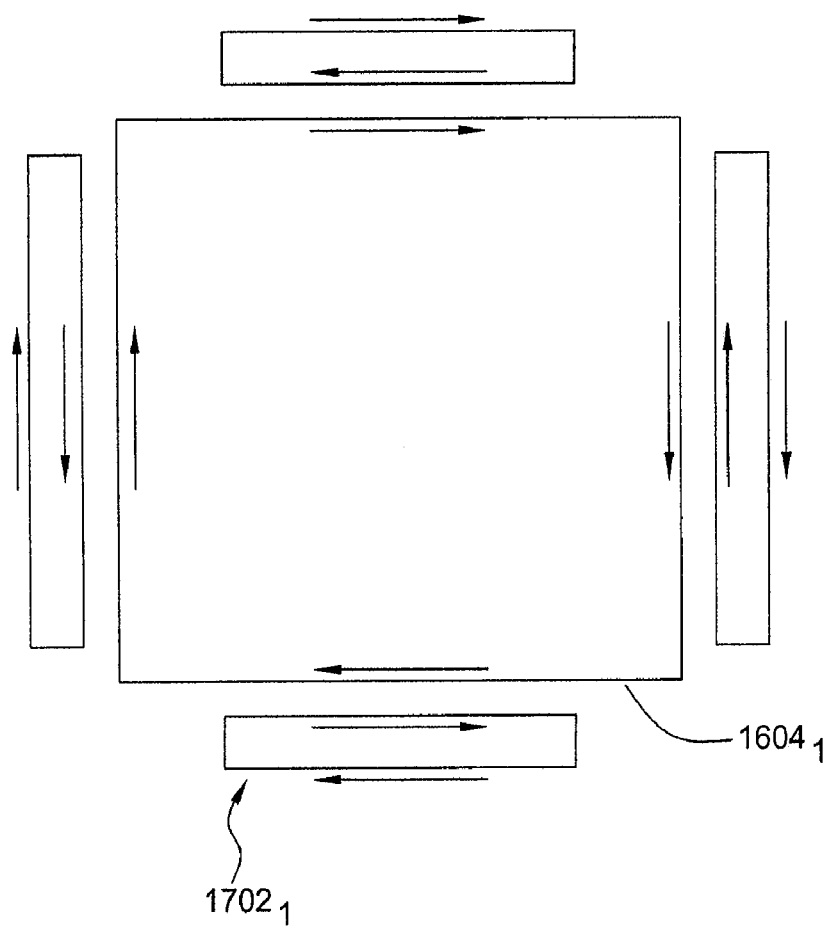

FIG. 20A depicts a side view of the embodiment of FIG. 19A where the sub-magnetic coils 1702 are positioned inside the main coil 1604. As such, the currents (shown as arrows) in the sub-magnetic coils 1702 are flowing in the same direction as the current in the main coil 1604, meaning that all of the currents for the individual coils are shown moving in the clockwise direction. Thus, all of the magnetic fields generated by these five coils are pointed in the same direction, which is into the page, and are thus vectorally additive. In addition, within the portion of each sub-coil directly adjacent to the single main coil depicted, the direction of current flow is the same as for the main coil. In contrast, FIG. 20B depicts a side view of the embodiment depicted in FIG. 19B, where the sub-magnetic coils $1704_1$ are outside the main magnetic coil $1604_1$. As in FIG. 20A, the currents in the sub-magnetic coils 1702 are flowing in the same direction as the current in the main coil 1604, meaning that all of the currents for the individual coils are shown moving in the clockwise direction. Thus, all of the magnetic fields generated by these five coils are pointed in the same direction, which is into the page, and are thus vectorally additive. However since the sub-coils are located outside of the main coil, within the portion of each sub-coil directly adjacent to the single main coil depicted, the direction of current flow is the opposite as for the main coil. From a design point of view, this means that, to produce the same corrective magnetic field over the workpiece, fewer turns of wire would be necessary to create the sub-magnetic coils 1604 of embodiment of FIG. 19A as compared to the sub-magnetic coils 1704 of the embodiment of FIG. 19B.

Figure 21:
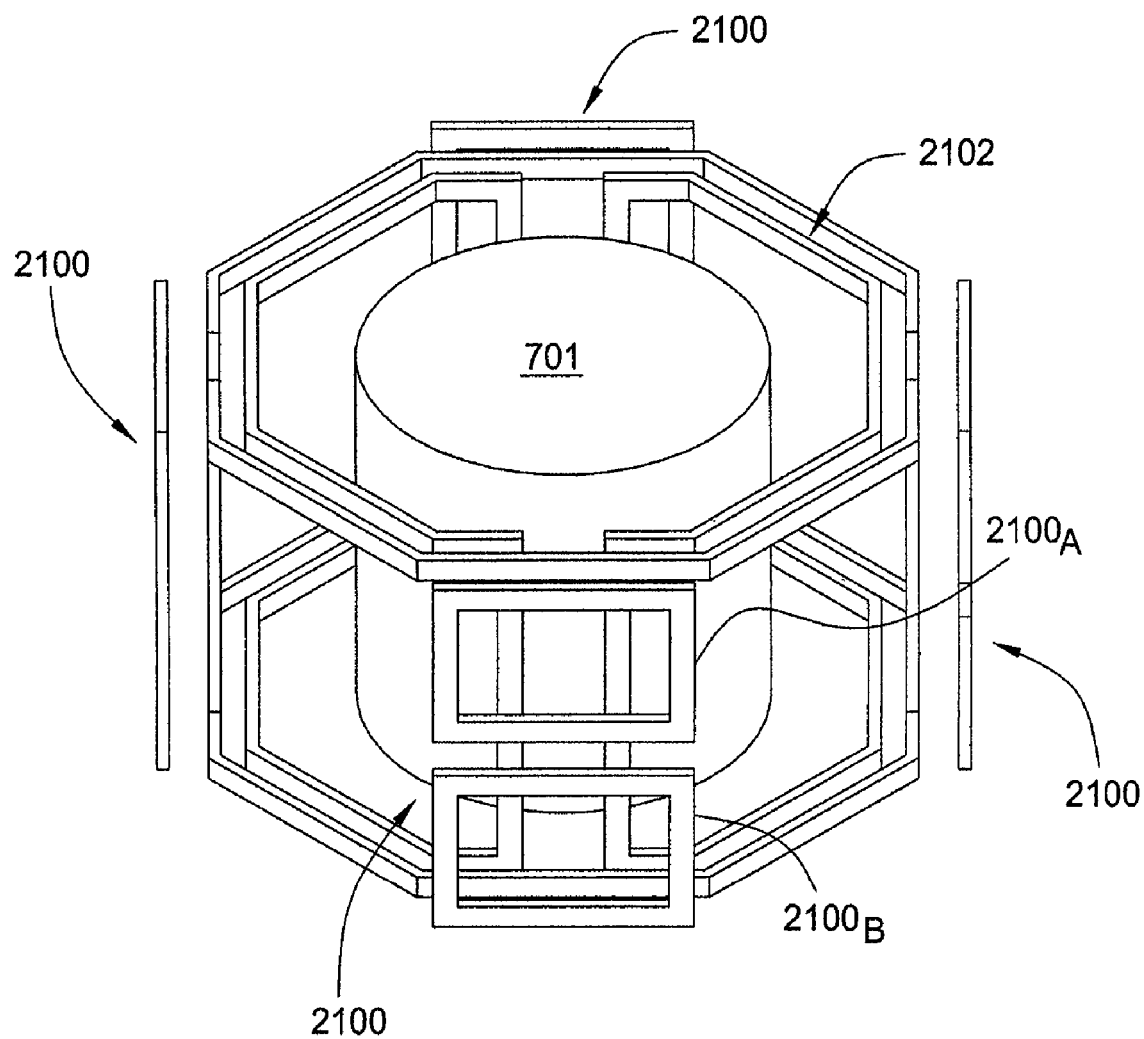
FIG. 21 depicts a perspective view of yet another magnetic coil configuration in accordance with the invention.

FIG. 21 depicts a perspective view of another embodiment of the present invention. In this embodiment, the sub-magnetic coils 2100 are divided into two coils 2100A and 2100B that are stacked vertically on four sides of the chamber 701. This embodiment depicts the main magnetic coils 2102 covering 180 degrees of the chamber circumference and having the centers of the main and sub-magnetic coils aligned. The division of the sub-magnetic coils 2100 into two portions enables twelve currents to be used to establish the magnetic field shape. The configurations of other main magnetic coils discussed herein may also be used. In this embodiment, twelve currents can be applied to achieve substantial improvement in the control of the magnetic field shape. Alternatively, the sub-magnetic coils can be wired in series with the adjacent main coils such that only four current supplies are used to drive the configuration, e.g., wire together the pair of sub-coils immediately above and below each other with the one main coils that they are adjacent to and share the same coil centerpoint.

Figure 22H:
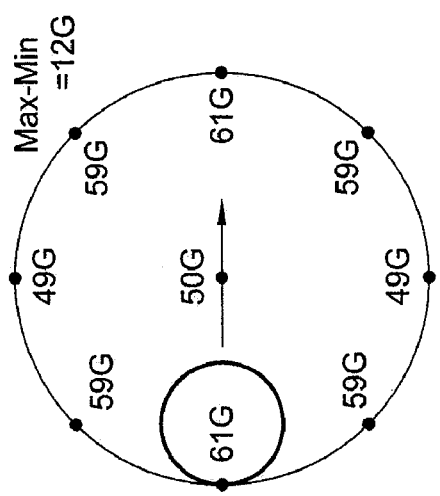

A number of simulations have been performed with respect to the various embodiments of the invention discussed above. FIGS. 22A-22K each depict a magnetic field gradient produced by the prior art as well as the foregoing embodiments of the invention. FIG. 22A depicts the magnetic field gradient produced by the embodiment of FIG. 2 where two adjacent main coils are energized. Note that the field gradient slopes from 85 G to 10 G. FIG. 22B depicts the magnetic field gradient produced by the embodiment of FIG. 3 when two adjacent main coils are energized. Here, the extended width coils reduce the high field strength side to 75 G, maintain the center field strength at 35 G and increases the low field strength side to 12 G. As such, the extended coils "flatten" the gradient of the magnetic field.

FIG. 22C depicts the field that is produced by the embodiment of FIG. 5 where two adjacent main coils and two opposite sub-magnetic coils are energized. Here, the gradient is further flattened and the high field side has a magnitude that is adjustable with the current magnitude to the sub-magnetic coils. FIG. 22D depicts the field strength produced by the embodiment of FIG. 11 having two adjacent main coils and two adjacent sub-magnetic coils energized. This embodiment produces a substantially uniform magnetic field with the high magnetic field value being adjustable with sub-magnetic coil current. FIG. 22E depicts the magnetic field produced by the embodiment of FIG. 19C having two adjacent main magnetic field coils and the four upper and lower sub-magnetic coils and the two opposite corner coils are energized. The magnetic field has a well defined gradient and the high value side is controllable with the sub-magnetic coil currents. Thus, the progression from FIG. 22A, to 22B, to 22C to 22E shows that the overlapping of the main coils plus the addition of the corner coils plus the addition of the upper and lower coils modifies the high field end from 85 G down to 60 G, while keeping the same 35 G in the center of the workpiece and while keeping the lower field strength between 10 G and 15 G. This reduction in the field strength at the high field end has been shown to improve both the instantaneous etch rate uniformity and the time-averaged (magnetic field rotated) etch rate uniformity. Further control of the field strength at the low field end is achieved by using currents in the second pair of main coils. In addition, the magnetic field value at the high field end of the workpiece is fully controllable (e.g., 85 G, 70 G, 60 G, 55 G, etc.) by controlling the relative currents in each of the coils to achieve the desire field shape.

Figure 1:
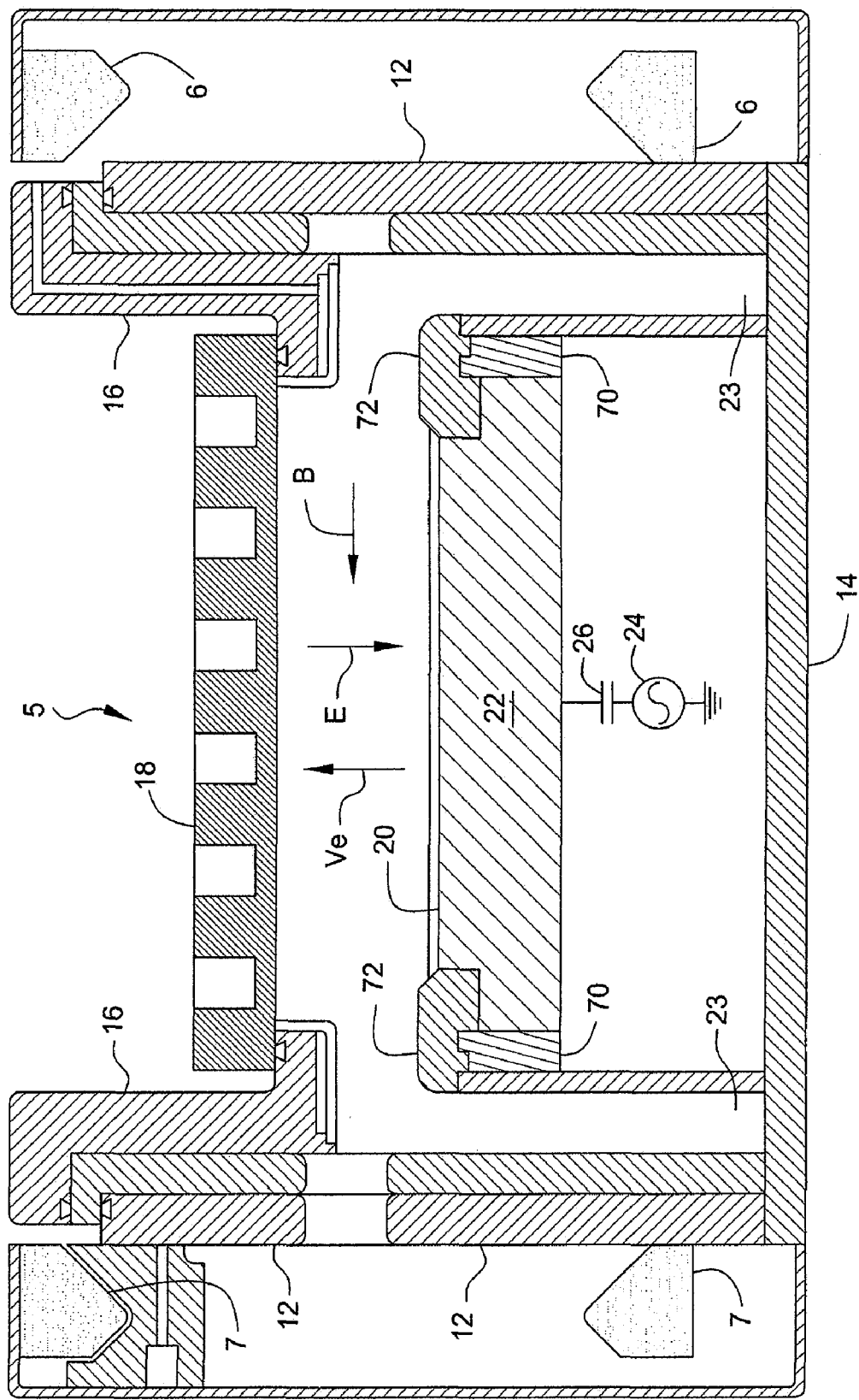
FIG. 1 is a side cross-sectional view of a conventional dry etching chamber.
Figure 2:
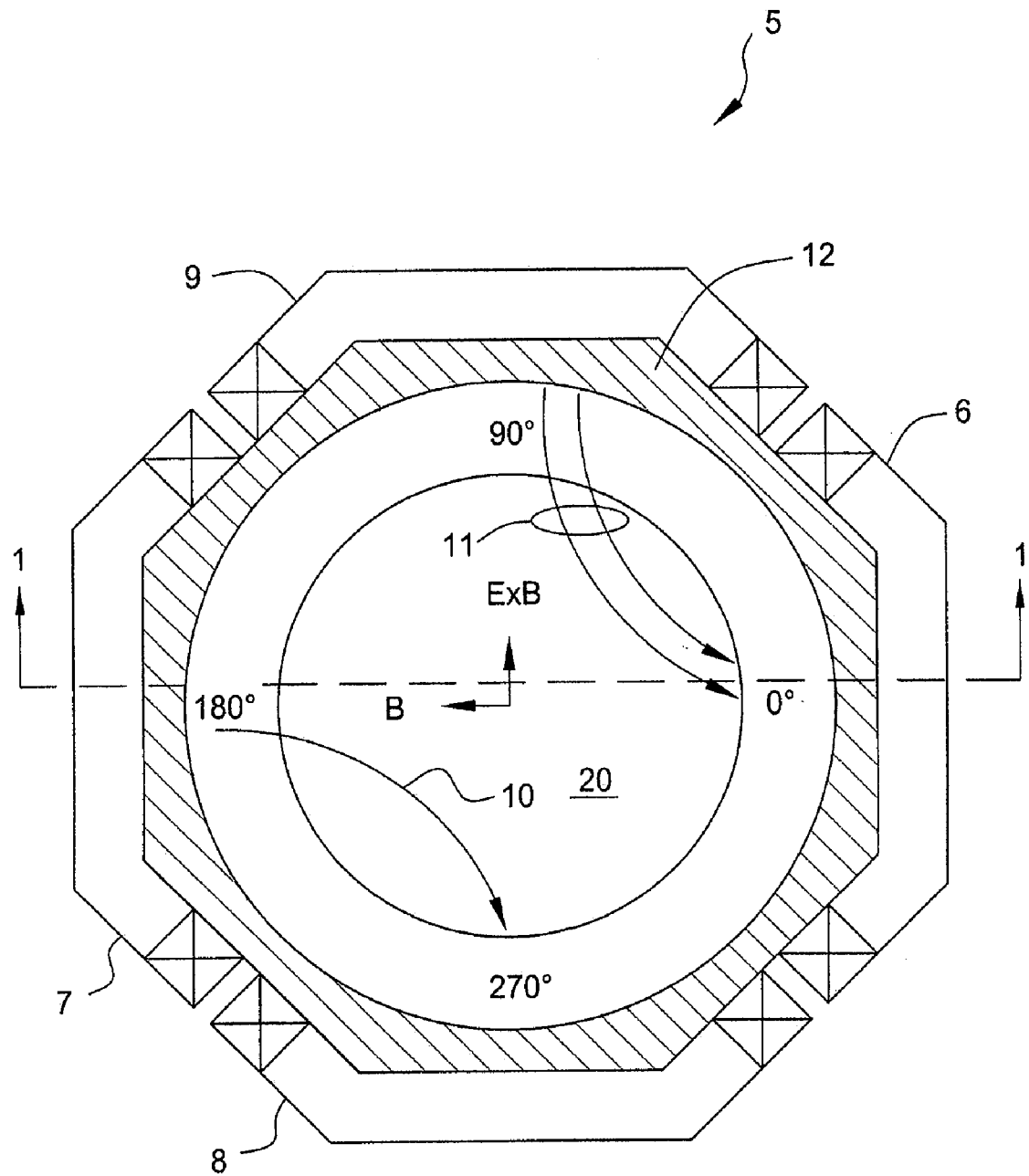
FIG. 2 is a top cross-sectional view of a magnetic field generator of the dry etching chamber shown in FIG. 1.
Figure 22K:
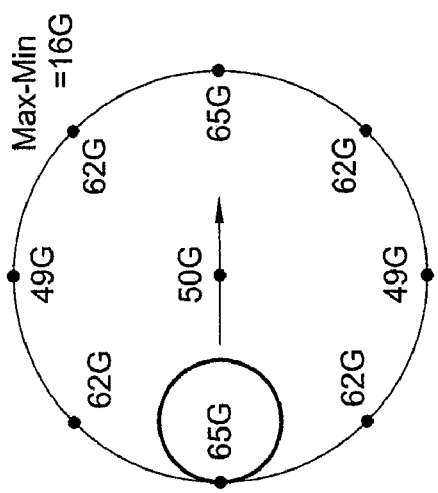
Figure 22G:
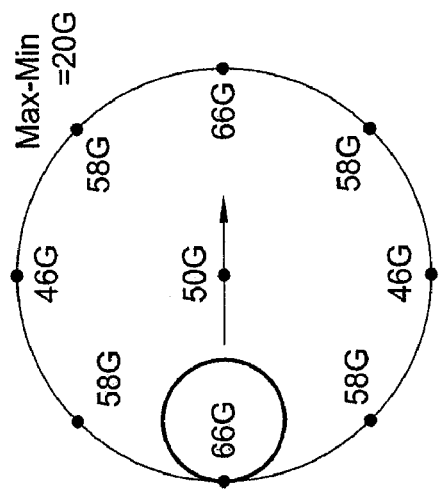
Figure 22J:
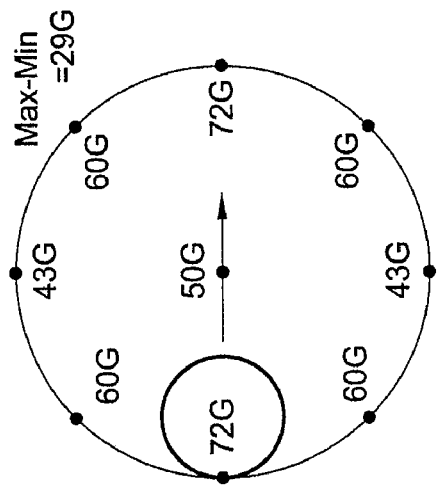
Figure 22F:
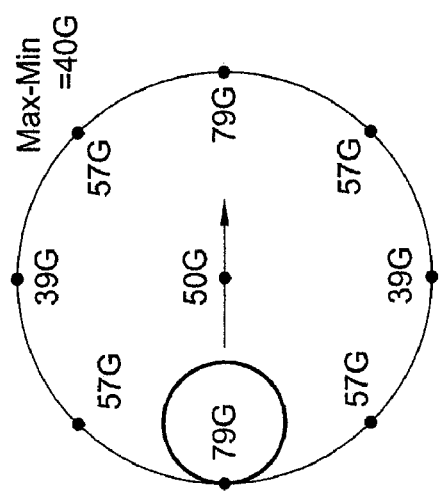
Figure 22I:
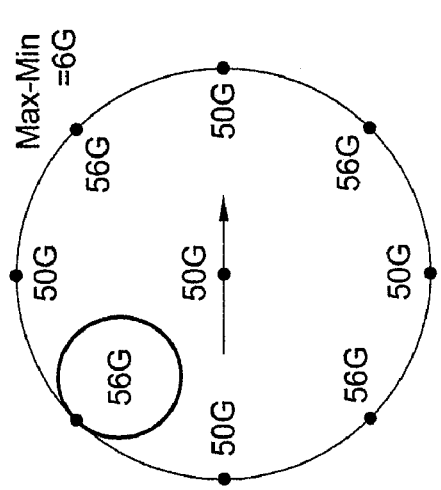

FIG. 22F depicts a magnetic field that is generated by the prior art of FIG. 2 where two, opposite coils are energized. Note that that the magnetic field magnitude is not very uniform across the substrate, i.e., the field magnitude varies from 79 G to 39 G, a range of 40 G for a field strength of 50 G at the center of the substrate. FIG. 22G depicts the magnetic field that is produced by the embodiment of FIG. 3 where two, opposite extended width coils are energized. The uniformity of the magnetic field is improved over the magnetic field of FIG. 22F. FIG. 22H depicts the magnetic field produced by the embodiment of FIG. 5 having two, opposite main coils and four sub-magnetic coils energized. The result is an improved uniformity of the magnetic field. When upper and lower coils are added as in the embodiment of FIG. 19C and these coils are energized, the result is the magnetic field of FIG. 22I. The magnetic field is now almost completely uniform. Thus, the progression from FIG. 22F, to 22G, to 22H to 22I shows that the overlapping of the main coils plus the addition of the corner coils plus the addition of the upper and lower coils improves the uniformity of the field strength, from a range of 40 G to a range of 6 G, all for a center field strength of 50 G. Further improvement over the results could be obtained by further modification of the shapes and locations of each of the coils, the addition of more coils, and the fine tuning of the currents energizing all of the appropriate coils.

FIG. 22J depicts the magnetic field produced by the embodiment of FIG. 11 where all four of the 180 degree main coils are energized. This embodiment shows improvement over the magnetic field of the prior art (FIG. 22F). When the sub-magnetic coils are also energized, the magnetic field uniformity is further improved as shown in FIG. 22K.

Magnetic Field Rotation

In a semiconductor chamber, the plasma that performs the etch and/or the deposition processes is made up of neutral species and charged species. The charged species are reactive to forces that occur on a timescale shorter than a microsecond. RF generators in the semiconductor industry often use RF frequencies to power the plasma that are in the frequency range of 1 MHz to 200 MHz, which gives the period of oscillation to be in the range of 5 nanoseconds to 1 microsecond. However, the total period of magnetic field rotation is generally much longer. For example, in one embodiment, the total period of magnetic field rotation may be about 4 seconds. Changes in the currents running through the electromagnetic coils are measured on the order of milliseconds following a change in the control signal to the current supply. Changes in the RF matching circuit (whether a tuning-match-fixed-frequency or a tuning-frequency-fixed-match) are on the order of 100's of milliseconds, following a change made to the plasma impedance. Changes in the magnetic field shape to accomplish rotation can be made in milliseconds, but the RF tuning circuit reacts over 100's of milliseconds. As such, the plasma impedance and the RF tuning circuitry will be mismatched for a period of time on the order of 100's of milliseconds while the RF tuning control circuitry reacts and determines the appropriate new match control settings.

A mismatch between the plasma impedance and the RF tuning circuitry results in an increase in the reflected power. In addition, given a four second rotation scheme, it has been found that the RF tuning circuitry may spend more than 10% of the time with higher-than-desired reflected power, thereby considerably decreasing the total amount of energy transferred to the plasma per magnetic field rotation period. Moreover, for a circuitry with a tuning-match-fixed-frequency configuration, the mechanical parts of the tuning-match can wear out much faster if the accumulative mismatch time and magnitude are substantial.

Therefore, not only is selecting the proper shape of the magnetic field important to improve the etch-rate uniformity, but so is selecting the proper transition of the magnetic field important to minimize the impact of the magnetic field rotation on the RF matching and thus maximize the total energy delivered to the plasma per magnetic field rotation period. Accordingly, during the rotation of the magnetic field, the DC current waveforms that run through the electromagnets may be controlled in order to help the RF tuning circuitry adjust more quickly to the changes in plasma impedance caused by the rotating magnetic field.

The methods of rotating a magnetic field disclosed herein define the magnetic field control into two basic components: (1) the magnetic field shape in which the magnetic field usually spends most of its time (referred to hereinbelow as a "shape" or "primary shape") and (2) the transition (or multiple transitions) to the next magnetic field shape (referred to hereinbelow as a "transition"). For example, in embodiments having four magnetic coils or a symmetry that simplifies into essentially four magnetic coils (such as shown in FIGS. 1, 2, 3, 4A, 8A, 11, 18A, 18B and 21), the primary magnetic field shape may start at an arbitrary orientation, illustratively referred to as 0 degrees. The control of the hardware provides a transition magnetic field shape, followed by the primary magnetic field shape again, rotated 90 degrees. As such, a complete rotation can be written in abbreviated form as:

Shape(0°)→Transition(0-90°)→Shape(90°)→Transition(90-180°)→Shape(180°)→Transition(180-270°)→Shape(270°)→Transition(270-0°)→return to Shape(0°)

Therefore, by defining the shape at 0 degrees and by defining the transition from 0 degrees to 90 degrees, the whole of the rotation is described. It is contemplated that rotation may be controlled either clockwise or counterclockwise and that multiple transitions may be provided between the primary magnetic field shapes.

As used herein, the number of coils referred to in an embodiment can be determined by the azimuthal angles at which the centerpoints of the coils are disposed in relation to a central interior position of the entire coil arrangement (e.g., the center of a process chamber about which the coils are disposed). For example, in the four coil arrangement depicted in FIG. 3, the centerpoints of the coils $302_{1-4}$ may be defined to be at 0, 90, 180 and 270 degrees with respect to the center of the process chamber. In addition, although the embodiment of FIG. 11, depicts eight coils ($902_{1-4}$ and $906_{1-4}$), each respective coil 902 and 906 have a centerpoint along the same angle with respect to the center of the process chamber. Therefore, the centerpoints of the coils $902_{1-4}$ and corresponding coils $906_{1-4}$ may also be defined to be at 0, 90, 180 and 270 degrees. Thus, this would also be considered a four-coil embodiment as used herein as would use a four-coil rotation scheme. However, an eight coil embodiment such as depicted in FIG. 5 has centerpoints of 0, 45, 90, 135, 180, 225, 270 and 315 degrees with respect to the chamber center. From the point of view of a current driver that is rotating them, this would be an eight-coil arrangement and use an eight-coil rotation scheme.

For ease of understanding, the higher and lower currents supplied to the coils are described using a simplified notation, with the higher current normalized to be +/−1 and the lower current described as a percentage of the higher current (i.e., a number less than one). Thus, the shape of the magnetic field could be described by reference to the currents supplied to the coils. For example, in a chamber having four coils, or a four coil symmetry, the shape of the magnetic field could be described as [+1, −1, −R, +R], denoting the relative currents in [coil #1, coil #2, coil #3, coil #4], respectively. The positive/negative sign indicates the orientation of the magnetic field. For a specific coil, a positive current means that the magnetic field points from the coil into the semiconductor processing chamber, while a negative current means that the magnetic field points out of the chamber (for example, if a magnetic compass were placed on the pedestal in the center of the chamber, whose needle points north under normal circumstances, then a positive current causes the needle to point away from a single energized coil while a negative current would cause the needle to point towards the coil). Regarding the coil arrangement, the numbering of the coils is done in the clockwise direction as seen from the top of the chamber.

As the above paragraph is merely a notational system for easily referring to the methods described herein, it is contemplated that other notational systems or variants of the above could also be used to describe the magnetic field rotational methods of the present invention (such as used below with respect to FIGS. 32 and 35). For example, the value of R could be greater than 1, or the currents need not be normalized, the coils may be numbered in any fashion, and the particular coils may be wound such that a positive current causes the magnetic field to point out of the process chamber, and the like, or any combination thereof.

For example, for the original 4-coil embodiment of the prior art, as shown in FIG. 2, the four coils are typically operated by having two adjacent pairs of coils at a higher current (e.g., coils 6, 8) and the other two adjacent pairs of coils (e.g., coils 7, 9) at a lower current. FIG. 23 depicts a standard rotational method for a conventional 4-coil chamber similar to the one shown in FIG. 2. In producing any shape, the amount of B-field going into the chamber is the sum of all of the positive numbers, while the amount of B-field going out of the chamber is the sum of all of the negative numbers. In the embodiment depicted in FIG. 23, the amount of B-field going into the chamber is 1+R (+1 for coil #1 plus +R for coil #4). Likewise, the amount of B-field going out of the chamber is −(1+R). In the transition steps, the amount of B-field going into the chamber is +1 (+1 for coil #1 plus zero for coil #4), and the amount of B-field going out of the chamber is −1. As the values of R increase, the difference in magnitude in the magnetic field between shapes and transitions also increases. Accordingly, it has been historically observed that the impact on the RF tuning circuitry mismatch during and immediately after the transition step, as caused by both the change in current settings and by the difference in total magnetic field produced between the shape (1+R) and the transition (1), becomes progressively more severe as values of R increase.

Figure 24:
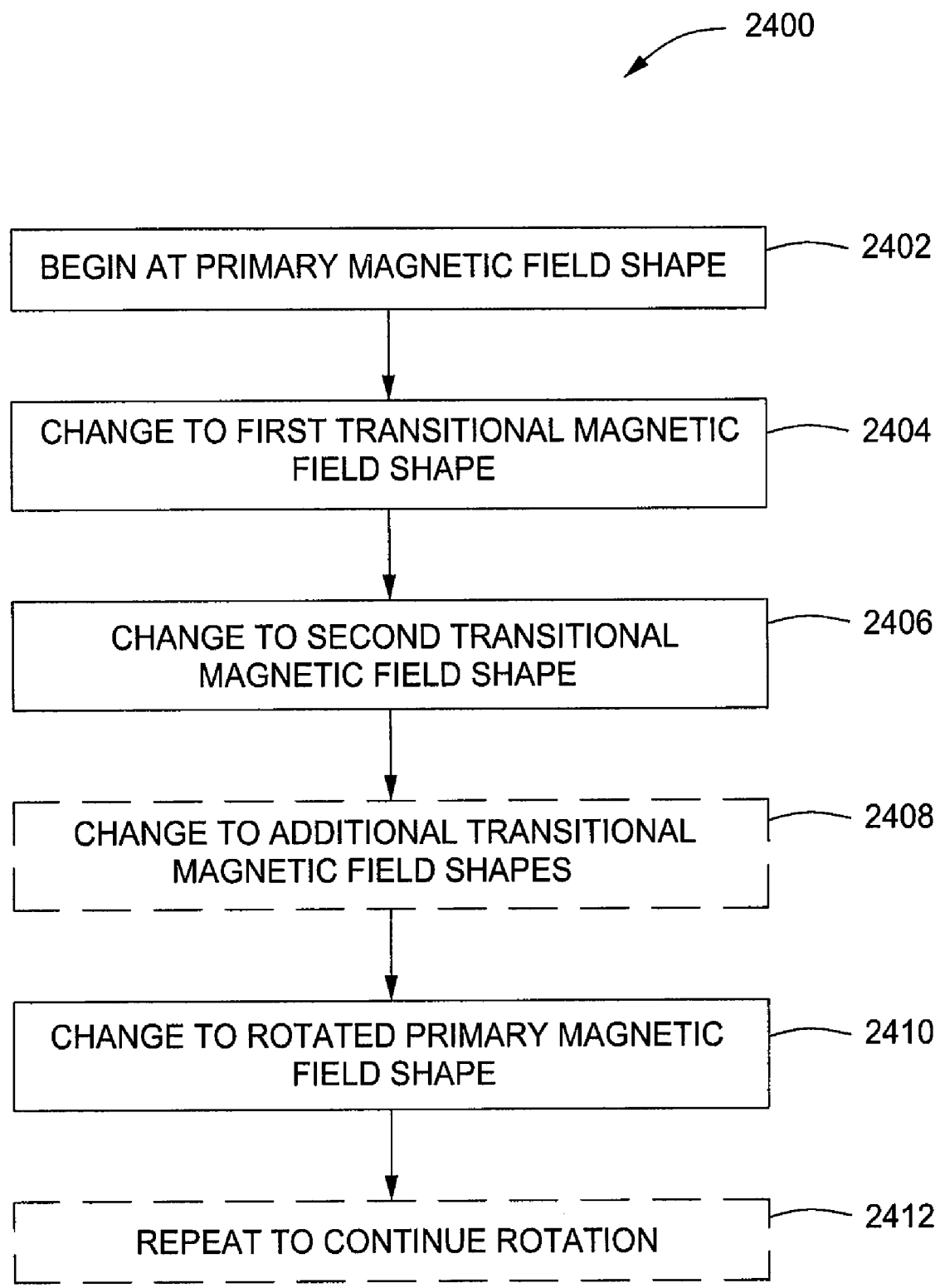
FIG. 24 depicts a simplified flow diagram of a method for rotating a magnetic field in accordance with one embodiment of the present invention.

Accordingly, methods of rotating a magnetic field are provided herein that overcome the above-referenced problems of the prior art. Specifically, FIG. 24 depicts a simplified flow diagram of one embodiment of a method 2400 for rotating a magnetic field in a semiconductor process chamber. The method 2400 begins at step 2402 where a primary magnetic field shape is defined. Next, at step 2404, the magnetic field is changed to a first transitional magnetic field shape. In one embodiment, the change to the first transitional magnetic field shape is accomplished by changing the currents applied to the various coils of the chamber. At step 2406, the magnetic field is changed to a second transitional magnetic field shape. Optionally, at step 2408, the magnetic field may be changed to additional transitional magnetic field shapes until finally, at step 2410, the magnetic field is changed to the rotated primary magnetic field shape. In one embodiment, the rotated primary magnetic field shape may be the primary magnetic field shape rotated by 90 degrees, due to the four-fold symmetry of the chamber and the coils. It is contemplated that the rotated primary field shape may be different than the primary magnetic field shape rotated by 90 degrees. At step 2412, steps 2404 through 2410 may be repeated as necessary to continue rotating the magnetic field. By providing multiple transitional steps between each primary magnetic field shape, the method 2400 advantageously allows time for the RF tuning circuitry to match the new plasma impedance caused by the change in the magnetic field prior to the next change in the magnetic field. Therefore, the RF tuning circuitry spends less time in a mismatched condition and, for RF tuning circuitry with mechanical tuning parts, has reduced wear.

Optionally, the total magnetic field strength going into and out of the chamber throughout the method may be held constant by selection of the currents applied to the various coils. By maintaining a substantially constant magnetic field strength throughout each step of the transition, the impact of changes in magnetic field strength on the plasma is minimized, further reducing the strain on the RF tuning circuitry. Alternatively or in combination, the method 2400 may provide for only a single coil to move through a zero current point (i.e., transitioning from a positive to a negative current or vice-versa) between any subsequent steps. By controlling the coils that pass through zero current to have their moments of zero current staggered in time, the magnitude and effect of the changes in the magnetic field on the plasma is further reduced.

The above method 2400 reflects two advantageous guidelines for rotating a magnetic field in a process chamber. Firstly, the amount of magnetic field going into (and out of) the chamber at any given time is roughly the same. Thus, each primary shape of the magnetic field and transition between the primary shapes has approximately the same magnetic field magnitude during each step. Secondly, each large coil (e.g., all four coils of a four-coils chamber and the four large coils of an eight-coil chamber) does not transition through zero current at the same time, meaning between the same two steps. Thus, the method 2400 advantageously minimizes the changes in the magnitude of the magnetic field and effect of those changes on the plasma. Alternatively, in some embodiments, the magnitude of the magnetic field during rotation may be controlled to be within 20 percent of the maximum magnitude applied, or in some embodiments, within 10 percent. As discussed above, minimizing the variation in the magnitude of the magnetic field advantageously facilitates minimizing the effect on the plasma as well as on the RF circuitry employed by the process chamber.

Embodiments of the above method, and variants employing one or more of the guidelines disclosed above, may be utilized in both conventional process chambers as well as the process chambers disclosed herein or future developed process chambers having electromagnets as discussed herein. The magnetic fields being controlled and rotated may be uniform, sloped, or non-uniform. For chambers having four main magnetic coils and configurations that effectively use four coil transitions, the logic behind the transition schemes (time for RF circuitry to tune, incremental steps, zero crossings, B-field magnitude during transitions, etc.) and use of the above-disclosed guidelines makes for magnetic field rotational methods that overcome the problems of conventional rotational methods. The primary magnetic field shape may be defined using the principles and notation described above. The following provides a few illustrative examples of specific embodiments of the above method 2400.

FIG. 25 depicts a table showing a magnetic field rotation sequence 2500 suitable for use in a process chamber having four coils or effectively four coils, such as, but not limited to, the chambers depicted in FIGS. 1, 2, 3, 4A, 8A, 11, 18A, 18B and 21. Each magnetic field shape or transition in the sequence 2500 is defined by the currents applied to the four coils (or sets of coils) of the process chamber (identified in FIG. 25 as coil #1, #2, #3, and #4). As described above, the currents are shown in a normalized notation using the number one to represent the highest current and the letter R to represent the lower current as a percentage of the higher with respect to the primary magnetic field shapes (shown in FIG. 25 as Shape 0 degrees, 90 degrees, 180 degrees, and 270 degrees).

The sequence 2500 comprises two transitions between each primary shape of the magnetic field (labeled as Transition A, B for each primary shape). In addition, the transition of any coil through zero current (i.e., from a positive current applied to a coil to a negative current applied to the same coil, or vice versa) is staggered throughout the sequence to avoid any two coils passing through zero current at the same time. For example, from row 1 to row 2 (Shape 0 degrees to Transition A, 0 degrees), Coil #4 is the only coil to pass through zero current (from +R in row 1 to −(0.5*R) in row 2). When continuing from row 2 to row 3, Coil #2 is the only coil to pass through zero current (from −(0.5*R) in row 2 to +R in row 3. Thus, the impact on the magnetic field from a coil passing through zero current is minimized by only allowing one coil to pass through zero current at a time throughout the sequence 2500.

In addition, the sum of the positive currents and the sum of the negative currents applied to form each primary shape or transition are held constant. For example, in any given row of the sequence 2500 (i.e., any shape or transition), the sum of the positive current is (1+R) and the sum of the negative current is −(1+R). Thus, the magnitude of the magnetic field going into and out of the chamber for any given row is equal. Moreover, as the magnitude of the currents applied in each row is equal to +/−(1+R), the magnitude of the currents throughout the rotational sequence 2500 is also constant. Thus, the magnitude of the magnetic field going into and out of chamber is held approximately constant.

In the embodiment depicted in FIG. 25, the currents for forming the primary shapes of the magnetic field are each provided for 0.9 seconds, with each transition having a duration of 0.05 seconds. These times are illustrative only and it is contemplated that other times may be used as well. For example, the transition time should at least be sufficiently lengthy to allow the RF tuning circuitry to fully adjust to the new conditions after each transition step. If a particular matching network on a process chamber responds more quickly, shorter times may be used. Conversely, if the response is slower, longer times may be necessary to fully achieve the benefits of the rotational methods described herein.

It is contemplated that other transition schemes following the guidelines of the rotational method disclosed herein could also be utilized. For example, FIG. 26 depicts a table showing a magnetic field rotation sequence 2600 suitable for use in a process chamber having four coils or a four-coil symmetry. The table depicted in FIG. 26 is similar to that described in FIG. 25, above, with the exception of the additional transitions provided between the primary shapes (as indicated by Transitions A, B, C, D, and E between each primary shape). In any of the aforementioned rotation sequences, or any other rotation sequence that follows the above-disclosed guidelines, it is contemplated that other numbers of transitions, other time periods for the primary shapes and the transitions, other R values, and/or other relative current values may be provided while still following the general guidelines outlined above.

Figure 28A:
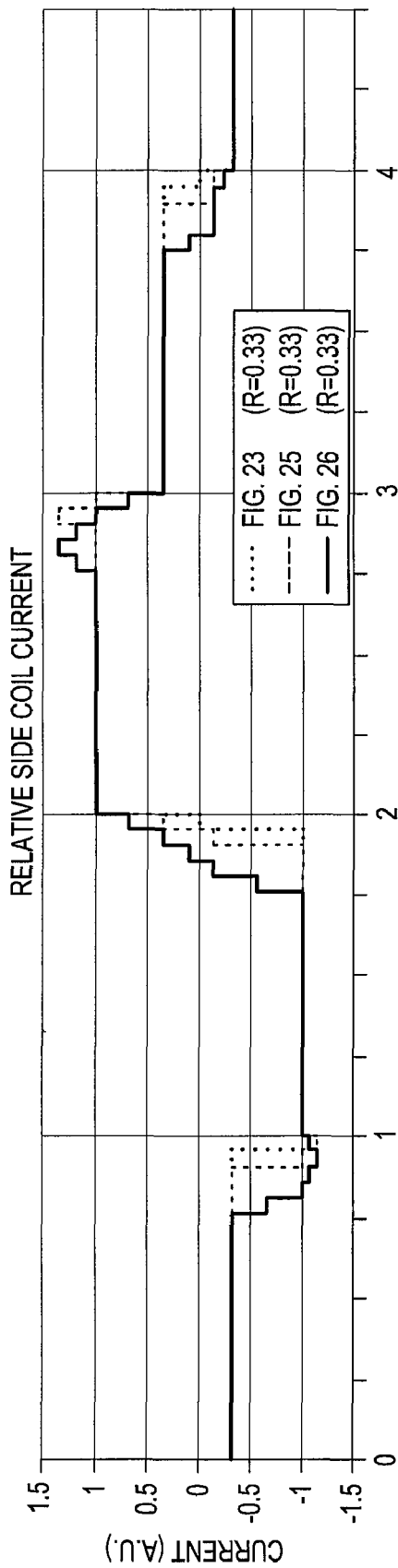
FIGS. 28A and 28B depict graphs of relative coil currents over time throughout various rotational methods.
Figure 28B:
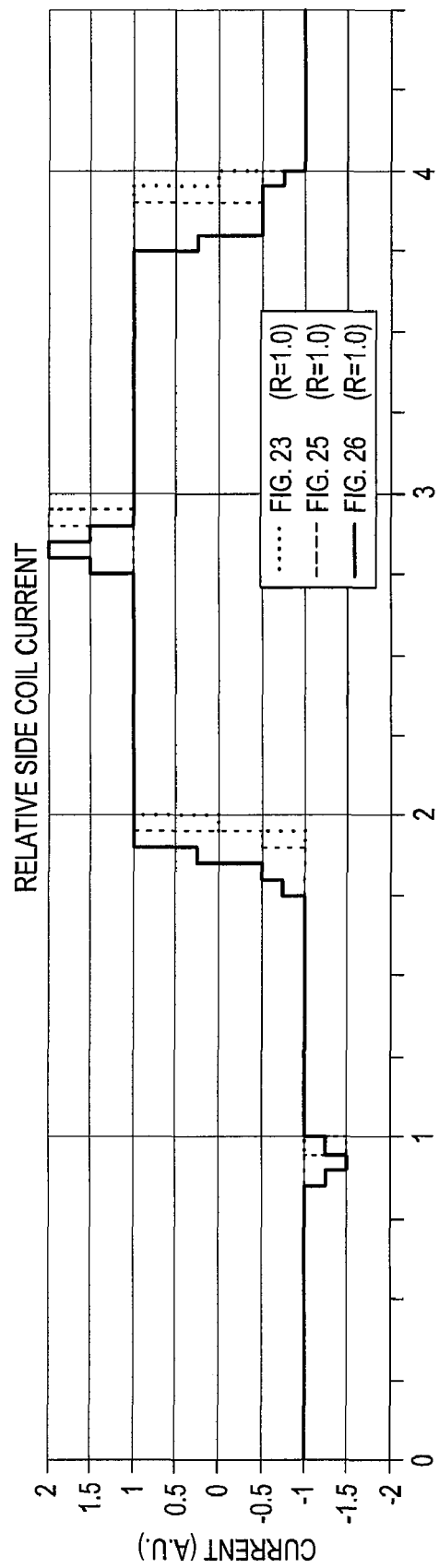

FIGS. 27A-C respectively depict schematic diagrams of magnetic fields in a four coil chamber throughout the rotational methods described above with respect to FIGS. 23, 25 and 26. Specifically, FIG. 27A depicts a conventional magnetic field rotational sequence (through a one-quarter, or 90 degree, rotation) similar to that shown in FIG. 23. As depicted in FIG. 27A, a first primary shape 2702 is rotated 90 degrees to a rotated primary shape 2706 through a single transition 2704. FIG. 27B depicts a magnetic field rotational sequence (through a one-quarter, or 90 degree, rotation) in accordance with the present invention similar to that shown in FIG. 25. As depicted in FIG. 27B, a first primary shape 2712 is rotated 90 degrees to a rotated primary shape 2716 through two transitions 2714$_A$ and 2714$_B$. FIG. 27C depicts a magnetic field rotational sequence (through a one-quarter, or 90 degree, rotation) in accordance with the present invention similar to that shown in FIG. 26. As depicted in FIG. 27C, a first primary shape 2722 is rotated 90 degrees to a rotated primary shape 2726 through five transitions 2724$_A$, 2724$_B$, 2724$_C$, 2724$_D$, and 2724$_E$. In the Figures, dotted lines indicate magnetic fields of lesser strength and are illustrative only to show that the relative strength of the magnetic fields being applied FIGS. 28A and 28B depict graphs comparing the relative coil currents applied over time for a single rotational sequence for each of the rotational sequences depicted in FIGS. 23, 25, and 26. The graph in FIG. 28A compares the rotational sequences depicted in FIGS. 23, 25, and 26 where a low value of R is used (R=0.33). The graph in FIG. 28B compares the rotational sequences depicted in FIGS. 23, 25, and 26 where a high value of R is used (R=1). As can be seen from both of FIGS. 28A and 28B, the number of transitions between the primary magnetic field shapes may be increased to facilitate a reduced magnitude of each change in the magnetic field, in addition, the currents applied may be adjusted to minimize changes in magnetic field magnitude during the rotational sequence, moreover, the total amount of time to make the transitions may be increased and/or adjusted to facilitate allowing the tuning circuitry and/or other components directly or indirectly affected by the magnetic field change to adjust to the change. Each of these principles, alone or in combination, thereby advantageously improve the plasma stability in the chamber throughout the rotational cycle.

The shape of the magnetic field may further be controlled by the selection of the relative currents applied to the coils (e.g., by controlling the value of R). For example, by providing a low value of R, such as less than or equal to approximately 0.33, a sloped magnetic field may be created and rotated using any of the inventive rotational sequences disclosed above. Alternatively, by providing a high value of R, such as approximately 1, a flat magnetic field may be created and rotated using any of the inventive rotational sequences disclosed above. The specific value of R chosen for a given process may depend upon multiple factors, such as the process pressure, the RF power on the cathode, the process gas selection, the design of the process kit immediately next to the edge of the wafer, and the like. Additional details regarding the selection and use of particular R values are described in U.S. Pat. No. 6,113,731, issued Sep. 5, 2000, to Shan, et al., which is hereby incorporated by reference in its entirety.

Figure 29:
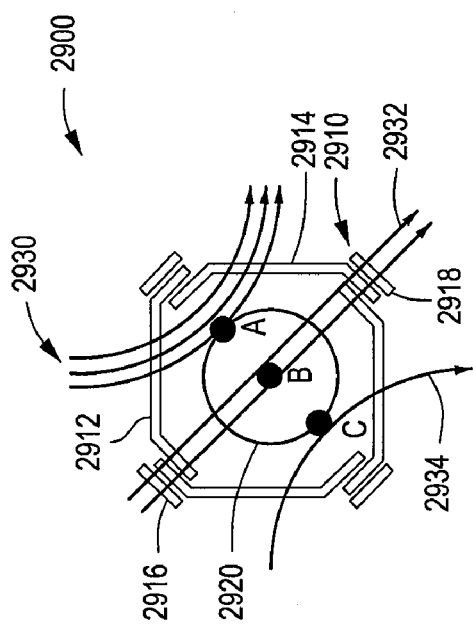
FIG. 29 depicts a schematic top view of a magnetic field in an eight coil chamber.

The inventive methods of controlling transitions of a magnetic field may also be applied to process chambers having magnetic coils arranged in other configurations (illustratively as depicted in FIGS. 4B-C, 5-7, 8B-C, 9-10, 12-17, and 19A-C, or other configurations). In one embodiment, the shape at 0 degrees may consist-of currents running through all eight coils. Alternatively, for embodiments where greater symmetry is desired, the shape at 0 degrees may include currents flowing in a subset of the eight coils. For example, FIG. 29 depicts a top schematic view of a processing chamber 2900 having eight magnetic coils 2910 disposed about a substrate support pedestal 2920 with a four-fold symmetry (e.g., four large side coils and four smaller corner coils). Lines 2930, 2932, and 2934 depict the direction and relative strength of the magnetic field produced by six coils of the eight coils 2910. As mentioned previously, one benefit to wafer performance, the uniformity of the etch rate, may be obtained by reducing the magnetic field magnitude at point A while keeping approximately the same magnitude at points B and C. This may be accomplished by decreasing the higher current in the large side coils (e.g., coils 2912 and 2914 in FIG. 29) while compensating with an increase in the corner coils (e.g., coils 2916 and 2918 in FIG. 29).

When transitioning with an eight-coil configuration, a variety of rotation schemes can be determined that follow the principles given above. With respect to the principle of keeping the amount of magnetic field going into and out of the chamber roughly consistent, there are now more coils to choose from. With respect to the principle of staggering the times when each of the large coils passes through zero current, again there are now more options as to how that may be accomplished. The various rotation schemes may be evaluated based on their performance on a specific semiconductor etch and/or deposition tool, with the specific current sources, coils, computer control circuitry, RF plasma regime, plasma chemistry, RF power levels, pressures, RF tuning circuitry, and the like. A desired rotation scheme for one set of process conditions and hardware may not necessarily be the desired rotation scheme for another set of process conditions and hardware.

In the following embodiments, the same basic magnetic shield shape may be used for a majority of the time, with only variations applied to the transitional steps. The main difference between each of these schemes is the configuration of the steps in each respective transition. It is contemplated that other rotation schemes may be utilized following the above teachings having other differences such as the number transitional steps, values of the currents applied, relationships between the currents applied to different coils, and the like.

Figure 30A:
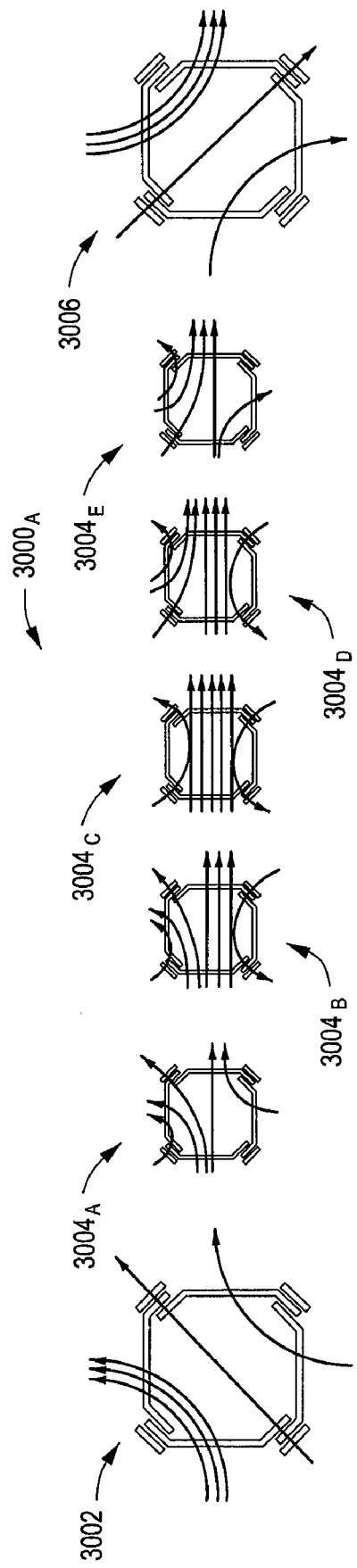
FIGS. 30A-C depict schematic diagrams of embodiments of a method for rotating a magnetic field in an eight coil chamber.
Figure 30B:
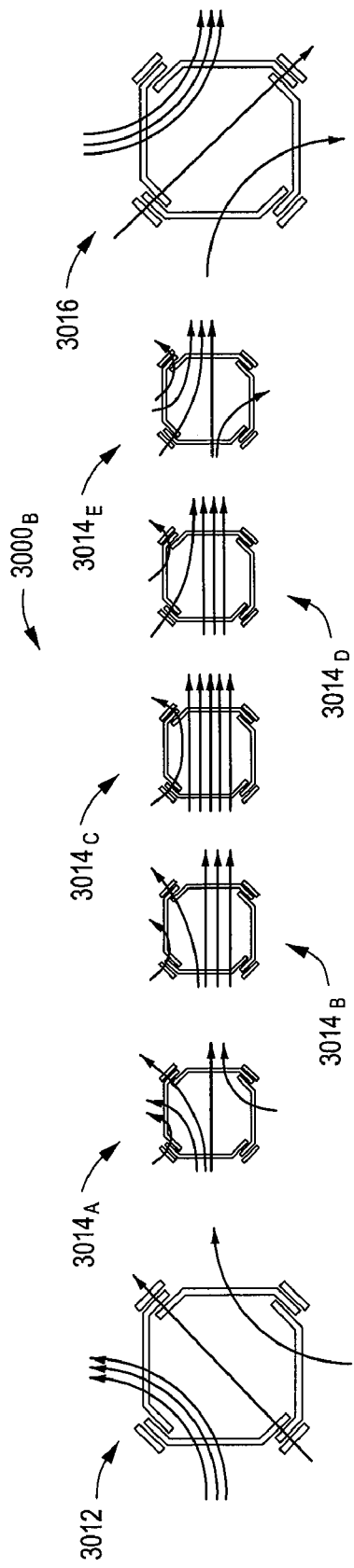
Figure 30C:
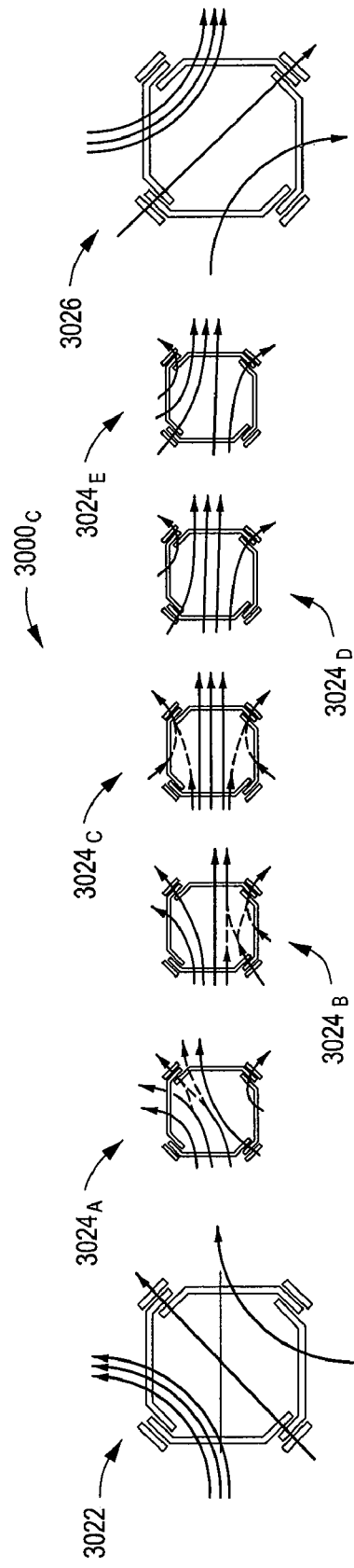
Figure 31A:
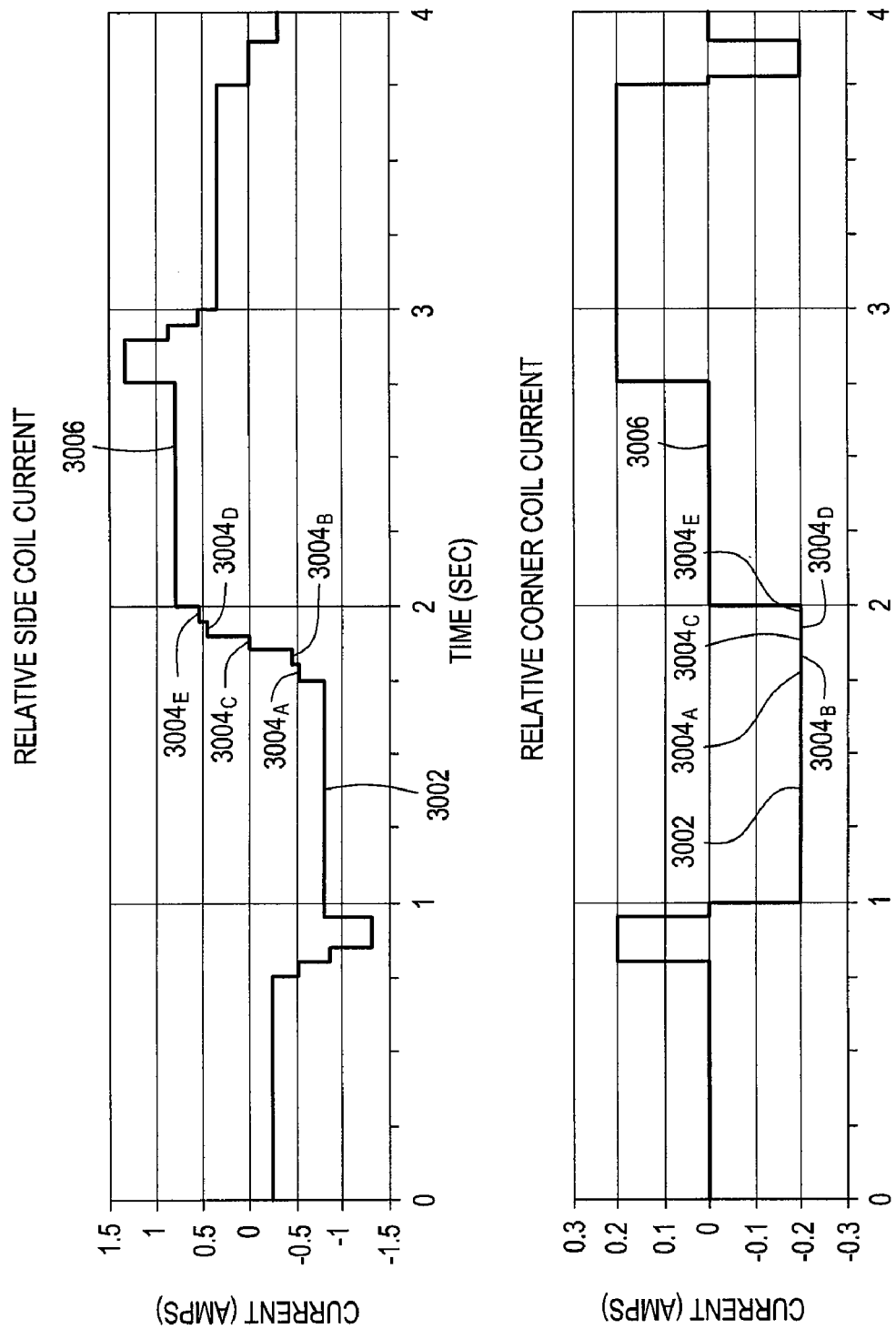
Figure 31B:
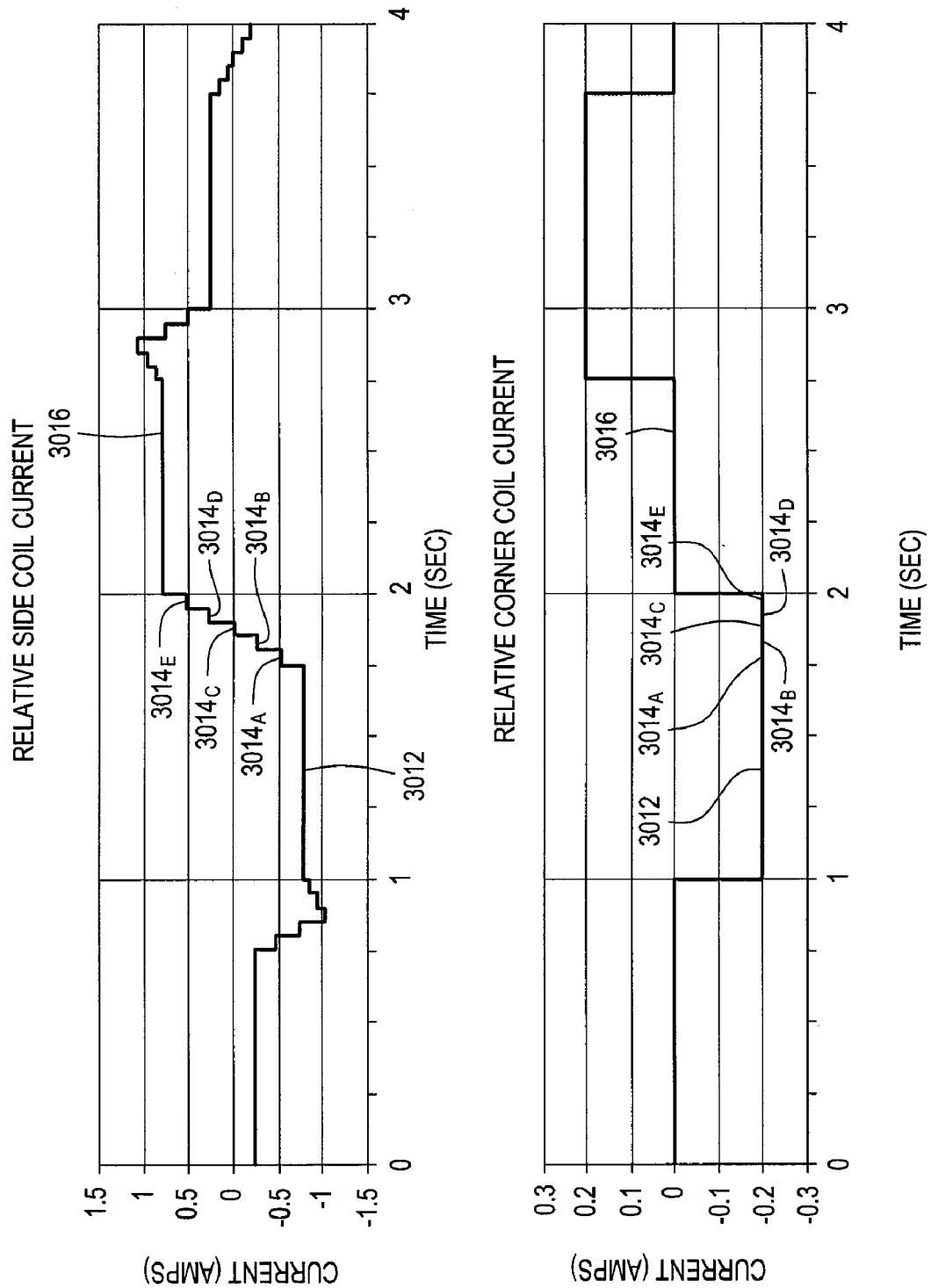

For example, FIGS. 30A-C graphically show exemplary methods of magnetic field rotation using eight coils and eight currents. Specifically, FIGS. 30A-C respectively show primary shapes 3002, 3012, and 3022 being rotated through transitions $3004_{A-E}$, $3014_{A-E}$, and $3024_{A-E}$ to rotated primary shapes 3006, 3016, and $302_6$. Whereas the intermediate step depicted in FIG. 27A (referring to a conventional four-coil rotational method) is a uniform field, all of the intermediate steps in FIGS. 30A-C are sloped, just as the primary field is sloped. Although FIGS. 30A-C show five transition steps between the standard magnetic field shape, the number of transitions can be adjusted for each primary field shape to control the plasma stability as desired, as discussed above. FIGS. 31A-C depict graphs of relative side coil and corner coil currents for rotational schemes corresponding to FIGS. 30A-C, respectively and having the times corresponding to the rotational sequences denoted thereon by the reference numeral corresponding to the respective primary shape, transition, or rotated primary shape.

FIG. 32 depicts a table of currents and exemplary durations for the steps of various rotation schemes for a process chamber having an 8-coil configuration using four main coils and four corner coils (such as shown in FIG. 29 and graphically represented by FIGS. 30A-C, respectively). For each scheme, the data provided is for a main, or side, coil and a corresponding corner coil. For the four-fold-symmetry rotation schemes, the entire scheme may be extrapolated by dividing the scheme into four parts. The currents in the remaining coils 2, 3 and 4 may be described by shifting the currents in time by one-fourth. Similarly, for an eight-equal-coil scheme, you may divide the scheme into eight parts. For convenience, the coils may be numbered clockwise, as seen from the top. Additionally, each rotation scheme is notated by factors A, B, and C, which define the basic magnetic field shape, and by factors D (in scheme V) and factors D and E (in schemes W and X) that further fine-tune the scheme. For scheme V, $0 \leq D \leq 1$; for scheme W, $0 \leq D \leq 0.5$ and $0 \leq E \leq 0.5$; and for scheme X, $0 \leq D \leq 1.0$ and $0 \leq E \leq 0.5$. During a plasma stability evaluation (discussed further below) it was found that the factors D and E further advantageously provide for control over the plasma stability.

The above schemes further show the flexibility in developing magnetic field rotation schemes that are improved over conventional rotation schemes. For example, the conventional rotation scheme has a uniform (i.e., flat) magnetic field shape during transition (for example, as depicted by reference numeral 2704 in FIG. 27A), whereas schemes V, W and X advantageously provide sloped magnetic fields (for example, as depicted by reference numerals $3004_{A-E}$, $3014_{A-E}$, $3024_{A-E}$, in FIGS. 30A-C, respectively). The sloped magnetic field is preferable because the main magnetic field shapes are sloped (for example, as depicted in FIGS. 27A-C and FIGS. 30A-C).

In addition, the rotation schemes disclosed herein are flexible in that they can utilize one or more of the principles discussed above (i.e., uniform magnetic field strength throughout the transition, increased numbers of transition steps, staggered times for each coil passing through zero current, and the like) to provide benefits over the conventional rotation schemes. For example, rotation schemes V and W have increased numbers of transition steps, but have two side coils off simultaneously. Scheme X has increased transition steps, and staggers the times at which the side coils pass through zero current.

Plasma stability while utilizing the rotational schemes disclosed herein were evaluated on a 300 mm eMAX CT Plus chamber—available from Applied Materials, Inc. of Santa Clara, Calif.—with 8-coil hardware (arranged as in FIG. 5) through a built-in data acquisition capability. A high power recipe was selected for the evaluation and the magnetic field was operated at approximately 40 G. After comparison with an equivalent 4-coil result, it was found that several different 8-coil rotation schemes produced an up to 10 times increase in plasma stability (as measured by standard deviation of the variation in VRF) over the 4-coil standard rotation, for configurable magnetic field (CMF) ratio equal to about 1. Thus, 8-coil configurations can advantageously provide much smoother plasma characteristics than conventional 4-coil configurations. Moreover, the above benefits apply to magnetic fields with a CMF ratio having other values.

Figure 33:
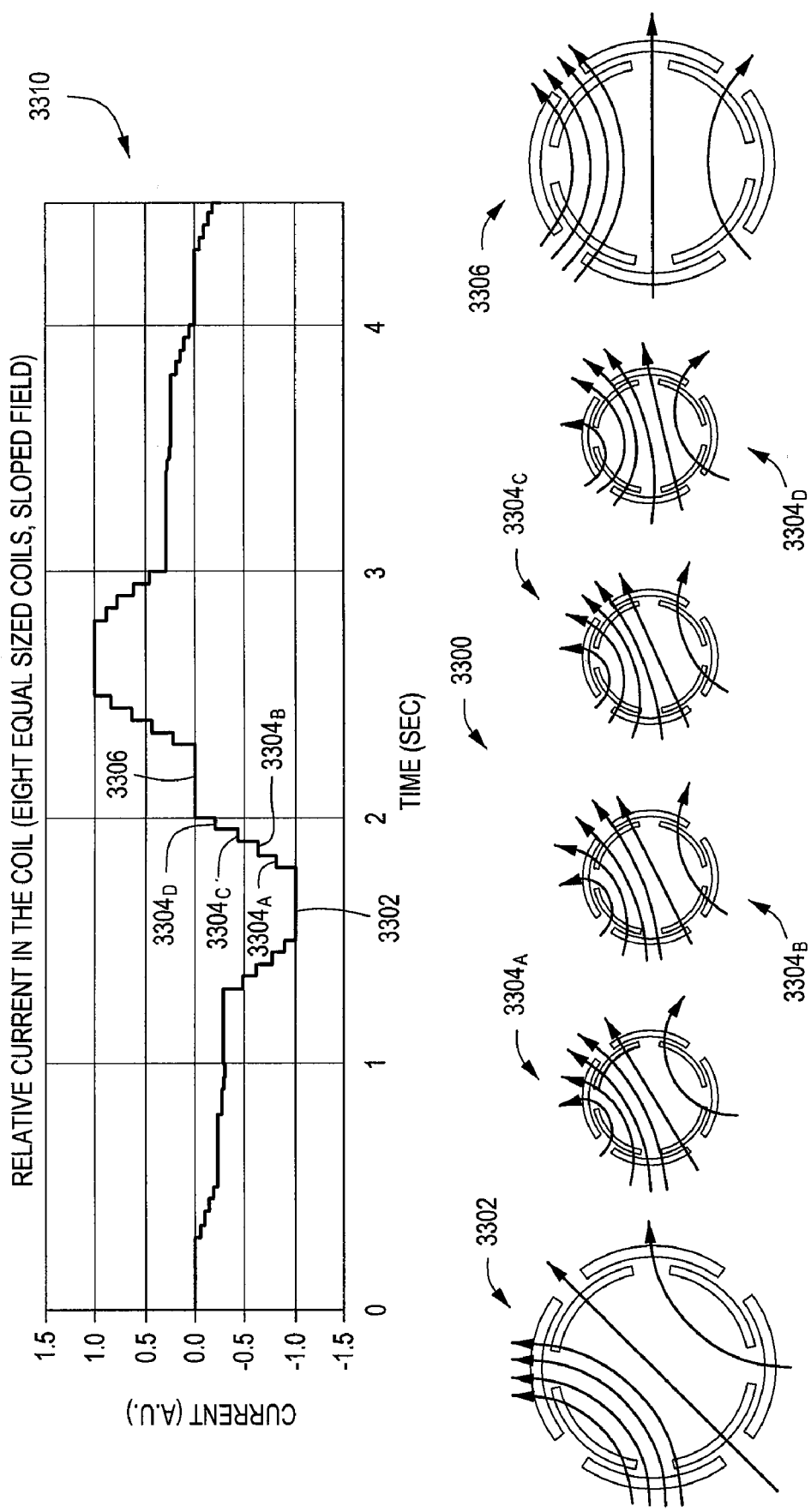
FIG. 33 depicts a schematic top view and graph of one embodiment of a method for rotating a sloped magnetic field in a chamber having eight equal sized coils.
Figure 34:
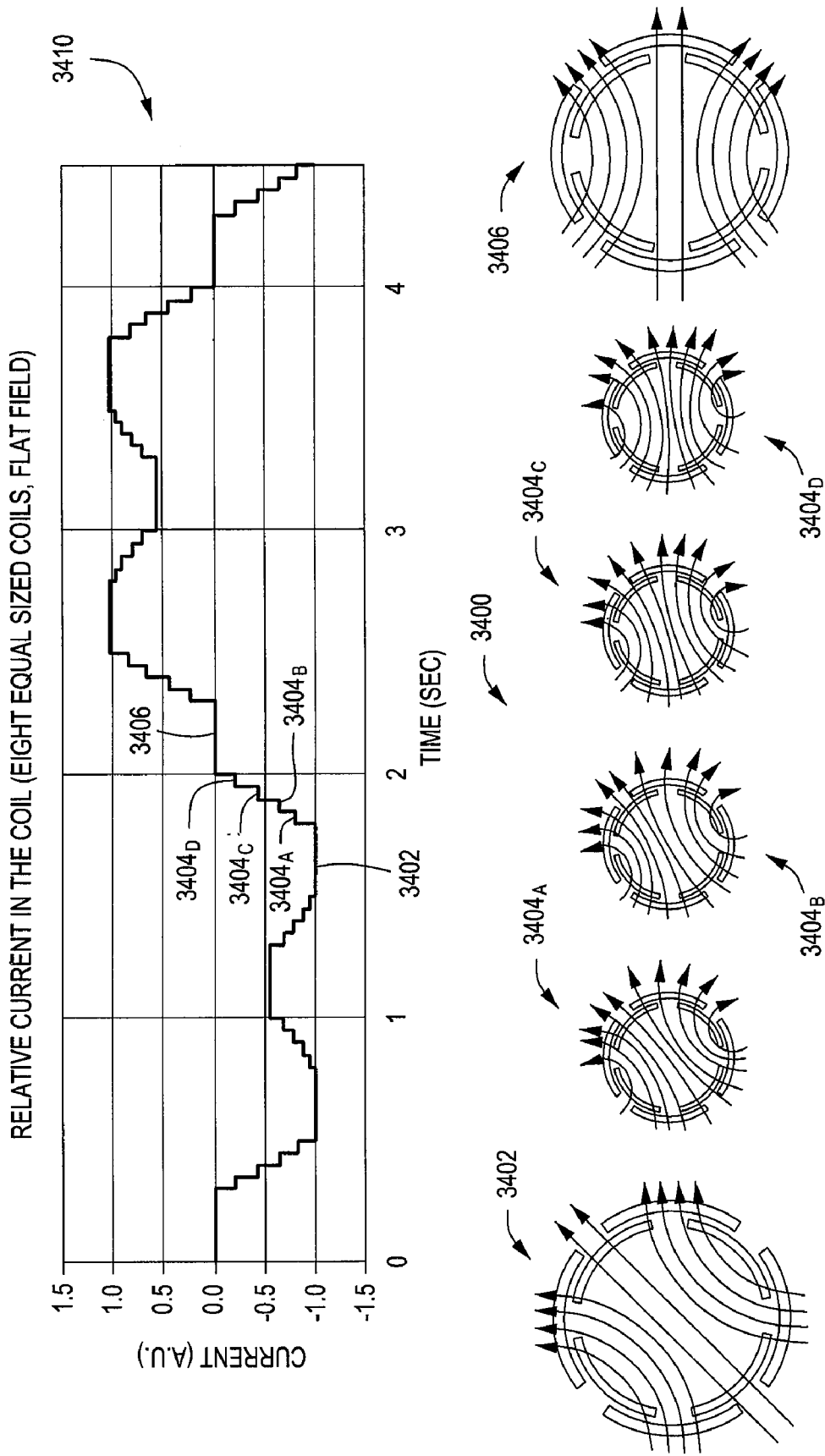
FIG. 34 depicts a schematic top view and graph of one embodiment of a method for rotating a flat magnetic field in a chamber having eight equal sized coils.

In addition to eight coil configurations having a four-fold symmetry, the above magnetic field rotational principles may be advantageously utilized in chambers having eight equal sized coils (as shown in FIGS. 12-13). For example, FIG. 33 depicts a sequence 3300 for rotating a sloped magnetic field in a chamber having eight equal sized coils. The sequence begins with a primary shape 3302 that is illustratively rotated through four transitions $3304_{A-D}$ to a rotated primary shape 3306 that is 45 degrees clockwise from the primary shape 3302. A graph 3310 shows relative coil currents for the rotational scheme having the times corresponding to the rotational sequence denoted thereon by the reference numeral corresponding to the respective primary shape, transition, or rotated primary shape. As another example, FIG. 34 depicts a sequence 3400 for rotating a sloped magnetic field in a chamber having eight equal sized coils beginning with a primary shape 3402 and illustratively rotated through four transitions $3404_{A-D}$ to a rotated primary shape 3406 that is 45 degrees clockwise from the primary shape 3402. A graph 3410 shows relative coil currents for the rotational scheme having the times corresponding to the rotational sequence denoted thereon by the reference numeral corresponding to the respective primary shape, transition, or rotated primary shape.

FIG. 35 depicts a table of currents and exemplary durations for the steps of a sloped rotation schemes for a process chamber having an eight equal size coil configuration (such as shown in FIG. 33). The data provided is for one coil and the entire scheme may be extrapolated by dividing the scheme into eight parts. The currents in the remaining coils may be described by shifting the currents in time by one-eighth. For convenience, the coils may be numbered clockwise, as seen from the top. Additionally, the rotation scheme is notated by factors A, B, and C, which define the basic magnetic field shape.

Although the above-described methods of transitioning a magnetic field relate to rotating a magnetic field within a single process recipe step, the above teachings also apply to transitioning a magnetic field between steps in a multi-step plasma assisted process (such as preliminary etch, main or bulk etch, and over-etch steps) or between steps of a multiple step process that uses a plasma in any sequential steps (such as etching a first layer using a first set of process chemistries and/or conditions and etching a second layer using a second set of process chemistries and/or conditions). For example, when changing one or more of a bias power, a source power, chamber pressure, process gas or gases, of magnetic field magnitude (i.e., any process parameter that affects the plasma), the magnetic field transition can be adjusted to give the optimal response by the RF tuning circuitry, using a method similar to one of the aforementioned embodiments and using an algorithm that takes into account the relevant changes in process parameters. The use of the magnetic field transitions between process steps in this manner can be utilized in combination with the principles disclosed in U.S. patent application Ser. No. 11/372,752, filed Mar. 10, 2006, by Kutney, et al., which is hereby incorporated by reference in its entirety.

As discussed above, the inventive method of transitioning a magnetic field advantageously provides for a more stable plasma and a more uniform etch rate across the substrate. In addition, it has also been discovered that the inventive method further advantageously reduces damage to the substrate and processing chamber due to the improved control over the plasma stability, thereby reducing the likelihood any large transients that may occur in the plasma. For example, large transients in the plasma may cause undesirable currents in partially connected transistors disposed on the substrate that may damage the substrate.

In addition, magnetic fields cause increased plasma density at the chamber boundaries as well as over the substrate, thus increasing erosion of the inner surfaces of the chamber. Such surfaces often consist of materials such as anodized aluminum, silicon, silicon carbide, quartz, aluminum oxide, aluminum nitride and/or yttrium oxide, or the like. Irregularities in the chamber surfaces can exacerbate the erosion rate of those surfaces, such as near portal openings where surface coatings may be thinner or where plasma densities may be locally higher due to the modified plasma sheath characteristics around such irregular chamber surfaces. Use of the eight coil hardware and rotational methods described herein decreases the maximum magnetic field magnitude at the chamber boundary as well as at the substrate for a given etch process condition, as compared to the equivalent process condition using prior art four coil hardware. Therefore, use of the inventive eight coil rotational methods disclosed herein decreases the plasma density at the chamber boundaries and thus decreases the erosion rate of the surfaces coating the inner chamber boundaries. For the locations of worst erosion rate (e.g., proximate irregularities in the inner chamber surfaces) the erosion rate may be reduced by as much as 50 percent, thereby advantageously facilitating the use of thinner chamber coatings and/or less expensive manufacturing methods for these chamber coatings.

Thus, methods of rotating a magnetic field have been provided herein that overcome the problems of the prior art. Specifically, the inventive method of rotation provides transitions of the magnetic field that advantageously allow time for the RF tuning circuitry to match the new plasma impedance caused by the change in the magnetic field prior to the next change in the magnetic field. In addition, the transitions between the primary shapes may also be controlled to maintain a constant magnetic field strength throughout each step of the transition, thereby minimizing the impact of changes in magnetic field strength on the plasma. Moreover, the transitions may further be controlled to ensure that any coils that pass through zero current have their. moments of zero current staggered in time, thereby reducing the magnitude and effect of the changes in the magnetic field on the plasma. Thus, the present magnetic field rotation methods advantageously aid the RF tuning circuitry in its ability to adjust to the changes in plasma impedance caused by the magnetic field rotation by both minimizing the changes in plasma impedance and by providing time for the RF tuning circuitry to match the new plasma impedance cause by the changes in the magnetic field as it is rotated.

Thus, from these simulations, the use of extended width coils improves the shape of the magnetic fields produced in the chamber. To further improve the shape of the fields, additional coils that provide corrective fields can be used.

Furthermore, while the semiconductor wafer processing chamber is a dry etching chamber in the above embodiments, it is a matter of course that the present invention is applicable to other types of semiconductor wafer processing chambers such as a CVD chamber in which the plasma formation is accelerated by the use of electromagnets.

While foregoing is directed to various embodiments of the present invention, other and further embodiments of the invention may be devised without departing from the basic scope thereof, and the scope thereof is determined by the claims that follow.

The invention claimed is:

1. A method for rotating a magnetic field in a process chamber, comprising:
   forming a magnetic field having a primary shape;
   changing the primary shape to at least two sequential transitional shapes; and
   changing the transitional shape to a rotated primary shape, wherein a maximum of one current applied to one or more magnetic field producing coils has its polarity reversed between any two adjacent steps.

2. The method of claim 1, further comprising:
   maintaining the magnetic field at an approximately constant magnitude throughout each step.

3. The method of claim 1, wherein a maximum of one current applied to one or more magnetic field producing coils is equal to zero during a step.

4. The method of claim 1, further comprising:
   maintaining the primary and rotated primary shapes for a duration that is greater than a duration of maintaining the transitional shapes.

5. The method of claim 4, wherein the primary and the rotated primary shapes are maintained for about the same duration and wherein the transitional shapes are maintained for about the same duration.

6. The method of claim 1, wherein the rotated primary shape is rotated about 90 degrees with respect to the primary shape.

7. The method of claim 1, further comprising:
   repeating the changing steps recited in claim 1 to continuously rotate the magnetic field in approximately 90 degree increments during a process.

8. The method of claim 1, wherein the step of forming the magnetic field having a primary shape further comprises:

supplying a first plurality of currents to a plurality of magnetic field producing coils disposed about the process chamber.

9. The method of claim 8, wherein the plurality of magnetic field producing coils is four magnetic field producing coils.

10. The method of claim 8, wherein the plurality of magnetic field producing coils are coupled to four current supplies.

11. The method of claim 8, wherein the step of changing the primary shape further comprises:
supplying sequential pluralities of currents to the plurality of magnetic field producing coils to form the respective sequential transitional shapes.

12. The method of claim 1, wherein the step of changing the primary shape further comprises:
changing the primary shape to at least five sequential transitional shapes.

13. The method of claim 1, further comprising:
repeating the changing steps recited in claim 1 to rotate the magnetic field in a first plasma process; and
transitioning to a second plasma process from the first plasma process while controlling the magnetic field transition by changing the magnetic field shape through at least two sequential transitional shapes to form a primary shape of the magnetic field for the second plasma process.

14. The method of claim 1, further comprising:
controlling the magnetic field during the changing steps to reduce device damage on a substrate being processed in the process chamber.

15. The method of claim 1, further comprising:
controlling the magnetic field during the changing steps to reduce process chamber surface erosion due to the plasma.

16. A method for rotating a magnetic field in a process chamber, comprising:
(a) supplying a first set of currents to a plurality of magnetic field producing coils disposed about the process chamber to create a first magnetic field;
(b) subsequently supplying a second set of currents to the plurality of magnetic field producing coils to create a first transitional magnetic field;
(c) subsequently supplying a third set of currents to the plurality of magnetic field producing coils to create a second transitional magnetic field; and
(d) subsequently supplying a fourth set of currents to the plurality of magnetic field producing coils to create a second magnetic field that correlates to the first magnetic field rotated by about 90 degrees, wherein a maximum of one current applied to one or more magnetic field producing coils has its polarity reversed between any two adjacent steps.

17. The method of claim 16, wherein the magnitude of each of the magnetic fields is approximately equal.

18. The method of claim 16, wherein a maximum of one current applied to one or more magnetic field producing coils is equal to zero during a step.

19. The method of claim 16, further comprising:
maintaining the first and second magnetic fields for a duration that is greater than a duration of maintaining the first and second transitional magnetic fields.

20. The method of claim 19, wherein first and second magnetic fields are maintained for about the same duration and wherein the first and second transitional magnetic fields are maintained for about the same duration.

21. The method of claim 16, further comprising:
repeating steps (b)-(d) with desired sets of currents to continuously rotate the magnetic field in 90 degree increments during a process.

22. The method of claim 16, wherein the plurality of magnetic field producing coils is four magnetic field producing coils.

23. The method of claim 16, wherein the plurality of magnetic field producing coils are coupled to four current supplies.

24. The method of claim 16, further comprising between steps (c) and (d):
(e) subsequently supplying a fifth set of currents to the plurality of magnetic field producing coils to create a third transitional magnetic field;
(f) subsequently supplying a sixth set of currents to the plurality of magnetic field producing coils to create a fourth transitional magnetic field; and
(g) subsequently supplying a seventh set of currents to the plurality of magnetic field producing coils to create a fifth transitional magnetic field.

25. A method for rotating a magnetic field in a process chamber having a plurality of magnetic field producing coils arranged thereabout, comprising:
forming a magnetic field having a primary shape;
changing the primary shape to at least two sequential transitional shapes; and changing the transitional shape to a rotated primary shape, wherein the magnitude of the magnetic field is held approximately constant throughout the rotation, and wherein a maximum of one current applied to one or more magnetic field producing coils is equal to zero or has its polarity reversed between any two adjacent steps.

* * * * *